United States Patent
Kang

[19]

[11] Patent Number: 6,128,213

[45] Date of Patent: Oct. 3, 2000

[54] NONVOLATILE FERROELECTRIC MEMORY AND A METHOD OF MANUFACTURING THE SAME

[75] Inventor: Hee Bok Kang, Daejeon-si, Rep. of Korea

[73] Assignee: LG Semicon Co., Ltd., Cheongju, Rep. of Korea

[21] Appl. No.: 09/229,335

[22] Filed: Jan. 13, 1999

Related U.S. Application Data

[63] Continuation-in-part of application No. 09/210,783, Dec. 15, 1998, which is a continuation-in-part of application No. 09/187,735, Nov. 9, 1998, which is a continuation-in-part of application No. 09/055,985, Apr. 7, 1998.

[30] Foreign Application Priority Data

Dec. 12, 1997 [KR] Rep. of Korea ...................... 97/68192
Apr. 22, 1998 [KR] Rep. of Korea ...................... 98/14400
Apr. 22, 1998 [KR] Rep. of Korea ...................... 98/14401
May 13, 1998 [KR] Rep. of Korea ...................... 98/17212

[51] Int. Cl.$^7$ .................................................. G11C 11/22
[52] U.S. Cl. ................ 365/145; 365/230.03; 365/185.23
[58] Field of Search .............................. 365/145, 230.03, 365/189.11, 185.23, 149

[56] References Cited

U.S. PATENT DOCUMENTS

| | | | |
|---|---|---|---|
| 4,433,390 | 2/1984 | Carp et al. | 364/900 |
| 4,873,664 | 10/1989 | Eaton, Jr. | 365/145 |
| 4,888,630 | 12/1989 | Paterson | 357/23.5 |
| 4,928,095 | 5/1990 | Kawahara | 340/784 |
| 5,371,699 | 12/1994 | Larson | 365/145 |
| 5,373,463 | 12/1994 | Jones, Jr. | 365/145 |
| 5,608,667 | 3/1997 | Osawa | 365/145 |
| 5,638,318 | 6/1997 | Seyyedy | 365/145 |
| 5,680,344 | 10/1997 | Seyyedy | 365/145 |
| 5,815,430 | 9/1998 | Varhaeghe et al. | 365/145 |
| 5,903,492 | 5/1999 | Takashima | 365/145 |
| 5,917,746 | 6/1999 | Seyyedy | 365/145 |

*Primary Examiner*—David Nelms
*Assistant Examiner*—Tuan T. Nguyen
*Attorney, Agent, or Firm*—Fleshner & Kim, LLP

[57] ABSTRACT

This invention relates to a nonvolatile ferroelectric memory device which includes main cell array arranged in columns of even number, reference cell array arranged in two columns, a plurality of cell array blocks in which a plurality of pairs which consist of said main cell array and said reference cell array are arranged, SWL word line driver arranged along said column in parallel, and control block connected between both ends of said columns in order to control other cell array block neighboring with said cell array blocks.

70 Claims, 32 Drawing Sheets

FIG.17
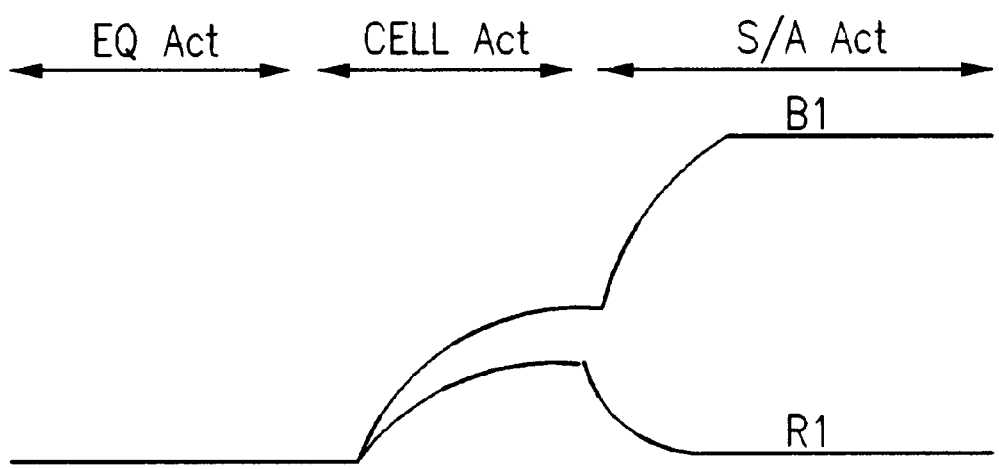
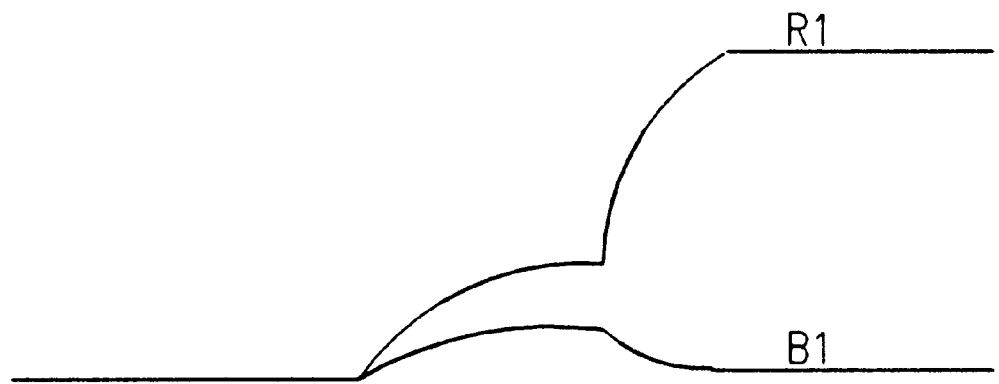

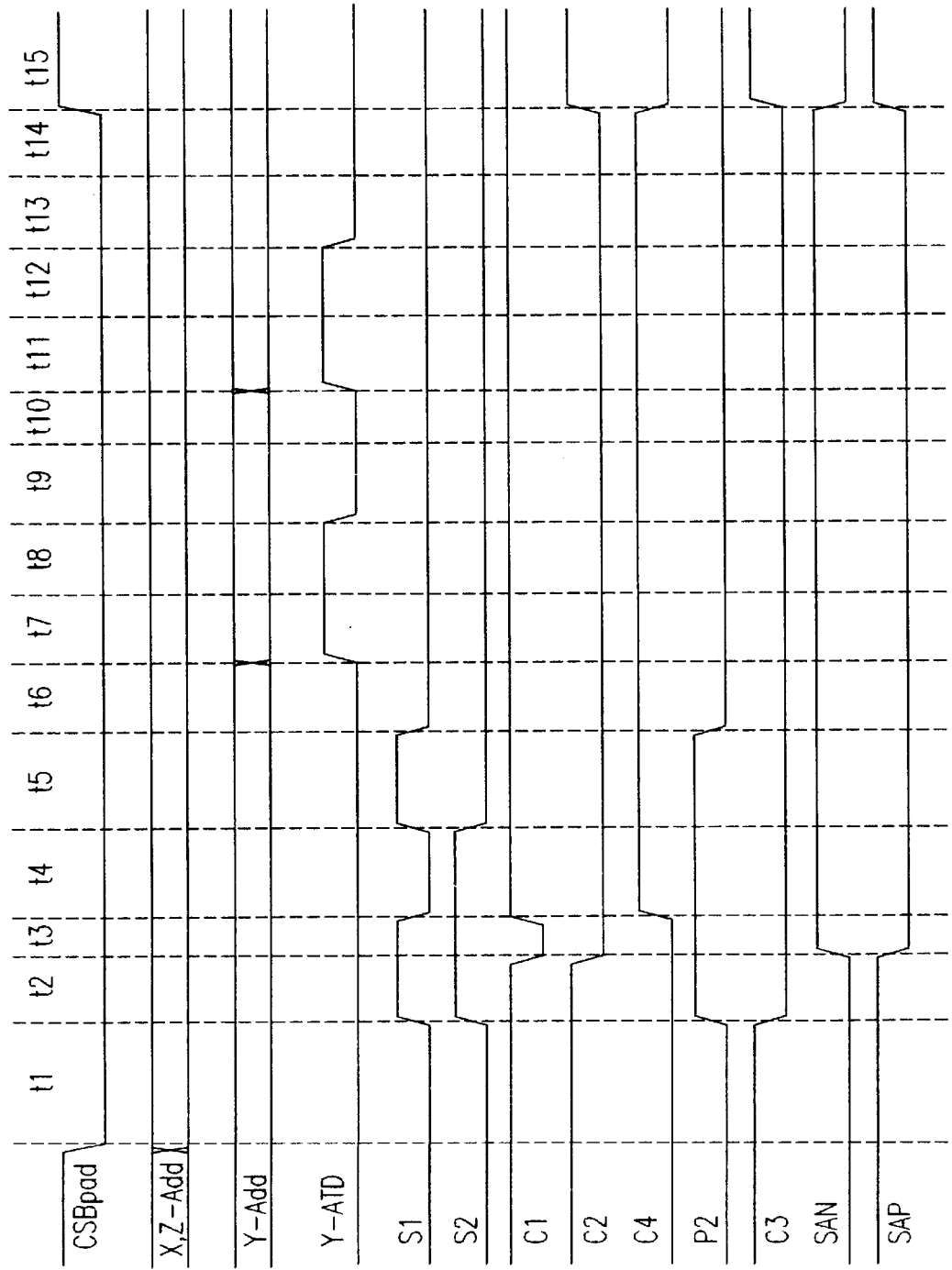

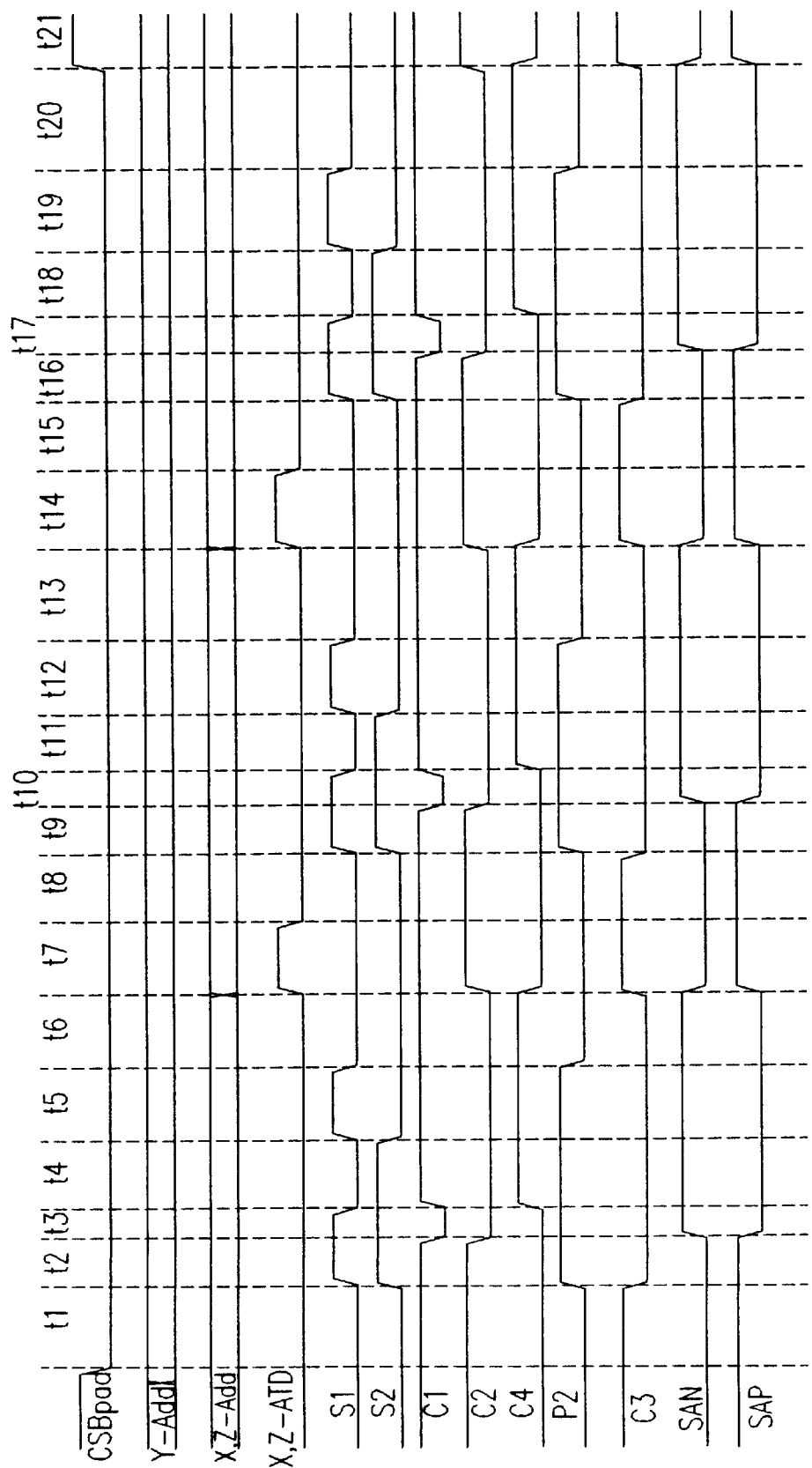

NONVOLATILE FERROELECTRIC MEMORY AND A METHOD OF MANUFACTURING THE SAME

This application is a continuation-in-part (CIP) of application Ser. No. 09/210,783 filed Dec. 15, 1998, which is a CIP of application Ser. No. 09/187,735 filed Nov. 9, 1998, which is a CIP of application Ser. No. 09/055,985 filed Apr. 7, 1998.

BACKGROUND OF THE INVENTION

1. Field of the Invention

The present invention relates to a semiconductor memory device, more particularly, to a nonvolatile ferroelectric memory device having a split word line (SWL) structure.

2. Discussion of the Related Art

A ferroelectric memory, i.e. ferroelectric random access memory (FRAM), having data processing speed as fast as DRAM which is generally used as semiconductor memories and keeping the stored data when a supplied power is off is getting attention in the memory of next generation.

The FRAM is a memory device having almost the same structure as the DRAM but the data stored in the FRAM is not cleared even when electric field is lost from the memory by using ferroelectric material having a characteristic of a high residual polarization. In other words, as shown in the hysteresis loop of FIG. 1, a polarization induced by an electric field is not vanished because of the existence of its spontaneous polarization even though the electric field is removed but maintains a constant state (d and a states). This device is used as a memory by corresponding d and a states to 1 and 0, respectively.

Referring to figures, the conventional ferroelectric memory is explained as follows.

FIG. 2 is cell array structure of a conventional ferroelectric memory. The unit cell structure of the conventional FRAM consists of one transistor and one capacitor (1T/1C) which is similar to an existing DRAM. That is, a plurality of word lines (W/L) separated by equal distance are formed in one direction. A plurality of plate lines (P/L) are formed between the word lines in parallel to the each W/L. A plurality of bit lines (B_n, B_n+1, B_n+2, . . . ) separated by equal distance are formed in the perpendicular direction to each of the word lines and the plate lines. The gate electrode of one transistor forming a unit memory cell is connected to the word line (W/L) and the source electrode of said transistor is connected to its neighboring bit line (B/L). The drain electrode of the transistor is connected with a first electrode of a capacitor and the second electrode of the capacitor is connected to its neighboring plate line (P/L).

The driving circuit and its operation of the ferroelectric memory device having the conventional 1T/1C structure like this are explained as follows.

FIGS. 3a and 3b show the diagram for the driving circuit of the conventional ferroelectric memory. Since the driving circuit of the ferroelectric memory having the conventional 1Y/1C structure includes a reference voltage generator 1 generating a reference voltage, a plurality of transistors Q1~Q4, and a capacitor C1, the output voltage signal generated from said reference voltage generator 1 can not be directly applied to the sense amplifier. Therefore, the driving circuit is constructed so as to include a reference voltage stabilization circuit 2 to stabilize the reference voltage of the adjacent two bit lines, a first reference voltage storage circuit 3 which consists of a plurality of transistors Q6~Q7 and capacitors C2~C3 and stores the reference voltages of logic value 1 and logic value 0 at its adjacent bit lines, respectively, a first equalizer 4 which consists of transistor Q5 and equalizes the adjacent two bit lines, a first main cell array 5 which is connected to word lines and plate lines different from each others and stores data, a first sense amplifier 6 which consists of a plurality of transistors Q10~Q14 and P-sense amplifier (PSA) and detects the data of the cell selected in the first main cell array 5 by said word line, a second main cell array 7 which is connected to word lines plate lines different from each others and stores data, a second reference voltage storage circuit 8 which consists of a plurality of transistors Q27~Q28 and capacitors C9~C10 and stores the reference voltages of logic value 1 and logic value 0 at its adjacent bit lines, respectively, and a second sense amplifier 9 which consists of a plurality of transistors Q15~Q24 and N-sense amplifier (NSA) and detects the data of the cell selected in said second main cell array 7 by said word line.

The input and output operations of the ferroelectric memory cell having the conventional 1T/1C structure are as follows.

FIG. 4 is a timing chart showing the operation of write mode of the conventional ferroelectric memory and FIG. 5 is a timing chart showing the operation of read mode of the conventional ferroelectric memory.

In write mode, the write mode begins when the chip selection signal CSBpad is enabled by the transition from a high state to a low state and at the same time the enable signal WEBpad is changed from a high state to a low state.

When an address decode operation begins in the write mode, a pulse being applied to the corresponding word line (W/L) is changed from a high state to a low state and a cell is selected. Thus, in the interval that the word line holds a high state, a high signal having a definite interval and a low signal having a definite interval are in order applied to the corresponding plate line (P/L) and a high or low signal synchronized with said write enable signal is applied to the corresponding bit line so as to write a logic value high or low into the selected cell.

In other words, in the interval that a high signal is applied to a bit line and a high pulse is applied to a word line, a logic value 1 is written into the corresponding ferroelectric capacitor if a low pulse is applied to the plate line.

When a low pulse is applied to a bit line and a high pulse is applied to a word line, a logic value 0 is written into the corresponding ferroelectric capacitor.

The operation of reading the data written in the cell according to the write mode is as follows.

When the chip select signal CSBpad is enabled by changing from a high state to a low state, all bit lines are set to an equal potential by an equalization signal before the corresponding word line is selected. For example, when a high pulse applied to the equalizer 4 in FIG. 3a and a high signal is applied to the transistors (Q18~Q19), the bit lines are grounded through the transistors (Q18~Q19) and are set to the equal potential.

After each bit line is made inactive by turning off the transistors (Q5, Q18, Q19) off and the address is decoded, the signal of the corresponding word line is changed from a low state to a high state by the decoded address so that the corresponding cell is selected.

By applying a high signal to the plate line of the selected cell, the data corresponding to a logic value 1 in the ferroelectric memory is destroyed. However, if a data corresponding to a logic value of 0 is stored in the cell, the data is not destroyed.

Thus, a destroyed data and an undestroyed data are present as the output signals different from each other according to the hysteresis curve as described above and are sensed as a logic value 1 or 0 by the sense amplifier.

The case that the data is destroyed is corresponding to the transition from point d to the point f on the hysteresis of FIG. 1 and the case that the data is undestroyed is corresponding to the transition from point a to the point f. Therefore, the output of the sense amplifier is a logic value 1 when the sense amplifier is enabled by an enable pulse and the data is destroyed. On the contrary, the output of the sense amplifier is a logic value 0 when the sense amplifier is enabled by an enable pulse but the data is not destroyed.

To restore the original state in the memory after the sense amplifier senses the data, amplifies the sensed signal and generates an output signal, the plate line is made inactive under the condition that a high pulse is applied to the corresponding word line.

In the conventional ferroelectric memory having the 1T/1C structure, since a reference cell performs much more data input and output operations than a main memory cell, the reference cell tends to be rapidly deteriorated.

The conventional ferroelectric memories and their driving circuits have problems as follows.

First problem is that the conventional FRAM has a complex layout because of their separated plate lines in spite of their merit holding the data even when the power is off.

Second problem is that the speed of the conventional FRAM decreases because the data input and output operations are done by the separated plate lines and a control signal is applied to the plate lines for the data read and write operations.

Third problem is that a reference voltage is not stabilized because one reference cell processes all the read operations of several hundred main memories and therefore the degradation is rapidly progressed.

Fourth problem is that a method for generating a reference voltage by a voltage control circuit is not stable because the reference voltage is affected by an external supply voltage variation and the characteristic change of the memory is caused by an external noise.

Fifth problem is that a high speed access is not achieved because only the chip select signal CSBpad is used for activating the ferroelectric memory.

SUMMARY OF THE INVENTION

Therefore, the present invention is directed to solve the problems of the conventional FRAM and is to provide a nonvolatile ferroelectric memory device having SWL structure without any separated cell plate lines.

To achieve an object of the present invention, the nonvolatile ferroelectric memory device according to the present invention includes a main cell array arranged in columns of an even number; a reference cell array arranged in two columns; a plurality of cell array blocks in which a plurality of pairs of said main cell array and said reference cell array are arranged; SWL word line driver in parallel to said column; and control block connected between both ends of said column so as to control other cell array block neighboring with said cell array block.

To achieve another object of the present invention, the nonvolatile ferroelectric memory device according to the present invention includes a first control pulse generator including a first logic arithmetic unit which receives control signals which include both preparatory signals (SAP and SAN) to control the sense amplifier and the predecoded Z address signals (Z_Add3 and Z_Add4) as its input signals and generates sense amplifier control signals (SAP_C, SAN_C) and equi-potential control signals (C3N_C, C3P_C) as its output signal and a second logic arithmetic unit which receives the predecoded Z address signals (Z_Add3 and Z_Add4) as its input signal and generates C1P_T, C1N_T, C2P_T, C2N_T, and C3N_T signals to control the bit line connection and the level adjustment as its output signals; a second control pulse generator which receives signals including the write enable signal (WEBpad) and generates control signals (C4P_T, C4N_T) for column selection; and a third control pulse generator which receives Y address transition detection signal (Y_ATD) and generates preparatory SWL driving signals (PS1_T, PS2_T) as its output signals.

The nonvolatile ferroelectric memory device according to the present invention to achieve still another object of the present invention is characterized as follows.

When the data write mode according to the Y address toggling signal of said top cell array block in the SWL ferroelectric memory in which a top cell array block and a bottom cell array block hold in common a core block including a sense amplifier and data input/output circuit has a period from the time that chip enable signals CSBpad and WEBpad are enabled in a low state and then again disabled in a high state, the period is divided into 15 intervals from t1 to t15. The intervals are defined according to a first step in which each of the preparatory SWL drive signals (① PS1_T, ② PS2_T), SWL drive signals (③ SWL1, ④ SWL2), control signals (⑤ C1N_T, ⑥ C2N_T) for a bit line connection, signal (⑦ C4N_T) for a column selection, interlock signal (⑧ P2) for preventing the operation generating the preparatory SWL drive signal from disturbance, signal (⑨ C3N_C) for a bit line equi-potential, the sense amplifier enable signals (⑩ SAP_C, SAN_C) holds H, H, L, L, H, H, L, L, H, L, H state, respectively, in the interval t1 and in the interval t2 that Y address transition detection signal Y-ATD is inactive, signals PS1_T, PS2_T and C3N_C go down to a low state and signals SWL1, SWL2, C4N_T and P2 go up to a high state, and in the interval t3, signals C1N_T and C2N_T go to a low state and signals SAN_C and SAP_C go into an active state and each of all other signals holds its previous state, respectively; a second step in which in the intervals t4 that signals PS1_T and C1N_T go up to a high state and signal SWL1 goes down to a low state, t5 that signals PS1_T and SWL2 go down to a low state and signals PS2_T and SWL1 go up to a nigh state, t6 that signal PS1_T goes up to a high state and signals SWL1 and P2 go down to a low state, each of all other signals holds its previous state, respectively; a third step in which signal PS1_T goes down to a low state and signal SWL1 goes up to a high state in the interval t7 that signal Y_ATD holds its active state, and in the interval t8, signal PS2_T goes down to a low state and signal SWL2 goes up to a high state and each of all other signals holds its previous state, respectively; a fourth step in which signal PS1_T goes up to a high state and signal SWL1 goes down to a low state in the interval t9 that signal Y_ATD holds its inactive state, and in the interval t10, signal PS2_T goes up to a high state and signal SWL2 goes down to a low state and each of all other signals holds its previous state, respectively; a fifth step in which each of signals PS1_T, SWL1, SWL2 and PS2_T is changed its state in the same way as the third step and each of other signals holds its previous state, respectively, in the intervals t11 and t12 that signal Y_ATD holds its active state; and a sixth step in which each of signals PS1_T, SWL1, PS2_T and SWL2 is changed its state in the same way as the fourth step and each of other signals holds its previous state, respectively, in the intervals t13 and t14 that signal Y_ATD holds its inactive state.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 17 shows the variation in the bit line induction potential and the potential at the input and output node when a sense amplifier is in operation;

FIG. 19a is a operation timing chart for the global control pulse generator when Y address toggling;

FIG. 19b is a operation timing chart for the global control pulse generator when X, Z addresses toggling;

DETAILED DESCRIPTION OF THE PREFERRED EMBODIMENTS

The cell array structure, the drive control circuit and the method for the nonvolatile ferroelectric memory device according to the present invention are explained in detail by referring to the attached figures.

Figure 1:
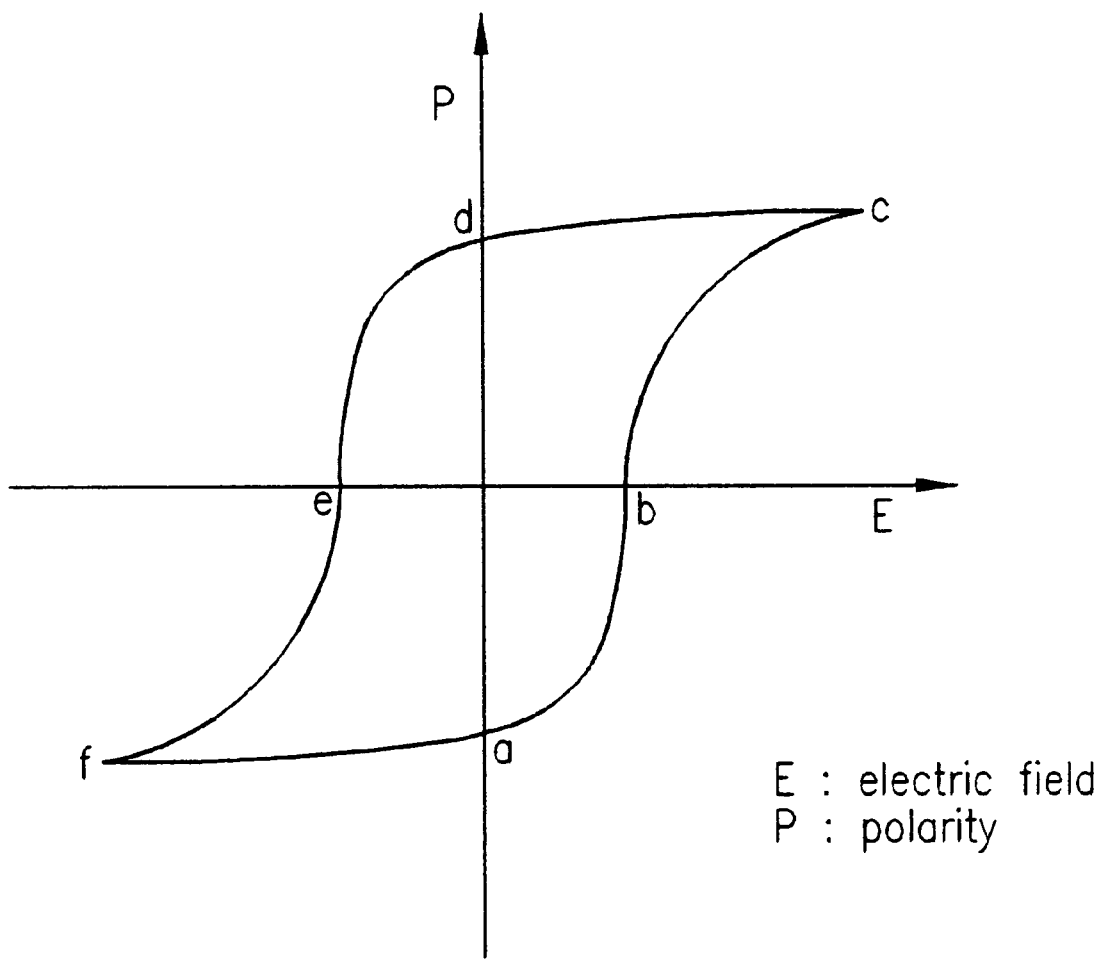
FIG. 1 is a characteristic curve showing a hysteresis loop of a general ferroelectric substance.
Figure 2:
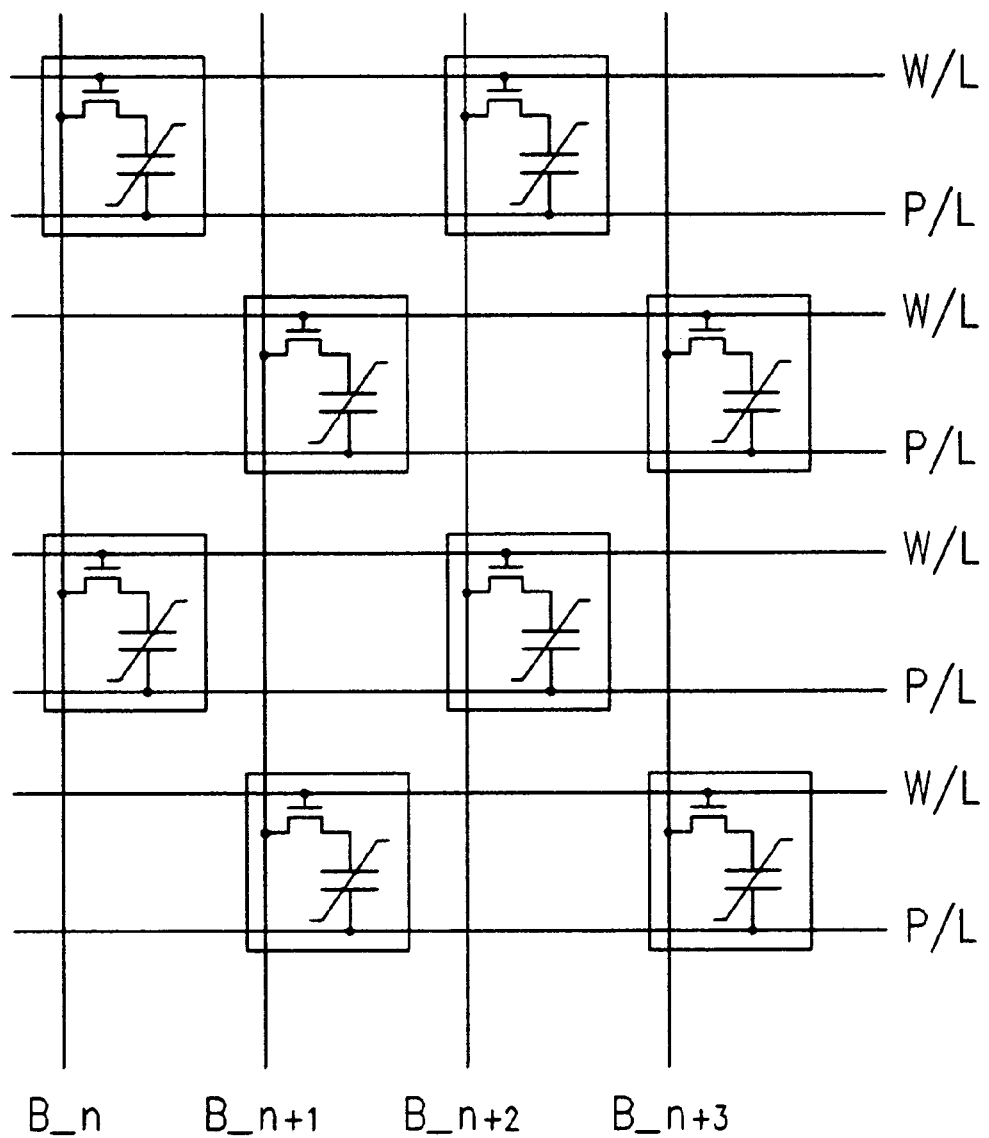
FIG. 2 is a conventional ferroelectric memory cell array structure.
Figure 3A:
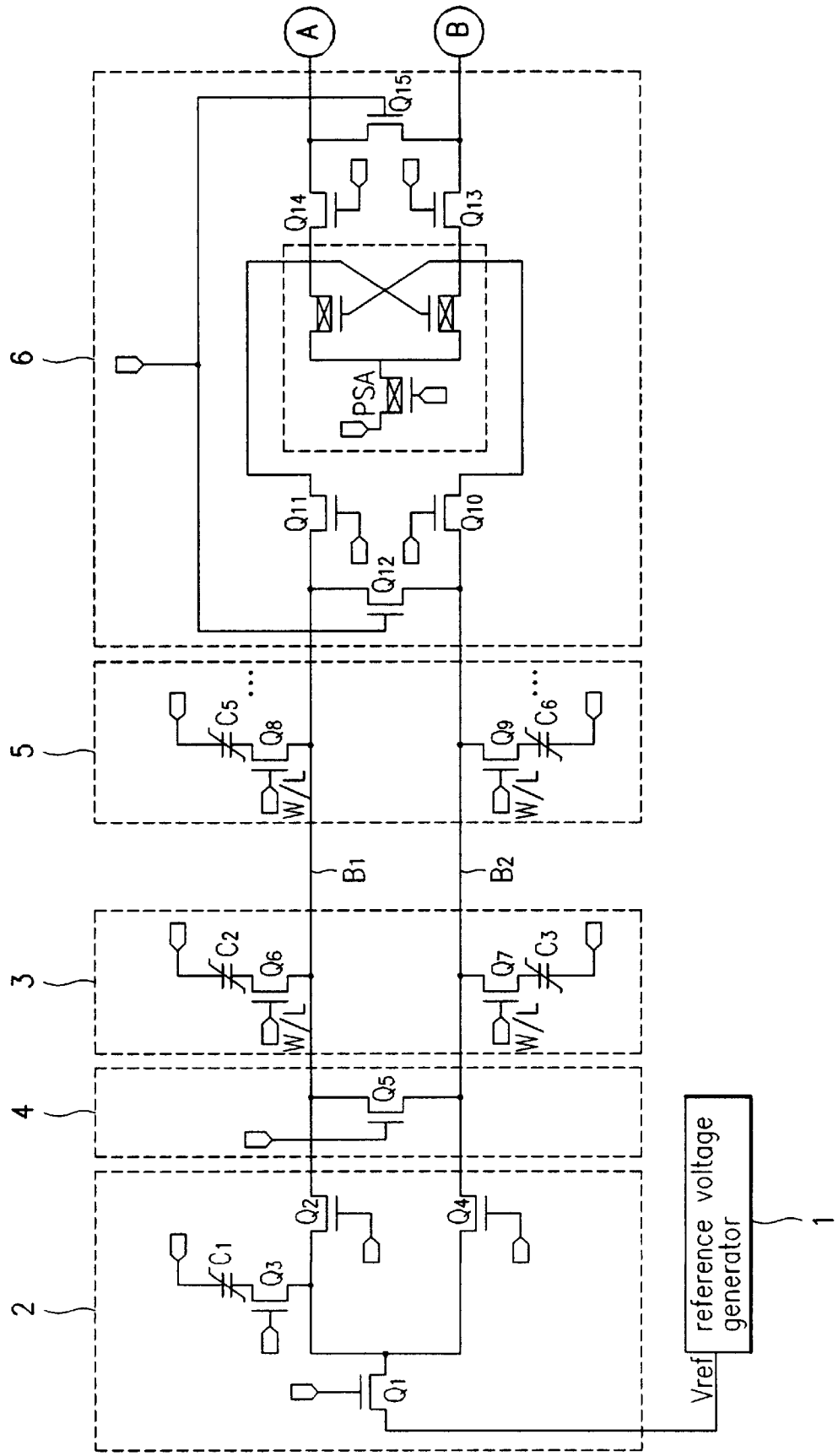
FIGS. 3(A) and 3(B) are block diagrams for a driving circuit of the conventional ferroelectric memory.
Figure 3B:
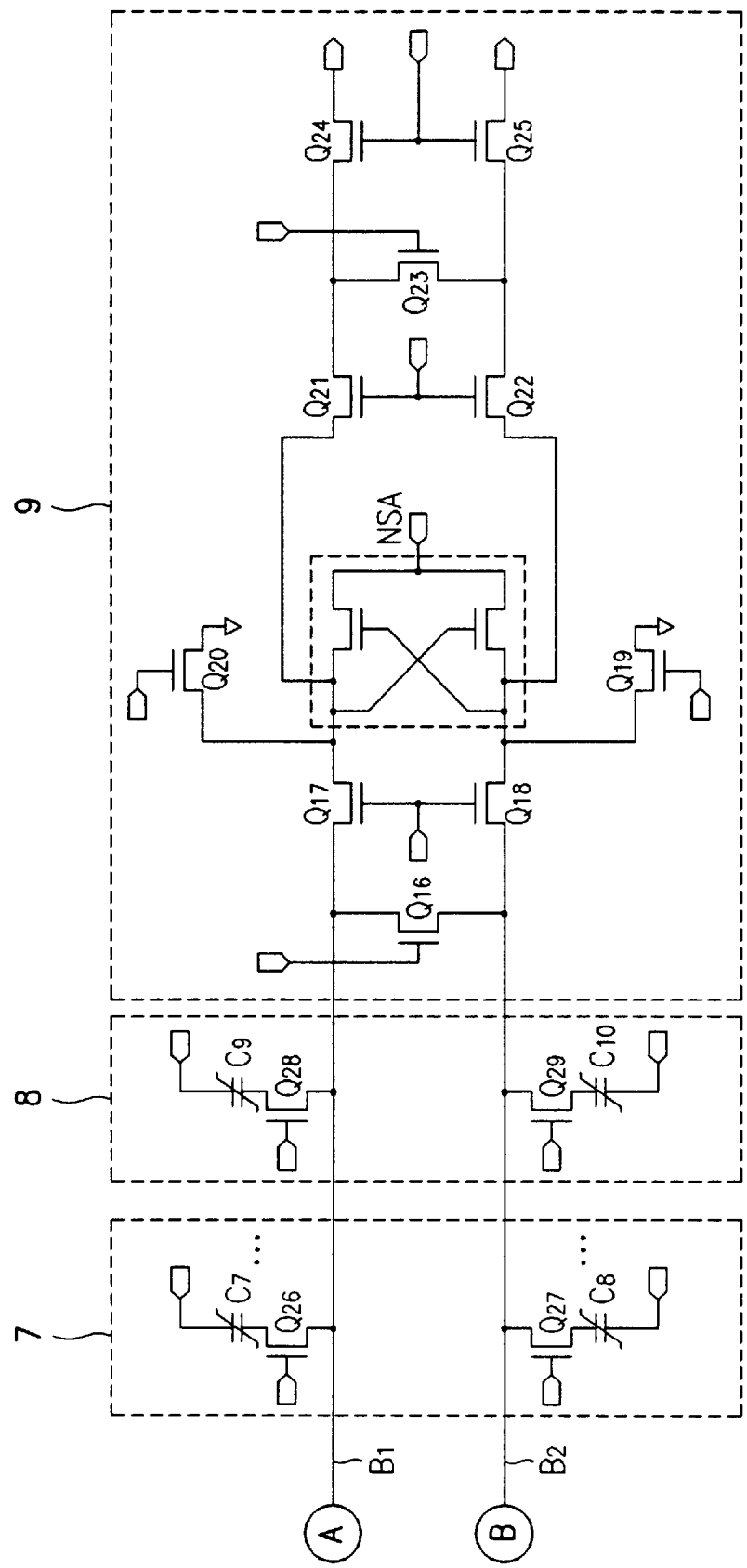
Figure 4:
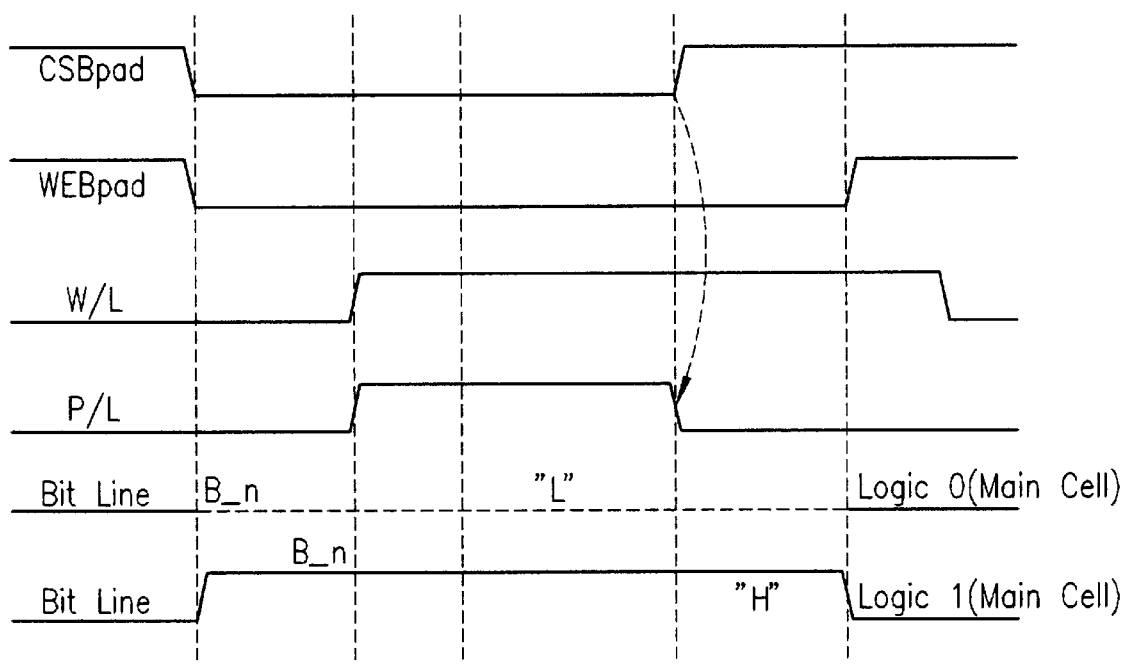
FIG. 4 is a timing chart showing the operation of the conventional ferroelectric memory in the write mode.
Figure 5:
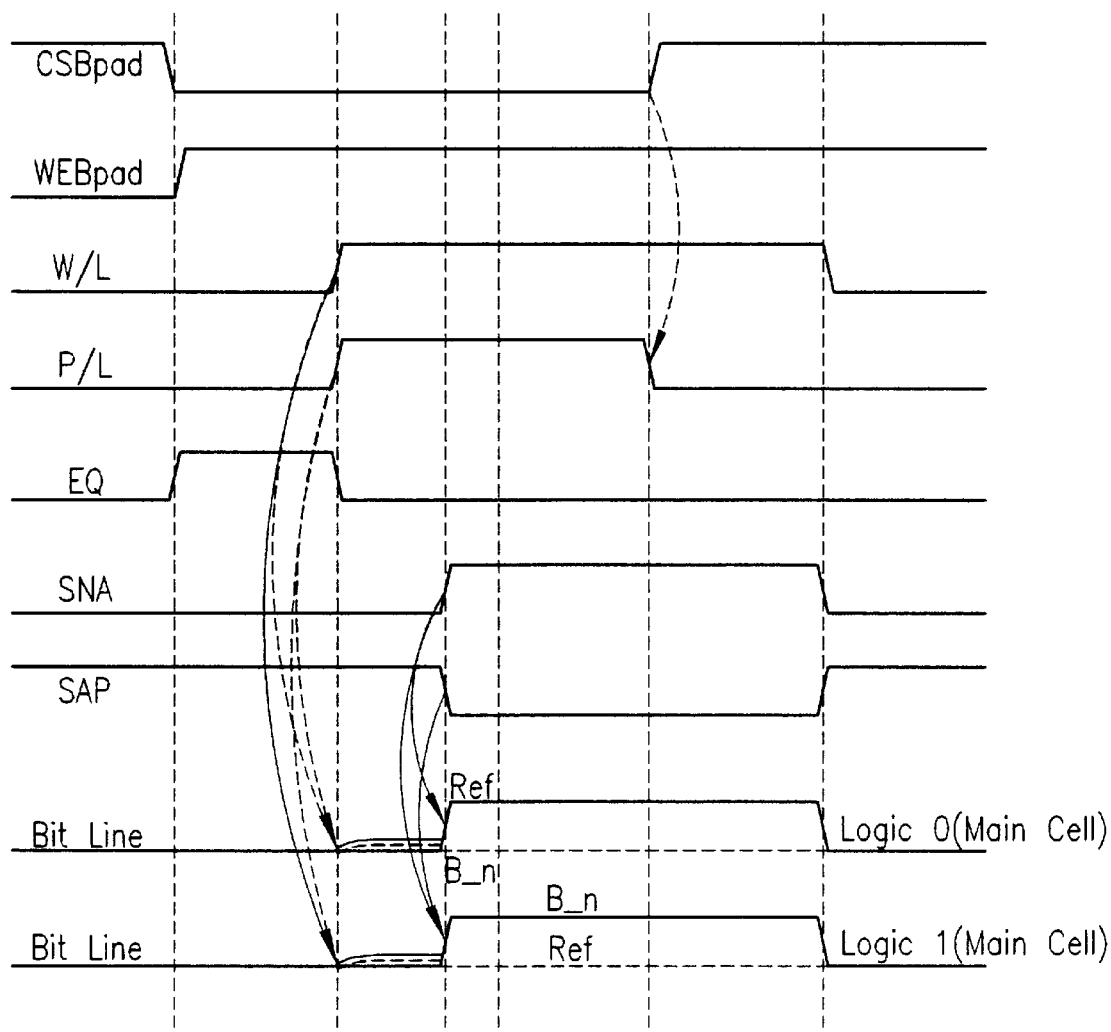
FIG. 5 is a timing chart showing the operation of the conventional ferroelectric memory in the read mode.
Figure 6:
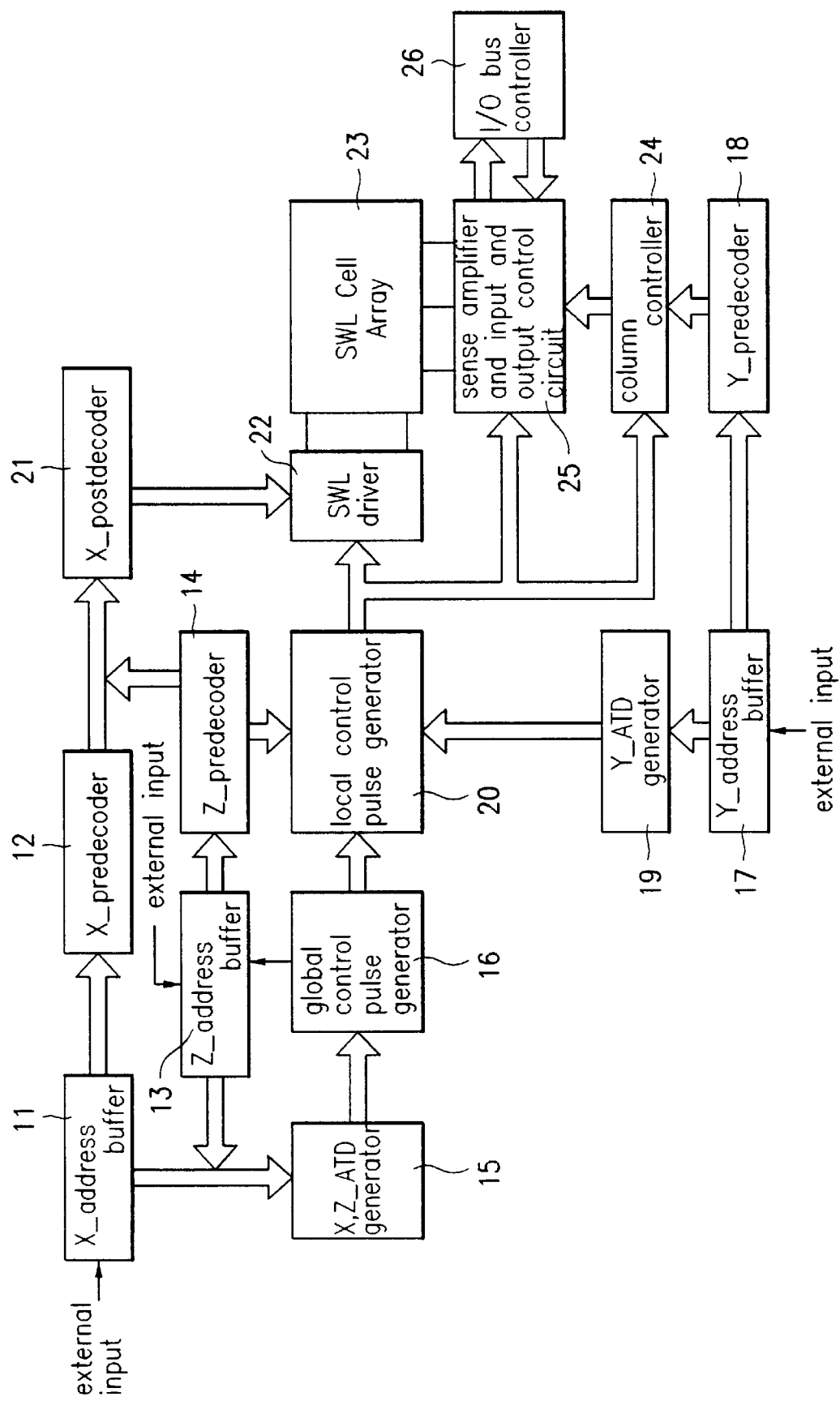
FIG. 6 is a block diagram of driving control and data input/output circuit of a SWL ferroelectric memory according to the present invention.

FIG. 6 shows a block diagram for the drive control and data input/output circuits of the SWL ferroelectric memory device according to the present invention. This circuit includes X address buffer 11 for buffering X address among externally applied X, Y and Z addresses, X predecoder 12 for predecoding the output signal of said X address buffer 11; a Z address buffer 13 for buffering Z address among externally applied X, Y and Z addresses; a Z predecoder 14 for predecoding the output signal of said Z address buffer 13; a X, Z-ATD generator 15 for to detecting the address transition points of the X address and Z address signals obtained from said X address buffer 11 and said Z address buffer 13, respectively; a global control pulse generator 16 for receiving the output signal of said X, Z-ATD generator 15 and the externally applied signal CSBpad, generating by itself power-up detection signal and then generating a basic pulse concerned with to the memory control according to said X, Z-ATD signal, CSBpad signal and power-up detection signal; a Y address buffer 17 for buffering Y address among externally applied X, Y and Z addresses; a Y predecoder 18 for predecoding the output signal of said Y address buffer 17; a Y-ATD generator 19 for detecting the address transition point of the Y address signal obtained from said Y address buffer 17 and generating Y-ATD signal; a local control pulse generator 20 for generating a pulse necessary for each memory block by combining the output signal from said global control pulse generator 16, the Z predecoding signal from said Z predecoder 14 and the output signal from said Y-ATD generator 19; a X postdecoder 21 combining the X predecoding signal and the Z predecoding signal obtained from said X predecoder 12 and said Z predecoder 14, respectively, and selecting the corresponding memory cell block; a SWL driver 22 combining the output signals obtained from said X postdecoder 21 and said local control pulse generator 20 and driving each splitted word line of each SWL cell block 23, a column controller 24 combining the cutout signals obtained from said Y predecoder 18 and said local control pulse generator 20 and selecting the corresponding bit line; a sense amplifier input/output controller 25 combining the output signals from said local control pulse generator 20 and said column controller 24 and controlling the operation and input/output of sense amplifier; and an input/output bus controller 26 interfacing between the external data bus and said sense amplifier input/output controller 25.

This structure of the SWL ferroelectric memory cell array according to the present invention is explained as follows.

Figure 7:
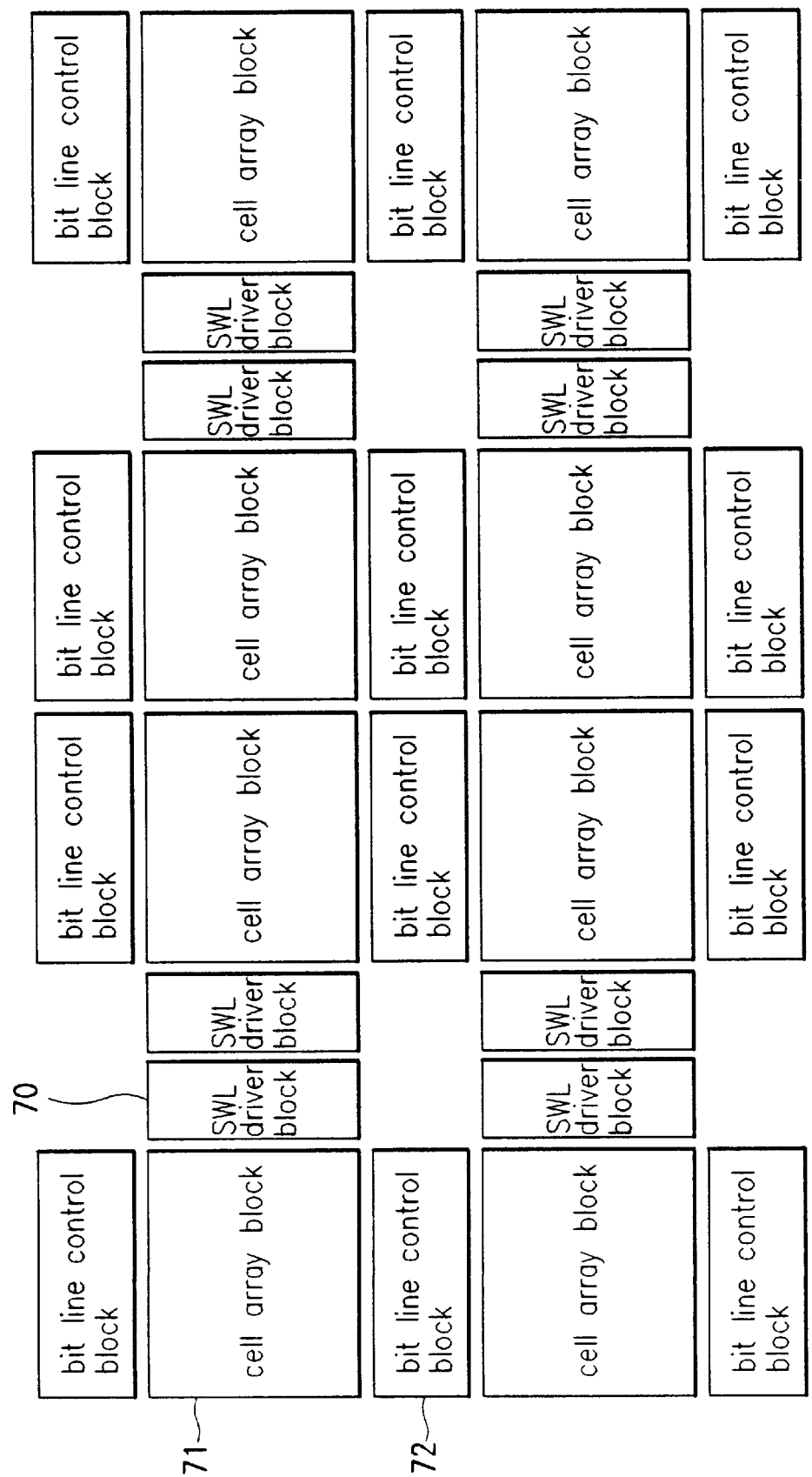
FIG. 7 is a block diagram of a SWL ferroelectric memory cell array according to the present invention.
Figure 8:
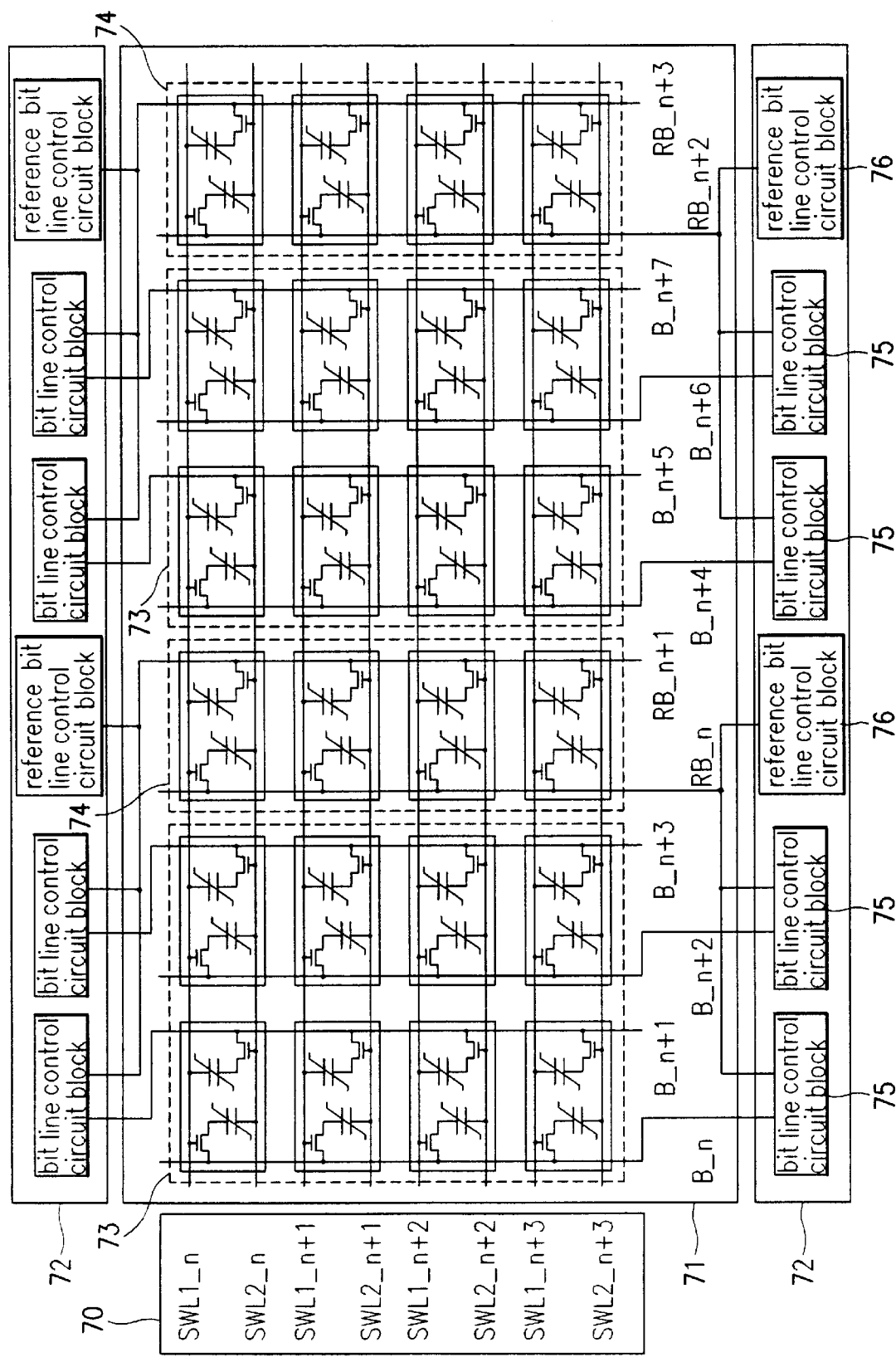
FIG. 8 is a detailed block diagram of the SWL ferroelectric memory cell array according to the present invention.
Figure 9:
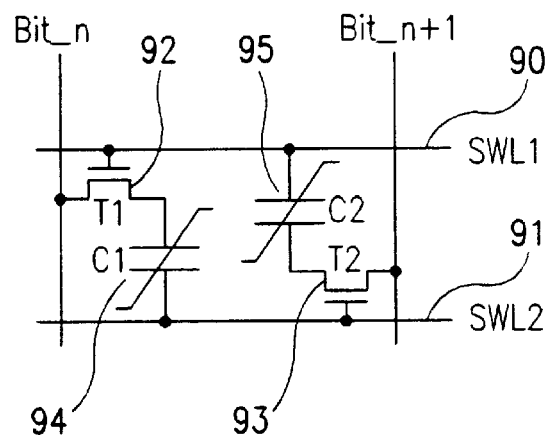
FIG. 9 is a structure of the basic memory cell of the SWL ferroelectric memory according to the present invention.

FIG. 7 is a block diagram of the cell array of the SWL ferroelectric memory according to the present invention, and FIG. 8 shows a detailed block diagram of the cell array of the SWL ferroelectric memory according to the present invention. FIG. 9 is the structure for the memory cell of the SWL ferroelectric memory according to the present invention.

In FIG. 7, a basic structure for the array of unit memory blocks is shown and the circuitry is divided into three blocks.

There are a SWL driver block 70 corresponding to each unit memory block and a cell array block 71 including both main memory cell array block and reference cell array block corresponding to each of unit memory blocks. A core block 72 including both column control circuit block and sense amplifier array block is separated into two parts per unit memory block and they are commonly held by the neighboring two unit memory blocks.

The detailed structure for the SWL ferroelectric memory array is explained by referring to FIG. 8.

First, the SWL driver block 70 is repeatedly constructed so as to have the first and second splitted word lines SWL1 and SWL2 as a basic pair. In other words, each pair consists of SWL1_n and SWL2_n, SWL1_n+1 and SWL2_n+1, SWL1_n+2 and SWL2_n+2, SWL1_n+3 and SWL2_n+3, . . . .

Cell array block 71 is a group including main memory cell array block 73 and reference cell array block 74. There are four memory cell arrays B_n, B_n+1, B_n+2 and B_n+3 in the main memory cell array block 73 and two reference cell arrays RB_n and RB_n+1 in the reference cell array block 74.

Thus, other cell array block is formed in the same way as other four memory cell arrays B_n+4, B_n+5, B_n+6 and B_n+7 and other two reference cell arrays RB_n and RB_n+1 are formed in a group.

Here, the main memory cell array block 73 consists of four columns of memory cell arrays but it may consist of any even number of columns such as 6, 8, 10, etc. A core block 72 including both bit line control circuit block 75 and reference bit line control circuit block 76 is separated into two parts per unit memory block. Each of the two parts is commonly held by the neighboring two unit memory blocks and is positioned at both ends of the cell array block 71 in a symmetrical manner, respectively. The bit line control circuit block 75 includes a sense amplifier block for performing the data read and write operations at the memory cell and a write control circuit.

In the cell array block 71, two splitted word lines are arranged in a pair in the same way as (SWL1_n and SWL2_n), (SWL1_n+1 and SWL2_n+1), . . . , a plurality of the pairs has are arranged in one direction in the cell array block 71, and a plurality of bit lines B_n, B_n+1, B_n+2 . . . are arranged in a direction perpendicular to the splitted word lines.

The bit line control circuit block 75 in each of main cell array groups and reference cell array groups consists of one of the main cell columns and a reference cell column.

There are two bit line control circuit blocks 75s at the bottom left. Each of the blocks consists of a pair of a main cell column B_n and a common reference cell column RB_n, and a pair of a main cell column B_n+2 and a common reference cell column RB_n, respectively.

There are also two bit line control circuit blocks 75s at the bottom second rightmost. Each of the blocks consists of a pair of a main cell column B_n+4 and a common reference cell column RB_n+2, and a pair of a main cell column B_n+6 and a common reference cell column RB_n+2, respectively.

There are two bit line control circuit blocks 75s at the top left. Each of the blocks consists of a pair of a main cell column B_n+1 and a common reference cell column RB_n+1, and a pair of a main cell column B_n+3 and a common reference cell column RB_n+1, respectively.

There are also two bit line control circuit blocks 75s at the top second rightmost. Each of the blocks consists of a pair of a main cell column B_n+5 and a common reference cell column RB_n+3, and a pair of a main cell column B_n+7 and a common reference cell column RB_n+3, respectively.

There are unit cells at the cross point between each splitted word line and each bit line whose detailed structure is in FIG. 9.

FIG. 9 shows the structure of a basic memory cell. This cell includes a first transistor T1 92 of NMOS whose gate is connected to a first splitted word line SWL1 90, a second transistor T2 93 of NMOS whose gate is connected to a second splitted word line SWL2 91, a first ferroelectric capacitor C1 94 whose one electrode is connected to the source of said first transistor 92 and the other electrode is connected to said second splitted word line 91, and a second ferroelectric capacitor C2 95 whose one electrode is connected to said first splitted word line 90 and the other electrode is connected to the source of said second transistor 93.

Here, the drain of the first transistor 92 is connected to the bit line Bit_n and the drain of the second transistor 93 is connected to the bit line Bit_n+1.

Thus, two data can be stored in this unit memory cell. A pair of the first and second splitted word lines SWL1 and SWL2 form a row address and a pair of bit lines Bit_n and Bit_n+1 form two columns.

The detailed explanation for each block of the SWL ferroelectric memories having this array structure is as follows.

First, the unit drive control and the data input/output circuit of the present invention provided for solving the problems such as dummy cell deterioration and reference voltage unstability according to the reference level generation using a dummy cell are as follows.

Figure 10:
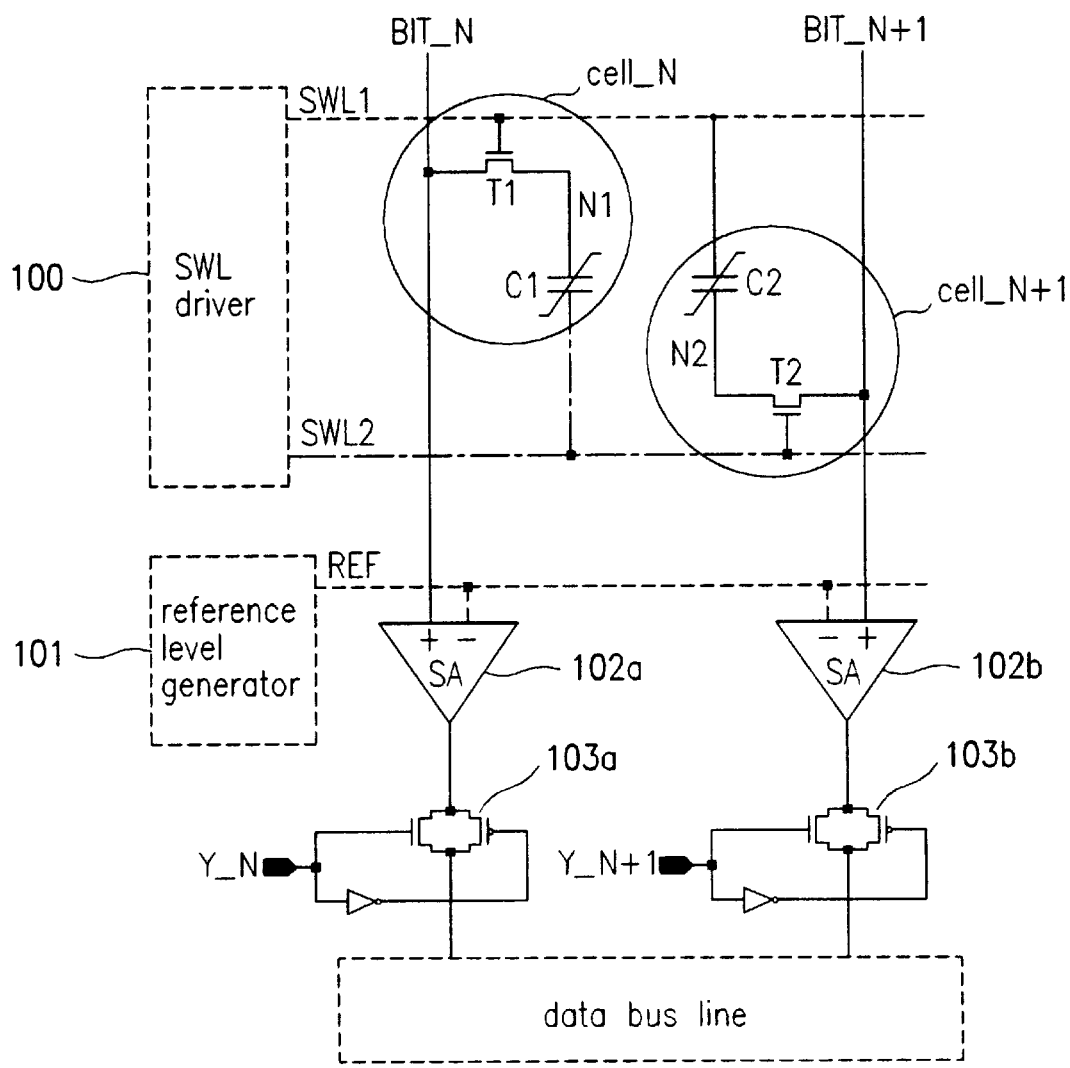
FIG. 10 is a block diagram of a unit driving control and data input/output circuit of the SWL ferroelectric memory according to the present invention.
Figure 11:
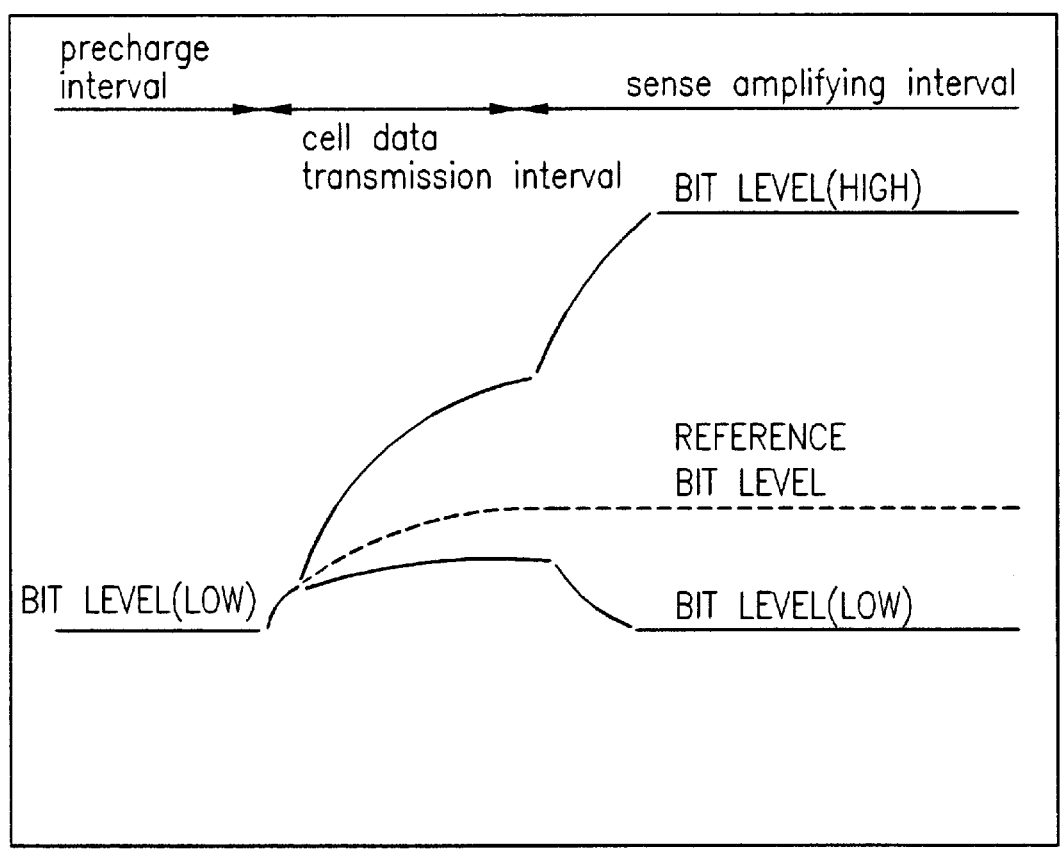
FIG. 11 is a operation timing chart to explain the relationship between a bit line level and a reference level.

FIG. 10 is a block diagram for the unit drive control and the data input/output circuit of the SWL ferroelectric memory according to the present invention and FIG. 11 is the operation timing chart to explain the relationship between a bit line level and a reference level.

FIG. 10 shows the structure consisting of two SWL ferroelectric memory cells according to the present invention and also shows the unit drive control and data input/output circuit. The drive control and data input/output circuit consists of a unit cell including a first transistor T1 whose one electrode is connected to Nth bit line BIT_N, a second transistor T2 whose one electrode is connected to N+1th bit line BIT_N+1, a pair of word lines, i.e., first and second splitted word lines SWL1 and SWL2 connected to each of the gates of said two transistors T1 and T2, respectively; SWL driver 100 which is connected to the first and second splitted word lines SWL1 and SWL2 and applies SWL drive signals to the word lines; reference level generator 101 generating a reference level to be used in sense amplifiers 102a and 102b which are connected to Nth bit line BIT_N and N+1th bit line BIT_N+1, respectively; and column decoders 103a and 103b transfering the output data from the sense amplifiers 102a and 102b to data bus lines by the address signals Y_N and Y_N+1.

Here, since Nth and N+1th cells operating as a pair of word lines have the same Low(Row) address but the operation pulses different from each other, the cells are distinguished from each other by the column address signals Y_N and Y_N+1 which are applied to the column decoders 103a and 103b.

The reference level generator 101 generates a reference level necessary to detect data and applies the reference level signal to the sense amplifiers 102a and 102b through the reference line REF.

The relationship between the bit line level signal and the reference level signal at the main cell in the read mode in the SWL ferroelectric memory according to the present invention having the drive control and data input/output circuit described above is shown in FIG. 11 according to the time before and after the cell is selected.

In FIG. 11, the time is divided into three intervals, namely, the precharge interval, the cell data transfer interval and the sense amplifying interval. The first precharge interval is to precharge the bit line level and the reference level with low level before the word line is enable.

The second cell data transfer interval is to carry the main memory cell data to the bit line and the output data from the reference level generator 101 to the reference line.

The third sense amplifying interval is for the sense amplifiers 102a and 102b which are driven by the column decoders 103a and 103b, respectively, to amplify the difference between the data level of the bit line and the data level of the reference line REF and then to feedback the amplified signal to the bit line.

Figure 12:
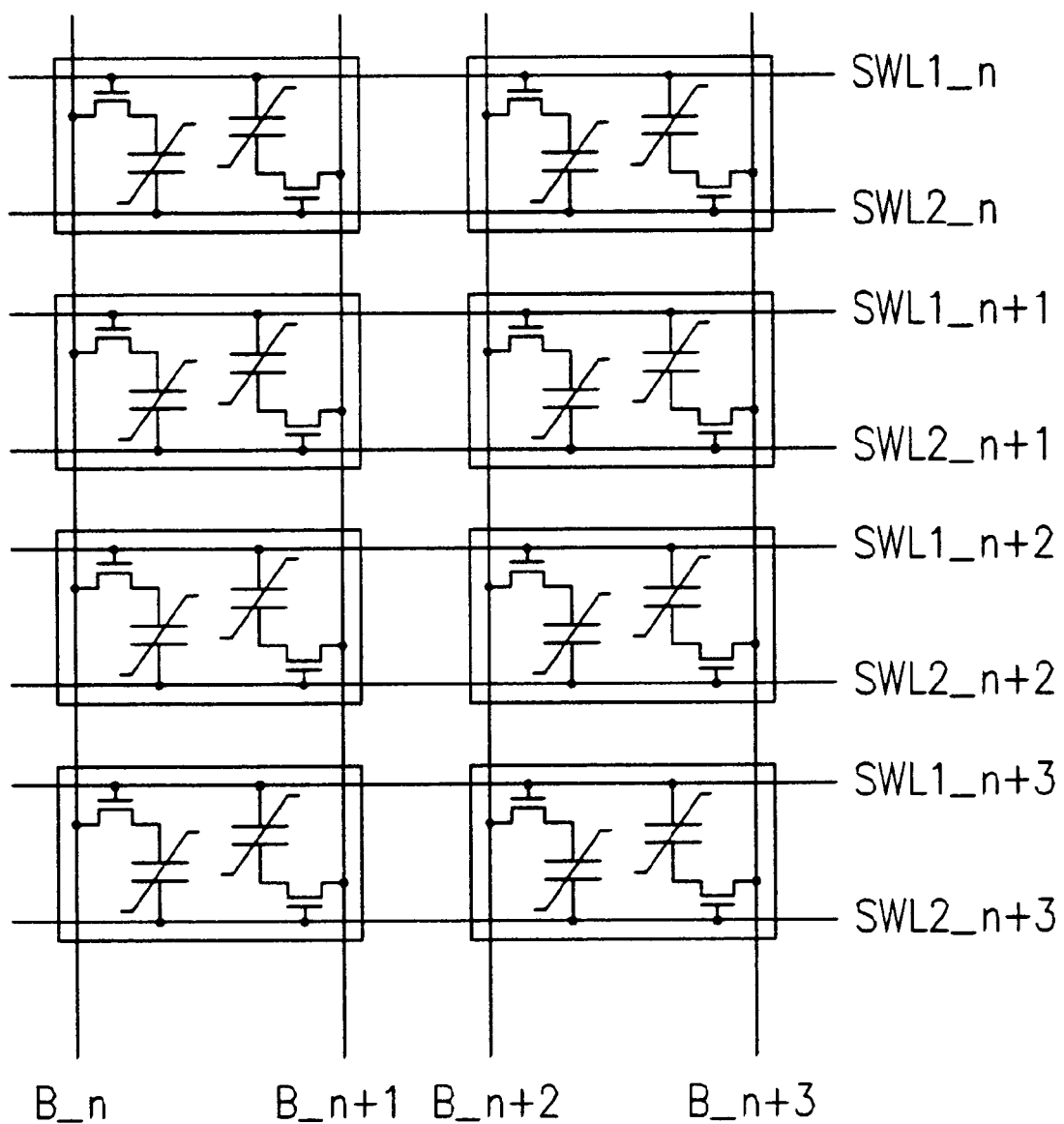
FIG. 12 is a memory cell array structure of the SWL ferroelectric memory according to the present invention.
Figure 13:
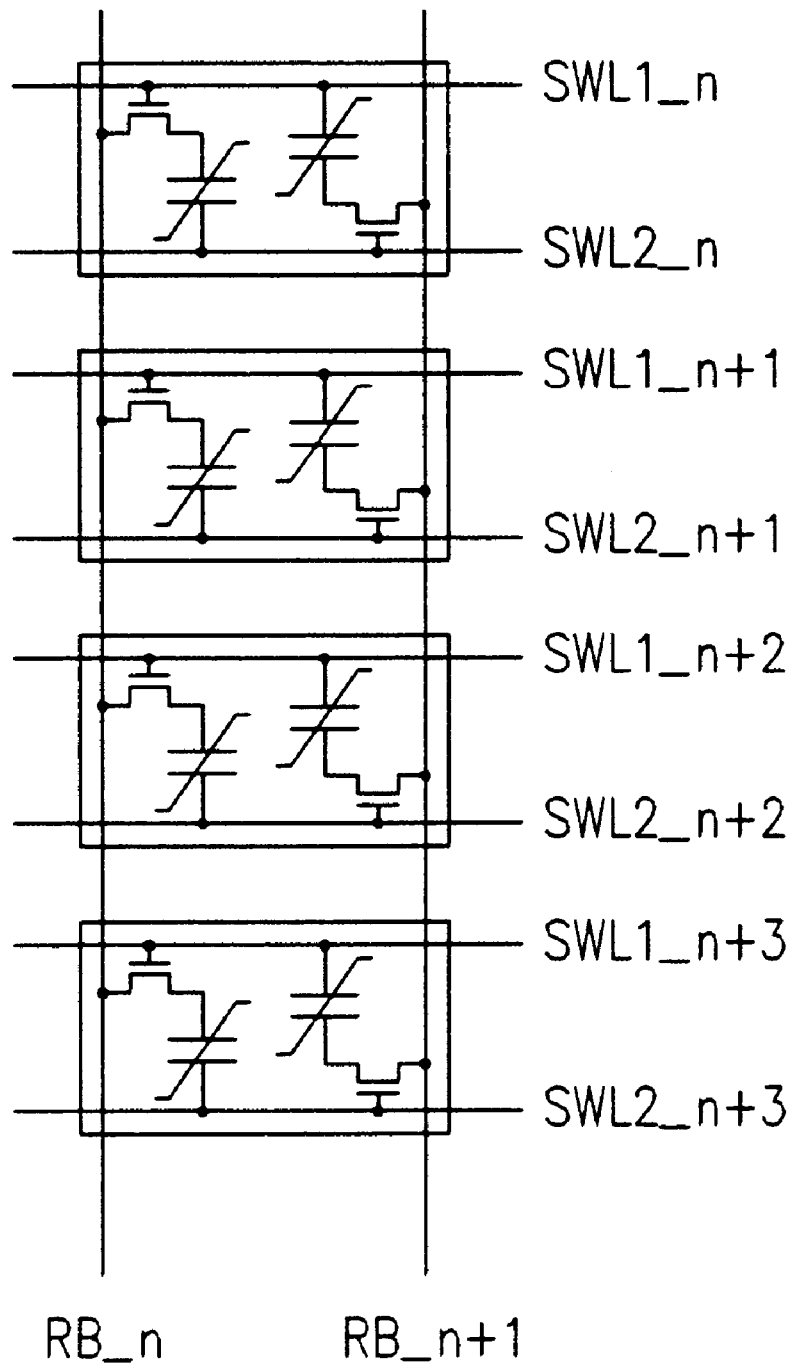
FIG. 13 is a reference cell array structure of the SWL ferroelectric memory according to the present invention.

The detailed structure for the main memory cell array block 73 of the unit memory block of the SWL ferroelectric memory according to the present invention is shown in FIG. 12, and the reference cell array block 74 is shown in FIG. 13.

Referring to FIG. 12, all the intersections between splitted word lines (SWL1_n and SWL2_n), (SWL1_n+1 and SWL2_n+1), ..., and bit lines B_n, B_n+1, B_n+2, ..., do not have a memory cell. In the point of view of a particular splitted word line, it looks as if the memory cell is arranged to every other bit line and therefrom a Folded Bit Line is formed.

Therefore, it looks as if the SWL cells are arranged in a rectangular manner in the point of view of the SWL array of the unit memory block. Thus, memory cell can be arranged to the even or odd numbered bit line of the splitted word lines. This means that a pair of SWL word lines SWL1 and SWL2 must simultaneously be enabled in the SWL cell array.

In the same manner, referring to FIG. 13, by arranging SWL memory cell in one column and connecting SWL1 and SWL2 of the main cell array with SWL1 and SWL2 of the reference SWL cell, the two bit lines form a Folded Bit Line structure.

The structures of the bit line control circuit and the sense amplifier having the memory cell array and reference cell array structures according to the present invention are explained as follows.

Figure 14:
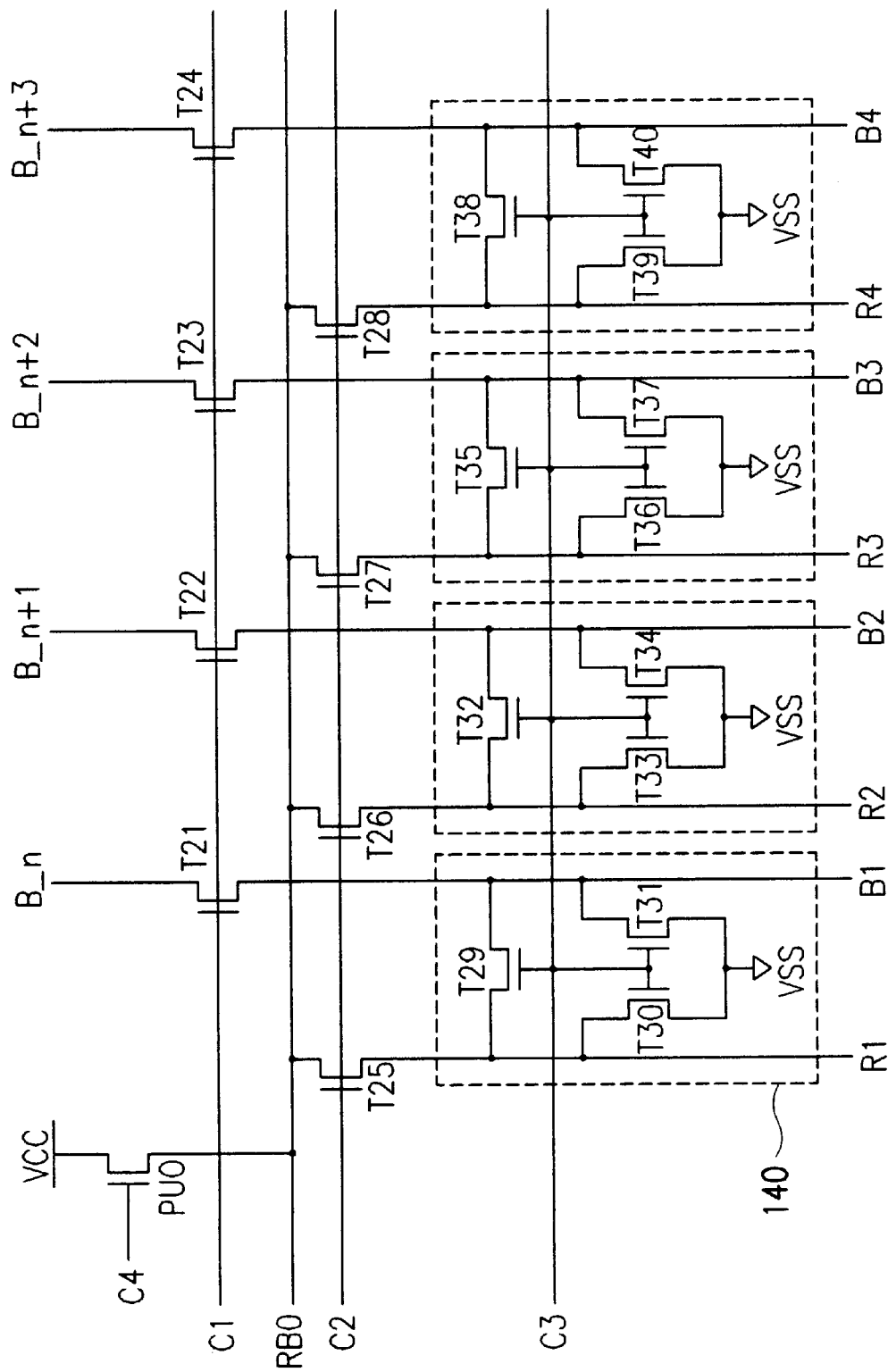
FIG. 14 is a block diagram for the bit line control circuit of the SWL ferroelectric memory according to the present invention.
Figure 15:
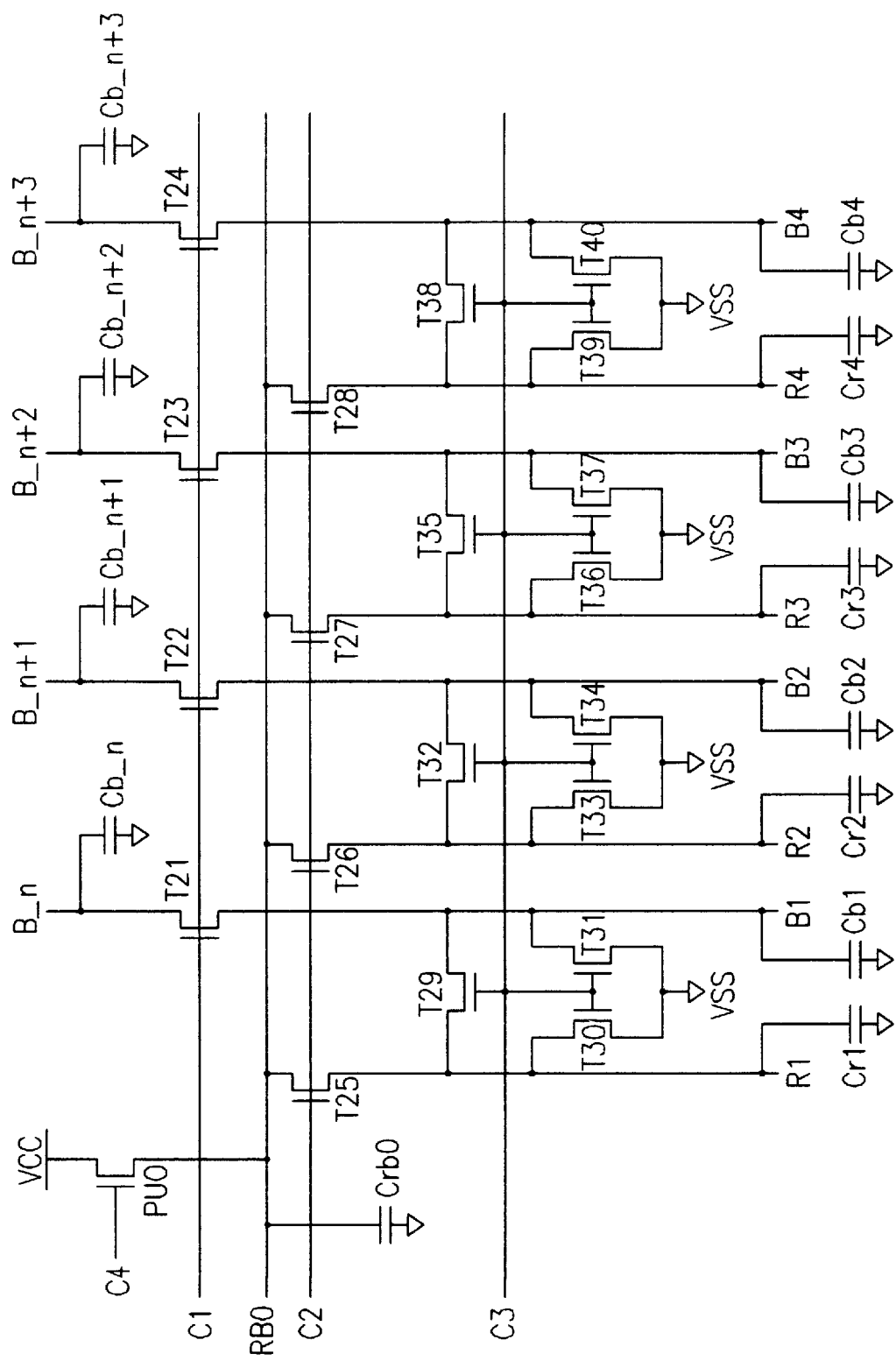
FIG. 15 shows the capacitance components of each node in the circuit of FIG. 14.

FIG. 14 is a block diagram for the bit line control circuit of the SWL ferroelectric memory according to the present invention and FIG. 15 shows the capacitance components of each node in the circuit of FIG. 14.

FIG. 14 shows a basic structure the bit line control circuit of the SWL ferroelectric memory according to the present invention. The control circuit includes a plurality of transistors T21, T22, T23 and T24 which turn on by the enabled first control signal C1 and connect a plurality of bit lines B_n, B_n+1, B_n+2, B_n+3 ... to the input and output nodes B1, B2, B3, B4 ..., a plurality of transistors T25, T26, T27 and T28 which turn on by the enabled second control signal C2 and connect a reference bit lines RB0 to the input and output nodes R1, R2, R3, R4 ..., a bit line level controller 140 controlling the level by the third control signal C3, and a pull up transistor PU0 applying a pull up voltage VCC to a reference bit line RB10 according to the fourth control signal C4.

The explanation for the capacitance at each node in the bit line control circuit of this basic structure is as follows.

First, the capacitance component of each bit line of the main memory cell region is denoted by Cb_n, Cb_n+1, Cb_n+2 ..., respectively, and the capacitance component of the reference bit line of the reference cell region is denoted by Crb0. The capacitance components for other region are denoded by Cr1, Cr2, Cr3 ... and Cb1, Cb2, Cb3 .... Then, the circuit is designed as follows.

The number of memory cells connecting the main memory cell array and the reference cell array to the bit lines, respectively, is made equal to the number of reference cells so that Cb_n=Crb0, Cb1=Cr1, Cb2=Cr2, Cb3=Cr3 and Cb4=Cr4. The number of the bit lines of the main cell array is determined so as to satisfy the condition Crb0=n*Cr1. Therefore, if Cbit_total is the total capacitance of the bit line concerned with the main memory cell, Cbit_total=Cb_n+Cb1. But, if Cb_n>>Cb1, then Cbit_total=Cb_n. If Crbit_total is the total capacitance of the bit line concerned with the reference cell, Cbit_total=Crb_n+n*Cr1. The total capacitance of the bit line concerned with the main memory cell is made two times larger than the total capacitance of the bit line concerned with the reference cell.

The data input and output circuit having this structure according to the present invention is explained as follows.

Figure 16:
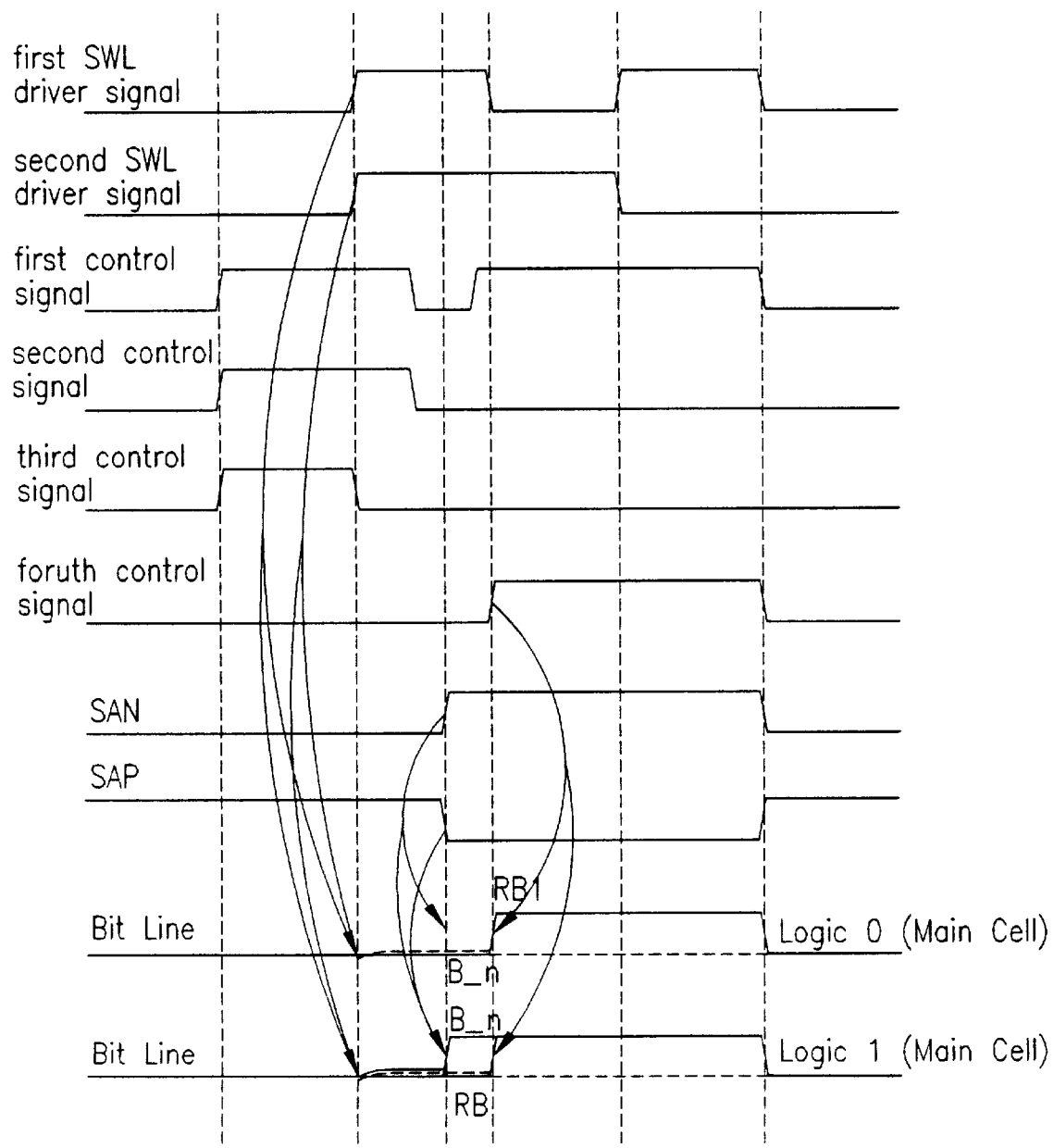
FIG. 16 is a timing chart for the operation of the SWL ferroelectric memory according to the present invention.

FIG. 16 is a timing chart for the operation of the SWL ferroelectric memory according to the present invention and FIG. 17 shows the variation in the bit line induction potential and the potential at the input and output node when the sense amplifier is in operation.

First, when the first control signal C1 is enabled to a high state, the NMOS transistors T21, T22, T23 and T24 turn on and therefrom the bit lines B_n, B_N+1, B_n+2, B_n+3 ... of the main memory cell region are electrically connected to the input output nodes B1, B2, B3, B4 .... When the second control signal C2 is enabled to a high state, the NMOS transistors T25, T26, T27 and T28 turn on and therefrom the bit line RB0 of the reference memory cell region are electrically connected to the input output nodes R1, R2, R3, R4 ....

Thus, when the third control signal C3 is enabled to a high state under the condition that the first and second control signals C1 and C2 are in a high state, the transistors T29, T30, T31, T32 . . . T40 in the bit line level controller 140 is active and and then both the bit line of the main memory cell and the bit line of the reference cell are equal to each other and at the same time pulled down to the ground level.

By keeping the first and second control signals at a high state, the third control signal C3 is made disabled at the instant that the equalization and pulldown are achieved.

By making two word lines SWL1 and SWL2 active at a high state after the third control signal is disabled, the data stored at the main memory cells are transferred to B1, B2, B3, B4 through B_n, B_n+1, B_n+2, B_n+3, and the data stored at the reference cell is transferred to R1, R2, R3, R4 through RB0.

When the data stored at each cell are fully transferred to the main and reference bit lines, respectively, the transistors T21, T22, . . . T28 are made off by the disabled first and second control signals at a low state.

Under these conditions, by making the signal SAP low and the signal SAN high in order to make the sense amplifier (not shown in FIGS. 14 and 15) active, the minute voltage transferred to each of R1, R2, R3, R4, B1, B2, B3, B4 is amplified.

When the amplification operation is completed, the data at B1, B2, B3 and B4 amplified by the sense amplifier are again transferred to the bit lines B_n, B_n+1, B_n+2 and B_n+3 of the main memory cell by by enabling the first control signal to a high state.

Furthermore, to restore the destroyed logic data of 1 to the reference memory cell, the reference bit line is set with a high level by making the fourth control signal active at a high level and the NMOS transistor PU0 on.

Under this condition, the data destroyed in the reference and main memory cells are restored by alternately applying a low voltage and a high voltage to the word lines SWL1 and SWL2. When the restoring operation is completed, the sense amplifier is disabled by setting the word lines SWL1 and SWL2 and the first and fourth control signals with a low voltage and by setting the signal SAN with a low voltage and the signal SAP with a high voltage.

The basic structure of the data input and output circuit according to the present invention is directed to have the same characteristic changes for all the ferroelectric regions by making the accessed number of the main memory cells equal to the accessed number of the reference cells.

Therefore, the relationship between the bit line induction voltage of the reference cell and the bit line induction voltage of the main memory cell can be held constantly, and therefrom the operation of the sense amplifier is stabilized and the lifetime of the chip is extended.

Referring to FIG. 17, even when the capacitance of the reference cell equals the capacitance of the main memory cell and a logic value of 1 is stored in the two cells, the bit line induction voltage variation in the memory cell is larger than that in the reference cell.

When a logic value 1 is stored in the reference cell and a logic value 0 is stored in the main memory cell, the bit line induction voltage variation in the reference cell is larger than that in the main memory cell. In other words, when the state for the logic value 1 and the logic value 0 stored in the main memory cell is about a half of the bit line induction voltage, a bit line voltage of the reference cell is formed. Therefore, when the circuit is formed according to the same condition as FIG. 15 and a logic value 1 is stored in the reference cell, it is exactly determined whether the data stored in the main memory cell is a logic value 1 or a logic value 1.

The drive control circuit of the SWL nonvolatile ferroelectric memory having a basic structure of this input and output circuit according to the present invention is explained as follows.

In the drive control circuit of the SWL ferroelectric memory according to the present invention, the kernel art includes a local control pulse generator 20, Yaddress buffer 17, Y_ATD generator 19, X postdecoder 21, Y predecoder 18, column controller 24, and sense amplifier input/output controller 25 which are centering around the SWL cell array 23 and the SWL driver 22 of FIG. 6 which shows the total structure of the drive control circuit.

In other words, the SWL ferroelectric memory according to the present invention is concerned with the blocks for controlling the data input and output opertions centering around the locak control pulse generator 20.

First, the global control pulse generator which supplies the local control pulsegenerator 20 with various operation pulses is briefly explained as follows so as to exactly understand the flow of the various control signals.

Figure 18:
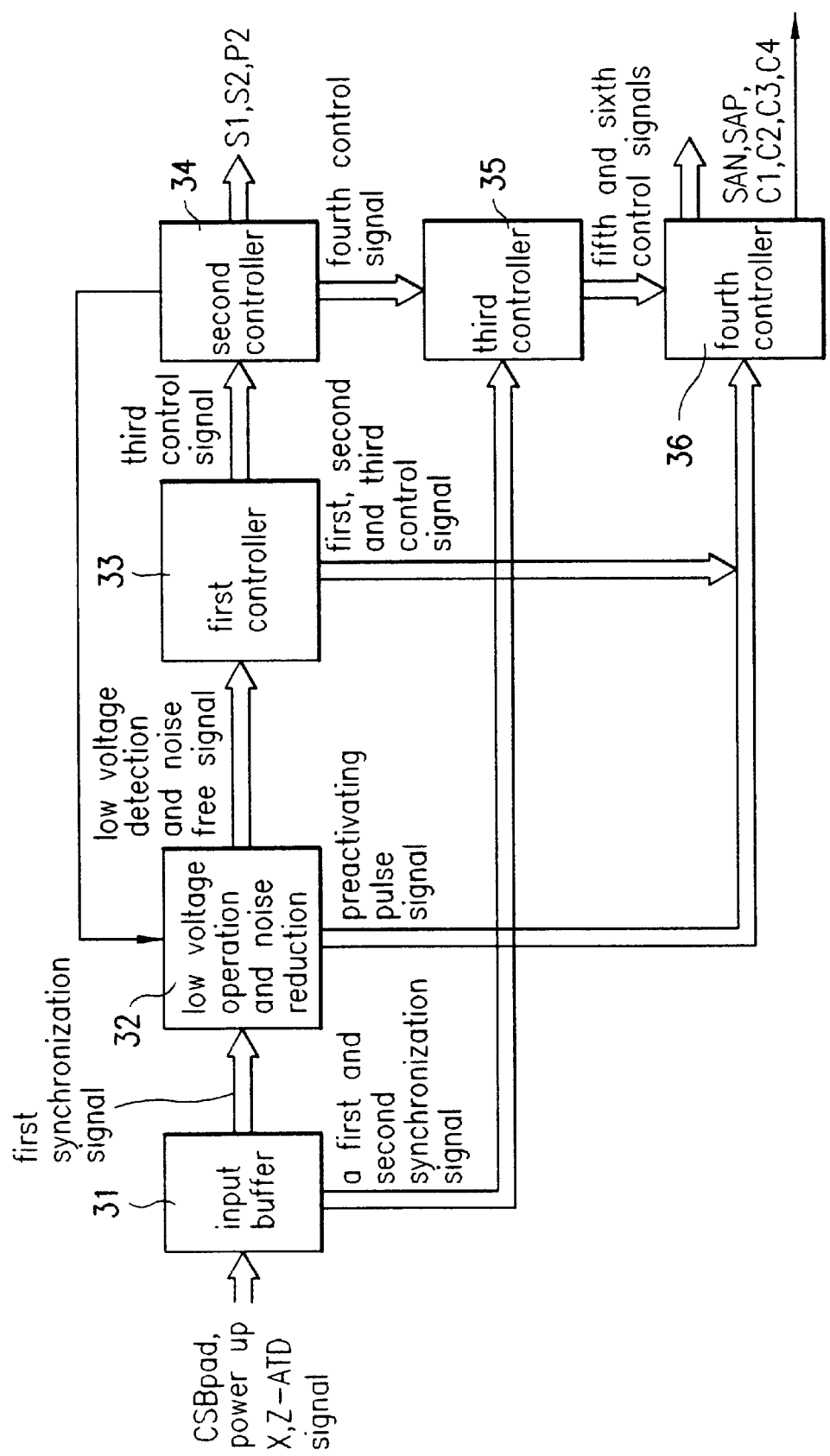
FIG. 18 shows a block diagram for a global control pulse generator according to the present invention.

FIG. 18 shows a block diagram for the global control pulse generator according to the present invention and FIGS. 19a and 19b show the operation timing chart for the global control pulse generator.

The global control pulse generator 16 includes an input buffer 31 for receiving a CSBpad signal and one of X,Z-ATD signals of X,Z-ATD generator and a power up detection signal in which CSBpad is included and for generating first and second synchronization signals; a low voltage operation and noise reduction circuit 32 for receiving a feedback signal and the first synchronization signal of said input buffer 31, generating a low voltage detection signal to stop the operation when the voltage is low, generating a noise free signal cancelling noise from the first synchronization signal, and generating a pre-active pulse signal; a first controller 33 for generating a first control signal to control the starting point for the sense amplifier enable time by receiving said noise free signal when a normal power supply voltage is supplied by said low voltage operation and noise reduction circuit 32, a second control signal to control the staring points for the first control signal, for the column selection time and for the bit line pull up, and a third control signal to generate the input signal for the SWL driver and other control signals; a second controller 34 for receiving the third control signal of said first controller 33 and then for generating a pair of basic waveform generation signals S1 and S2 for the pair of SWL1 and SWL2 of said SWL driver, respectively, and a fourth control signal which is a basic pulse signal to control the active interval of said signal S1 and S2 as an feedback signal of the low voltage operation and noise reduction circuit 32, and for outputting a pulse signal P2 which is an improved fourth control signal so as to have more drive capability, a third controller 35 for receiving the first and second synchronization signals of said input buffer 31 and the fourth control signal of said second controller 34 and then generating a fifth control signal to control them so as to be synchronized with said signal CSBpad when all signals except said signals S1 and S2 are disabled and a sixth control signal to extend the enable state of the signals S1 and S2 by the completion of normal operation of the signals S1 and S2 when the signal CSBpad is disabled under the condition that said signals S1 and S2 are enabled; and a fourth controller 36 for receiving the fifth and sixth control signals from said third controller 35, the first, second and third control signals from said first controller 33 and the pre-enable pulse signal from said low voltage and noise reduction circuit 32 and then generating an enable signal SAN for n-MOS element of the sense amplifier, an enable signal SAP for p-MOs of the sense amplifier, a control signal C1 for connecting between the bit line of the main cell block and the first input and output node of the sense amplifier, a control signal C2 for connecting between the bit line of the reference cell block and the second input and output node of the sense amplifier, a control signal C3 for controlling the low voltage precharge for the bit line of the main cell, the bit line of the reference cell and the sense amplifier node, a control signal C4 for controlling the starting point of the column selection enable and the pull up of the bit line of the reference cell.

The control pulse generation operation of the global control pulse generator is explained as follows.

FIG. 19a is a operation timing chart for the global control pulse generator when Y address toggling and FIG. 19b is a operation timing chart for the global control pulse generator when X, Z address toggling.

The chip enable signal CSBpad is externally provided through a chip enable pin and is enabled by the transition from a high state to a low state. An inactive internal of a high state is necessary for performing a new read or write operation.

In FIG. 19a, thw whole period is divided into 15 intervals from t1 to t15.

The signal CSBpad is active at a low state from the interval t1 to the end of the interval t14 and gets a transition to a high state at the starting point of the interval t15 and then inactive. While the signal CSBpad is active, X and Z addresses are not changed but Y address gets a transition at each of the starting point of the interval t7 and the starting point of the interval t11. Y-ATD generates a high pulse in the intervals of t7–t8, and t11–t12 by detecting the change in Y address. The signals S1 and S2 are used to form the basic waveforms for word lines SWL1 and SWL2 of the SWL cells.

First, at the interval t1, the signal CSBpad is enabled by going down from a high state to a low state. At this time, X, Y and Z addresses keeps their states before the interval t1. After Y address is transitted at the starting point of the interval t7, the signal Y-ATD keeps its a high state in the intervals t7 and t8. After Y address is transitted at the starting point of the interval t11, the signal Y-ATD keeps its a high state in the intervals t1 and t12.

When the interval t1 is passed and the interval t2 starts, the signals S1 and S2 go up to a high state. The signal S1 holds the high state for the interval t3 and a low state for the interval t4. The signal S2 holds the high state for the intervals t3 and t4.

The basic signal C1 which is used to control the signal flow between the main cell bit line and one input terminal of the sense amplifier has only one low state in the interval t3. Therefore, the signal flow between the main cell bit line and one of the input terminal of the sense amplifier is disconnected in the interval t3.

The basic signal C2 controlling the signal flow between the reference cell bit line and the other input terminal of the sense amplifier has a low state in the intervals from t3 to t14. Therefore, the signal flow between the main cell bit line and the other input terminal of the sense amplifier is disconnected in the intervals from t3 to t14.

The basic signal C3 controlling the signal flow between the main cell bit line and an external data bus and controlling the pullup of the reference bit line has a transition from the low state to a high state at the starting point of the interval t4 and another transition from the high state to a low state at the starting point where the signal CSBpad is disabled (the end point of the interval t4). Therefore, controlling the signal flow between the main cell bit line and the external data bus and controlling the pull up of the reference bit line is possible only in the intervals from t4 to t14.

The signal P2 to prevent the signals S1 and S2 from being disturbed by other pulses in the interval which the signals S1 and S2 are normal pulses goes up to a high state at the starting point of the interval t2 where the signals S1 and S2 are their high state and then goes down to to a low state at the starting point of the interval t6.

The signal C3 for precharging the low voltage of the bit lines of the main and reference cells before the signals S1 and S2 become active holds its high state in the interval t1, goes down to to a low state at the starting point of the interval t2 and then goes up to a high state at the time when the signal CSBpad becomes disables.

The signal SAN (a preparatory signal to be used for generating a signal SAN_C to control NMOS transistors so as to drive the sense amplifier of the sense amplifier input and output controller) holds its previous low state by the end point of the interval t2, goes up to a high state at the starting point of the interval t3 and then goes up to a low state at the time when the signal CSBpad becomes disables.

The signal SAP (a preparatory signal to be used for generating a signal SAP_C to control PMOS transistors so as to drive the sense amplifier of the sense amplifier input and output controller) is changed in the opposite polarity to the signal SAN. That is, the signal SAP holds its previous high state by the end point of the interval t2, goes up to a low state at the starting point of the interval t3 and then goes up to a high state at the time when the signal CSBpad becomes disables.

The waveforms for the input and output operation of the global control signal generator when X,Z addresses are changed is very similar to the waveforms for the input and output operation when Y address changing. The part different from each other is that the signal X,Z-ATD is a high state when X,Z addresses are changed in FIG. 19b while the signal Y-ATD is a high state when Y addresse is changed in FIG. 19a. In the global control pulse generator, the signal X,Z-ATD and the signal CSBpad are combined when X,Z addresses are changed. When there exists a high state intervals (t7 and t14) in the signal X,Z-ATD, the global control pulse generator determines that the signal CSBpad is a high state in that interval. Therefore, in the global control pulse generator all the output signals are again generated and the corresponding X,Z addresses are normally accessed. The signal C1 which returns to its previous state after the temporary transition to a low state while both of the signals S1 and S2 are in their high state in one interval goes to a low state in the intervals t3, t10 and t17. The signal C2 goes from a high state to a low state at the time that the signal C1 goes down to a low state. The signal C4 goes down to a low state at the time that the signal C2 goes up to a high state and then goes up to a high state when the signal C1 goes up to a high state. The signal P2 goes up to a high state when both of the signals S1 and S2 go to a high state and then go down to a low state at the time that the second high state of the signal S1 having two high pulse intervals ends. The signal C3 goes down to a low state at the time that both of the signals S1 and S2 go to a high state and goes up to a high state when X,Z-ATD goes up to a high state. The signals SAN and SAP transit to their opposite states, respectively, when the signal C2 is changed. The local control pulse generator receives the pulse signal from the global control pulse generator and then controls the SWL ferroelectric memory according to the present invention.

The local control pulse generator of the present invention is explained in detail.

Figure 20:
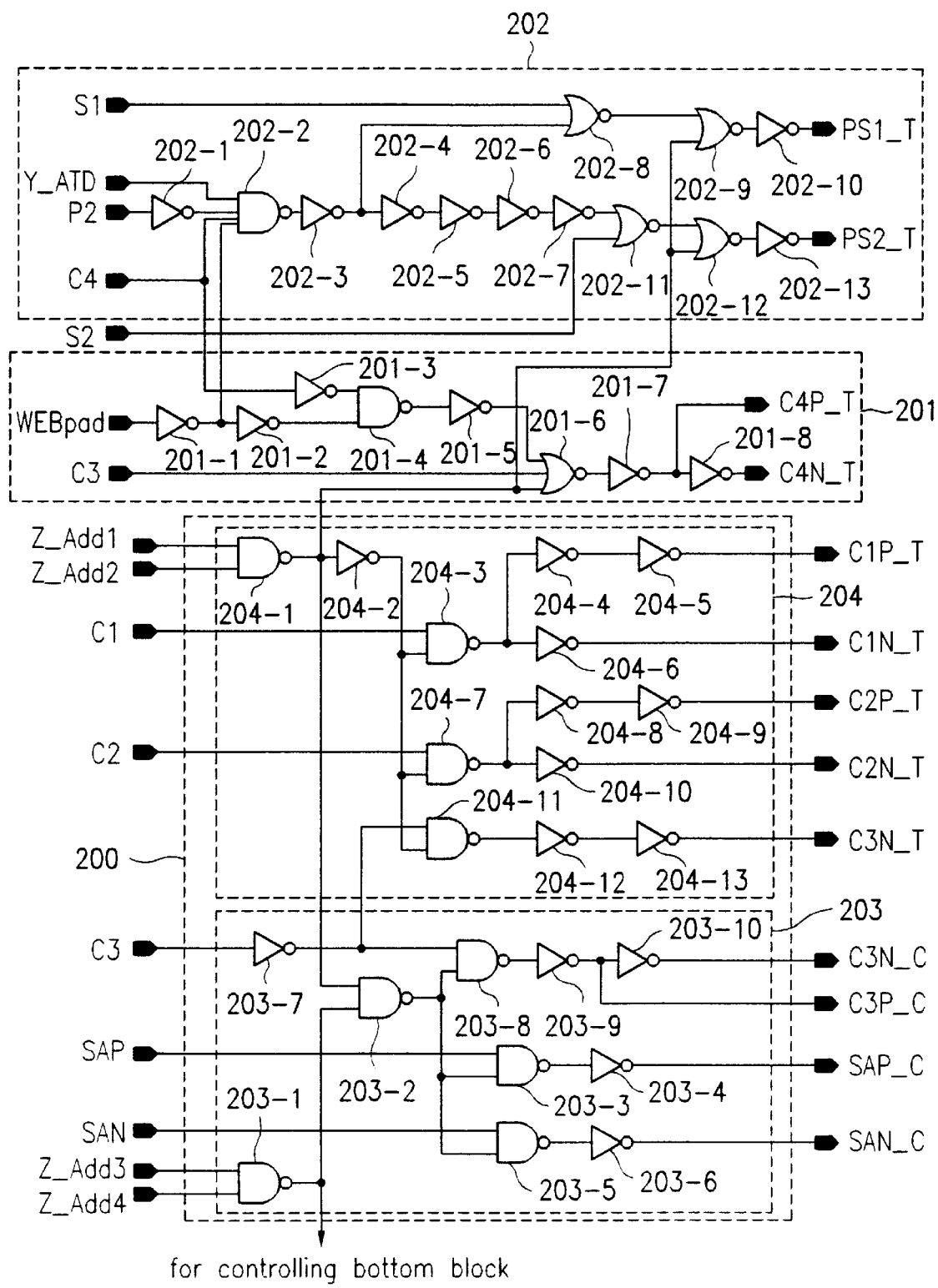
FIG. 20 shows a block diagram for the local control pulse generator according to the present invention.

FIG. 20 shows the block diagram for the local control pulse generator according to the present invention.

The signals S1, S2, P2, C1, C2, C3, C4, SAN and SAP which are the input signals of the local control pulse generator are the output signals of said global control pulse generator. The signal Y-ATD is an address transition detection signal generated at the time of Y address transition and is a high pulse. The signal WEBpad is a write enable signal and has a low state as its active state in the write mode. Z_Add1, Z_Add2, Z_Add3 and Z_Add4 are the signals generated from a Z address predecoder 14. The local control pulse gemerator shown in FIG. 20 shows, as an example, the case in which a signal to control the top block in FIG. 8 is generated. The drive control pulse for the bottom block is generated in the same way.

The local control pulse generator 20 includes a first control pulse generator 200 for generating an Input signal of a sense amplifier input and output controller 25, a second control pulse generator 201 for generating an input signal of a column controller 24, and a third control pulse generator 202 for generating an input signal of a SWL driver 22.

The first control pulse generator 200 includes a first logic operation unit 203 which receives the signals SAP, SAN, Z_Add3, Z_Add4 and the third control signal C3 and generates control pulses SAP_C, SAN_C, C3N_C and C3P_C to control the top block and the bottom block and a second logic operation unit 204 which receives the first and second control signals C1 and C2, Z_Add1 and Z_Add2 and generates control pulses C1P_T, C1N_T, C2P_T, C2N_T and C3N_T to control the top block.

The structure of the local control pulse generator is explained as follows in more detail.

The first control pulse generator 200 includes a first NAND gate 203-1 for performing a logic operation on the Z_Add3 and Z_Add4 and generating an output signal which is concerned with the generation of the control signal to be applied to the bottom block, a second NAND gate 203-2 for performing a logic operation on the output signal of the first NAND gate 203-1 and the output signal of the NAND operation of Z_Add1 and Z_Add2, a third NAND gate 203-3 for performing an operation on the input signal SAP and the output signal of said second NAND gate 203-2, a first inverter 203-4 for generating a signal SAP_C by inverting the output signal of the third NAND gate 203-3, a fourth NAND gate 203-5 for performing a logic operation on the input signal SAN and the output signal of said second NAND gate 203-2, a second inverter 203-6 for for generating a signal SAN_C by inverting the output signal of the fourth NAND gate 203-5, a fifth NAND gate 203-8 for performing a logic operation on a third control signal C3 inverted by a third inverter 203-7 and the output signal of the second NAND gate 203-2, a fourth inverter 203-9 for for generating a signal C3P_C by inverting the output signal of the fifth NAND gate 203-8, and a fifth inverter 203-10 for generating a signal C3N_C by inverting the output signal of the fourth inverter 203-9.

The second logic operation unit 204 of the first control pulse generator 200 includes a first NAND gate 204-1 for performing a logic operation on the Z_Add1 and Z_Add2 and generating an output signal which is concerned with the generation of the control signal to be applied to the top block, a first inverter 204-2 for inverting the output signal of the first NAND gate 204-1, a second NAND gate 204-3 for performing a NAND operation on the output signal of the first inverter 204-2 and a first control signal C1, second and third inverters 204-4 and 204-5 for strengthening the output signal of the second NAND gate 204-3 and generating a signal C1P_T, a fourth inverter 204-6 for inverting the output signal of the second NAND gate 204-3 and generating a signal C1N_T, third NAND gate 204-7 for performing a logic operation on the output signal of the first inverter 204-2 and the second control signal C2, fifth and sixth inverters 204-8 and 204-9 for strengthening the output signal of the third NAND gate 204-7 and generating a signal C2P_T, seventh inverter 204-10 for inverting the output signal of the third NAND gate 204-7 and generating a signal C2N_T, fourth NAND gate 204-11 for performing a logic operation on the output signal of the first inverter 204-2 and the inverted output signal of the third control signal C3, and ninth and tenth inverters 204-12 and 204-13 for strengthening the output signal of the fourth NAND gate 204-11 and generating a signal C3P_T.

The second control pulse generator 201 includes a first inverter 201-1 for inverting the signal WEBpad, a second inverter 201-2 for inverting the output signal of the first inverter 201-1, a third inverter 201-3 for inverting the fourth control signal C4, a NAND gate 201-4 for performing a logic operation on the output signals of the second and third inverters 201-2 and 201-3, a fourth inverter 201-5 for inverting the NAND gate 201-4, a NOR gate 201-6 for performing a logic operation on the third control signal C3, the output signal of the fourth inverter 201-5 and the output signal of the first NAND gate 204-1 of the second logic operation unit 204 in the first control pulse generator 200, a fifth inverter 201-7 for inverting the output signal of the NOR gate 201-6 and generating a signal C4P_T, and a sixth inverter 201-8 for inverting the output signal of the fifth inverter 201-7 and generating a signal C4N_T.

The third control pulse generator 202 includes a first inverter 202-1 for inverting the signal P2, a first NAND gate 202-2 for performing a logic operation on the signal Y-ATD, the output signal of the first inverter 202-1, the fourth control signal C4 and the inverted signal of the signal WEBpad, a second inverter 202-3 for inverting the output signal of the first NAND gate 202-2, a delay unit consisting of third, fourth, fifth and sixth inverters 202-4, 202-5, 202-6 and 202-7 for delaying the output signal of the second inverter 202-3, a first NOR gate 202-8 for performing a logic operation on the signal S1 and the output signal of the second inverter 202-3, a second NOR gate 202-9 for performing NOR operation on the output signal of the first NOR gate 202-8 and the output signal of the first NAND gate 204-1 of the second logic operation unit 204, a seventh inverter 202-10 for inverting the output signal of the second NOR gate 202-9 and generating a signal PS1_T, a third NOR gate 202-11 for performing the second control signal S2 and the output signal of the sixth inverter 202-7, a fourth NOR gate 202-12 for performing NOR operation on the output signal of the third NOR gate 202-11 and the output signal of the first NAND gate 204-1 of the second logic operation unit 204, and a eighth inverter 202-13 for inverting the output signal of the fourth NOR gate 202-12 and generating a signal PS2_T.

The local control pulse generator according to the present invention is a block to generate the control pulse by which the first logic operation unit 203 of the first control pulse generator 200 can be used for the top block and the bottom block in common, and the second and third control pulse generators 201 and 202 and the second logic operation unit 204 of the first control pulse generator 200 are the blocks to generate the control pulse for the top block.

The control pulse generation procedure of the local control pulse generator according to the present invention is explained as follows.

First, since the signal WEBpad is at a low state in the write mode, the output signal of the second inverter 202-2 of the second control pulse generator 201 is a low state. Therefore, the first NAND gate 201-4 goes inactive and the output signal of the gate is at a high state so that the NOR operation unit 201-6 becomes active.

When the NOR gate 201-6 is active, the third control signal C3 passes through the fifth inverter 201-7 and becomes the signal C4P_T. The signal C4P_T passed through the sixth inverter 201-8 and becomes the signal C4N_T. The third control signal C3 makes all the column selection signals disabled in the state before the splitted word lines SWL1 and SWL2 becomes active, that is, in the precharge interval for the memory cell bit lines and the reference cell bit line. The signal flow between the data bus and the bit line is cut off by the disabled column selection signal. Therefore, when precharging the bit line in the write mode, the collision between the date on the bit line and the data on the input and output bus can be avoided.

Furthermore, since the signal WEBpad is low and the output signal of first inverter 201-1 of the second control pulse generator 201 is in a high state in the write mode, the NAND gate 202-2 of the third control pulse generator 202 is active. Thus, the NAND gate 202-2 of the third control pulse generator 202 is contolled by the signals Y-ATD, P2 and P4. In other words, when the signal P2 is in a high state and the signals S1 and S2 are normally active, the NAND gate 202-2 of the third control pulse generator 202 becomes inactive and the signals S1 and S2 are sure to be in a normal operation.

When the normal operation of the signals S1 and S2 is completed, the signal P2 goes down to a low state and the output signal of the first inverter 202-1 of the third control pulse generator 202 is in a high state. As the result, the NAND gate 202-2 of the third control pulse generator 202 becomes active. In this state, the operation of the NAND gate 202-2 of the third control pulse generator 202 is determined according to the condition of the signal Y-ATD or the signal C4.

When the signal C4 goes up to a high state under the condition that the output signal of the first inverter 202-1 of the second control pulse generator 201 is in a high state, the NAND gate 202-2 of the third control pulse generator 202 goes active and the signal Y-ATD is transfered to the SWL driver block 70.

In other words, in the interval that Y address goes to a transition the signals S1 and S2 make the first and third NOR gates 202-8 and 202-11 of the third control pulse generator 202 active. Then, The signal Y-ATD passes NAND gate 202-3 and the second inverter 202-3 of the third control pulse generator 202 one after another and is transfered to the first NOR gate 202-8 of the first control pulse generator 202. At the same time, the third, fourth, fifth and sixth inverters 202-4, 202-5, 202-6 and 202-7 delay the output signal of the second inverter 202-3 and applies the delayed signal to the third NOR gate 202-11.

The signal Y-ATD which passes in order the first and second NOR gates 202-8 and 202-9 and the seventh inverter 202-10 becomes the signal PS1_T having a low state. The signal Y-ATD which passes in order the third and fourth NOR gates 202-11 and 202-12 and the eighth inverter 202-13 becomes the signal PS2_T having a low state. Therefore, the signals PS1_T and PS2_T have an inverted polarity against the signal T-ATD. By adjusting the number of the inverters which are used to delay the output signal of the second inverter 202-3 of the third control pulse generator 202, for example, four inverter 202-4, 202-5, 202-6 and 202-7 are used in this exemplary, the overlap time between the two signals PS1 and PS2_T is adjusted.

In the read mode, the NAND gate 201-4 of the second control pulse generator 201 goes active. Then, the signal C4 passes in order the third inverter 201-3, NAND gate 201-4, fourth inverter 201-5, NOR gate 201-6 and the fifth inverter 201-7 and becomes a signal C4P_T. The sixth inverter 201-8 generates a signal C4N_T by inverting the output signal of the fifth inverter 201-7. The signals C4N_T and C4P_T are used for transfering the signal amplfied by the sense amplifier to a data bus.

In this read mode, the output signal of the first inverter 202-1 of the second control pulse generator 201 goes down to a low state and the NAND gate 202-2 of the third control pulse generator 202 goes inactive. Then, the signals Y-ATD, P2 and C4 are cut off from their transmission. When the output signal of the second inverter 202-3 of the third control pulse generator 202 goes down to a low state, the first NOR gate 202-8 of the third control pulse generator 202 goes active. According to this control pulse generation operation, the signals PS1_T and PS2_T to be used as the input signals of the SWL driver block 70 have the inverse polarity against the signals S1 and S2.

The explanation for the sense amplifier and its input and output control circuit is as follows.

Figure 21:
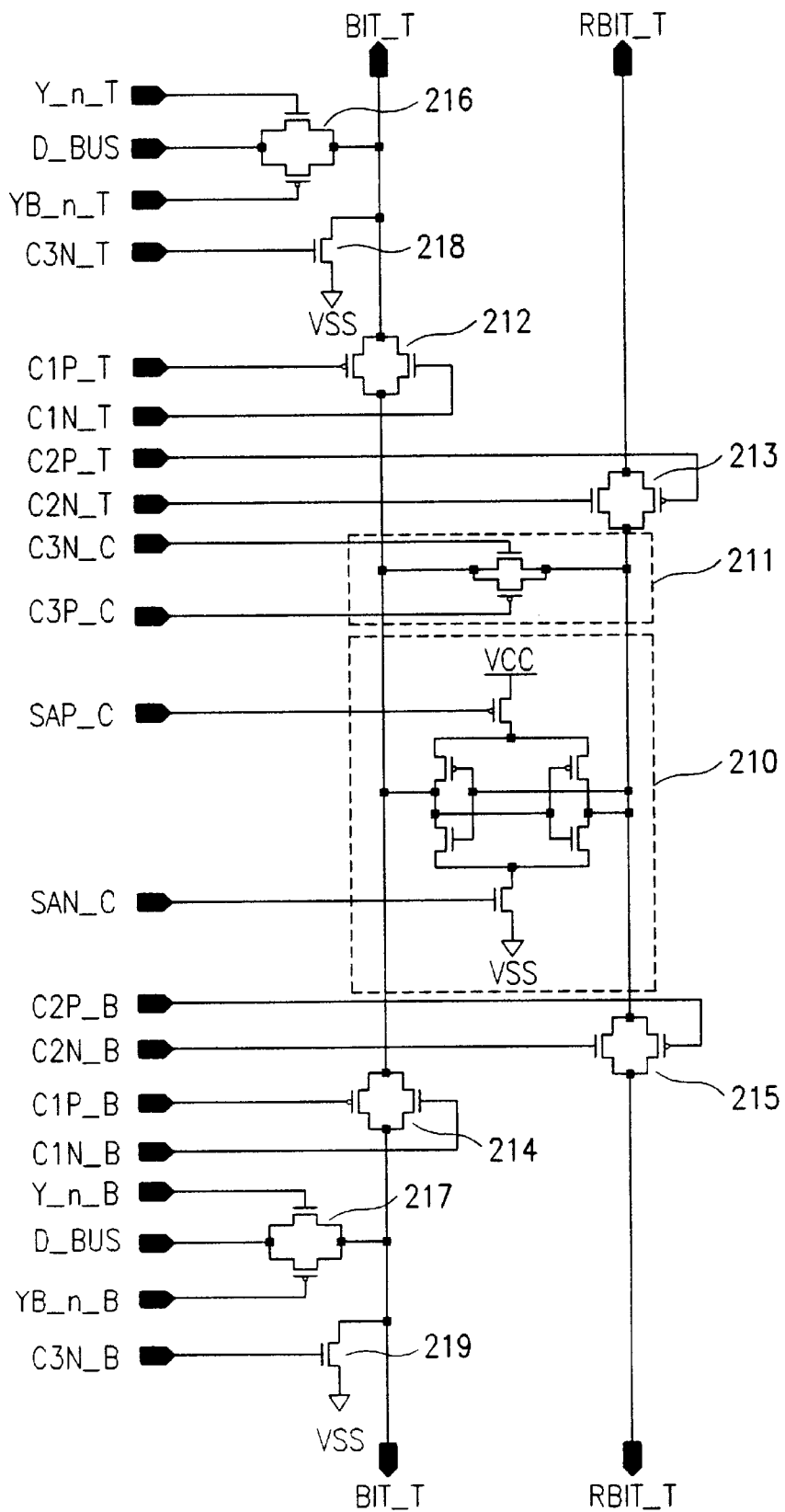
FIG. 21 is a circuit for the sense amplifier and its input and output control according to the first embodiment of the present invention.
Figure 22:
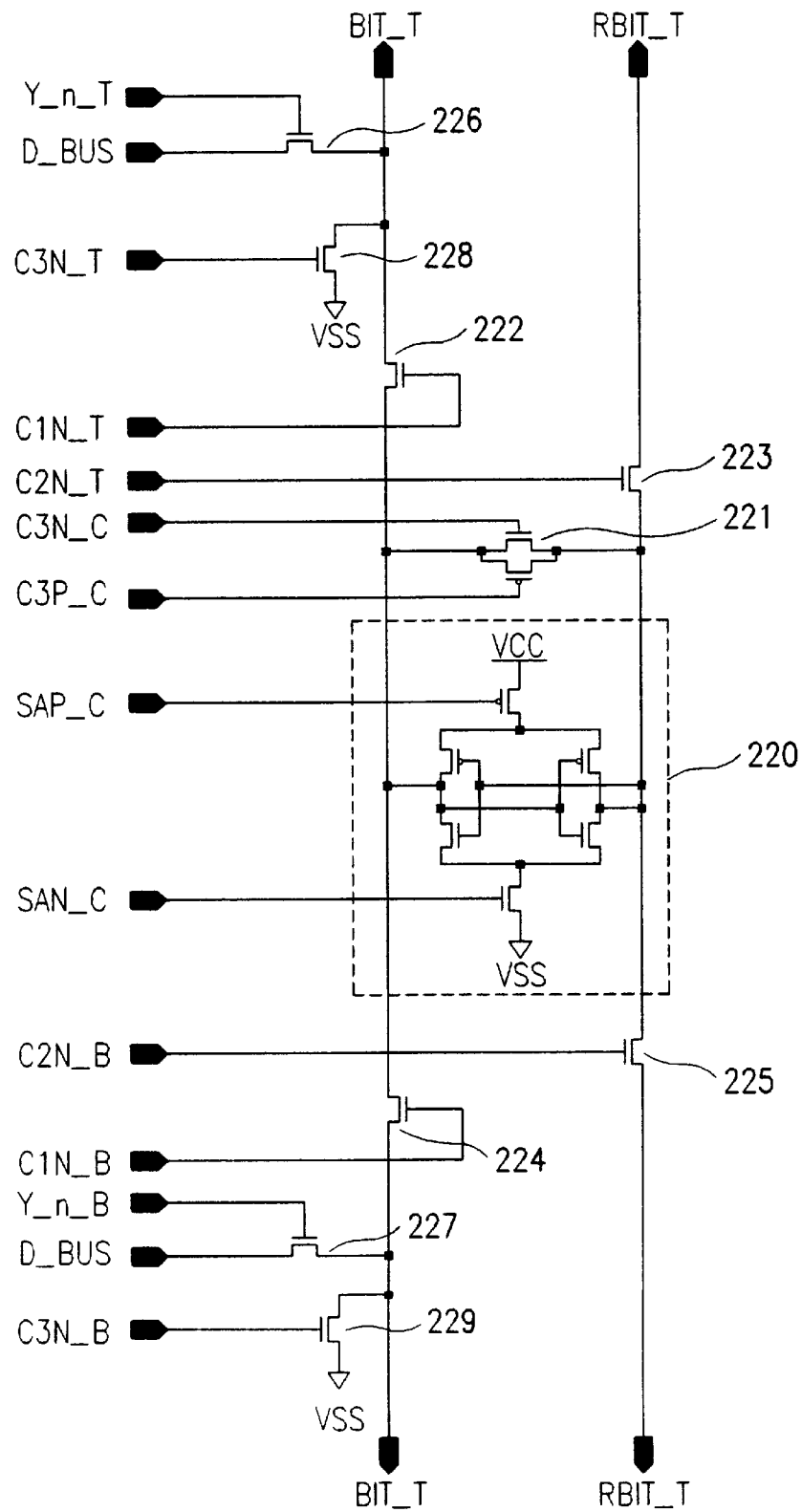
FIG. 22 is a circuit for the sense amplifier and its input and output control according to the second embodiment of the present invention.

FIG. 21 is the circuit for the sense amplifier and its input and output control according to the first embodiment of the present invention and FIG. 22 is a the circuit for the sense amplifier and its input and output control according to the second embodiment of the present invention.

The structure of the circuit for the sense amplifier and its input and output control in FIG. 21 is as follows.

As shown in FIG. 7, since the core block 72 of the SWL ferroelectric memory of the present invention is commonly held by the top block 71 and the bottom block 72, bit line BIT_T connected to the top main memory cell, bit line RBIT_T connected to the top reference cell, bit line BIT_B connected to the bottom main memory cell and bit line RBIT_B connected to the bottom reference cell are connected with each other, centering around the sense amplifier block 210.

The structure includes a sensing amplifier 210 which is connected with the bit lines BIT_T, RBIT_T, BIT_B and RBIT_B and is sensing and amplifying the data from the lines corresponding to the sense amplifier enable signals SAP_C and SAN_C that are generated from the local control pulse generator, an equalizer 211 for equalizing the potentials of the bit lines BIT_T and RBIT_T or the bit lines BIT_B and RBIT_B according to the equalization signals C3N_C and C3P_C, first and second transmission gates 212 and 213 for selectively connecting the input and output lines of the said sense amplifier 210 with the bit lines BIT_T and RBIT_T which are connected with the top main memory and reference cells according to the top cell array connection signals C1P_T, C1N_T, C2P_T and C2N_T, third and fourth transmission gates 214 and 215 for selectively connecting the input and output lines of the said sense amplifier 210 with the bit lines BIT__B and RBIT__B which are connected with the bottom main memory and reference cells according to the bottom cell array connection signals C1P__B, C1N__B, C2P__B and C2N__B, fifth transmission gate 216 which is connected with the bit line BIT__T between the first transmission gate 212 and the top memory cell and controls the connection to the data bus D__BUS according to the column selection signals Y__n__T and YB__n__T, sixth transmission gate 217 which is connected with the bit line BIT__B between the third transmission gate 214 and the bottom memory cell and controls the connection to the data bus D__BUS according to the column selection signals Y__n__B and YB__n__B, first bit line level controller 218 whose one electrode is connected with the bit line BIT__T between said first transmission gate 212 and said fifth transmission gate 216 and the other electrode is connected with the power supply terminal and whose gate is provided with the pull down control signal C3N__7 so as to control the level of the bit line BIT__T, and second bit line level controller 219 whose one electrode is connected with the bit line BIT__B between said third transmission gate 214 and the bottom memory cell array block and the other electrode is connected with the power supply terminal and whose gate is provided with the pull down control signal C3N__B so as to control the level of the bit line BIT__B.

The data bus D__BUS is commonly used for the operations of both write and read modes. In other words, the data bus D__BUS is used as an output transmission line of the sense amplifier in the read mode and as a transmission line for the data to be written to the memory cell in the write mode.

The control signals applied to the data input and output control circuit and the sense amplifier and the structure of their block are explained as follows.

The signal SAN__C is applied to the gate of an NMOS transistor whose one electrode is connected with the sense amplifier and the other electrode is connected with ground terminal VSS. The high state of the signal SAN__C makes the sense amplifier 210 active and its low state makes the sense amplifier 210 inactive.

The signal SAP__C is applied to the gate of a PMOS transistor whose one electrode is connected with the sense amplifier and the other electrode is connected with ground terminal VCC. The low state of the signal SAP__C makes the sense amplifier 210 active and its high state makes the sense amplifier 210 inactive. The equalization signals C3N__C and C3P__C applied to the qualizer 211 equalizes the potentials of the bit lines BIT__T, RBIT__T, BIT__B and RBIT__B of the main and reference cells and the potential of the sense amplifier 210 before the splitted word lines SWL1 and SWL2 are active.

The pull down control signal C3N__T performs the pull down operation by turn on the first bit line level controller 218 when the top main cell column and the reference cell column are selected and makes the bit lines BIT__T and RBIT__T which are connected with the top main memory and reference cells in a low level.

The pull down control signal C3N__B performs the pull down operation by turn on the second bit line level controller 219 when the bottom main cell column and the reference cell column are selected and makes the bit lines BIT__B and RBIT__B which are connected with the bottom main memory and reference cells in a low level.

The circuit in FIG. 22 is the exemplary for the sense amplifier and its input and output control according to the second embodiment of the present invention and each NMOS transistor of switching block of this circuit is controlled by its control pulse.

The circuit according to the second embodiment of the present invention includes a sensing amplifier 220 which is connected with the bit lines BIT__T, RBIT__T, BIT__B and RBIT__B and is sensing and amplifying the data from the lines corresponding to the sense amplifier enable signals SAP__C and SAN__C that are generated from the local control pulse generator, an equalizer 221 for equalizing the potentials of the bit lines BIT__T and RBIT__T or the bit lines BIT__B and RBIT__B according to the equalization signals C3N__C and C3P__C, first and second NMOS transistors 222 and 223 for selectively connecting the input and output lines of the said sense amplifier 220 with the bit lines BIT__T and RBIT__T which are connected with the top main memory and reference cells according to the top cell array connection signals C1N__T and C2N__T which are generated from the local control pulse generator, third and fourth NMOS transistors 224 and 225 for selectively connecting the input and output lines of the said sense amplifier 220 with the bit lines BIT__B and RBIT__B which are connected with the bottom main memory and reference cells according to the bottom cell array connection signals C1N__B and C2N__B, fifth NMOS transistor 226 which is connected with the bit line BIT__T between the first NMOS transistor 222 and the top memory cell and controls the connection to the data bus D__BUS according to the column selection signal Y__n__T, sixth NMOS transistor 227 which is connected with the bit line BIT__B between the third NMOS transistor 224 and the bottom memory cell and controls the connection to the data bus D__BUS according to the column selection signals Y__n__B, first bit line level controller 228 whose one electrode is connected with the bit line BIT__T between said first NMOS transistor 222 and said fifth NMOS transistor 226 and whose gate is provided with the pull down control signal C3N__T so as to control the level of the bit line BIT__T, and second bit line level controller 229 whose one electrode is connected with the bit line BIT__B between said third NMOS transistor 224 and the bottom memory cell array block and whose gate is provided with the pull down control signal C3N__B so as to control the level of the bit line BIT__B.

The structure of the column controller of the SWL ferroelectric memory device according to the present invention explained as follows.

Figure 23:
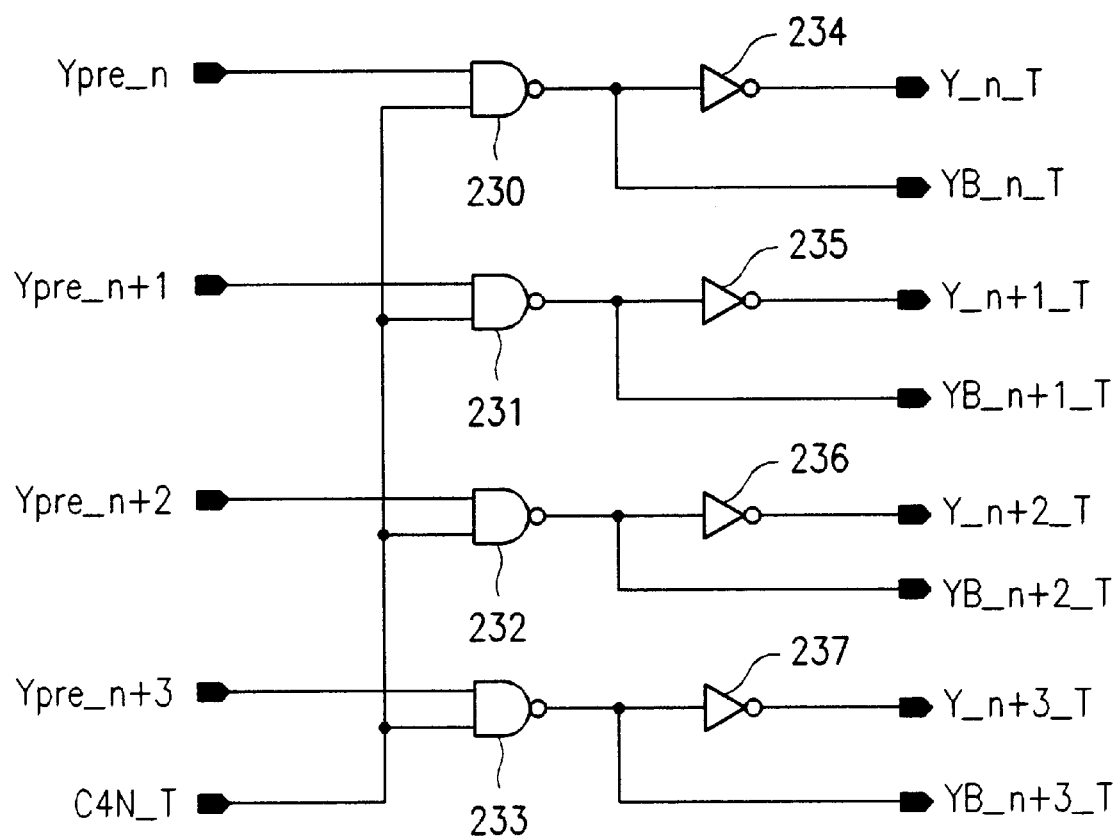
FIG. 23 is the structure of the column controller circuit according to the present invention.

FIG. 23 is the structure of the column controller circuit according to the present invention.

FIG. 23 is an exemplary for the block controlling the top memory cell array. This column controller block receives the address signals from the Y predecoder and the control signals from the local control pulse generator and genetates the column selection signal for selecting a cell when performing the data input and output operations.

The column controller includes a plurality of NAND gates 230, 231, 232, and 223 for performing the logic operations on the signal C4N__T from the local control pulse generator and each of the addresses Ypre__n, Ypre__n+1, Ypre__n+2, Ypre__n+3 . . . predecoded by the Y predecoder 18 and a plurality of inverters 234, 235, 236 and 237 which are connected to the output terminals of said NAND gates, respectively.

The output signals of the NAND gates 230, 231, 232, and 223 which pass through the inverters 234, 235, 236 and 237 construct the Y addresses Y__n__T, Y__n+1__T, Y__n+2__T, Y__n+3__T . . . .

The output signals of the NAND gates which do not pass the inverter construct the reference /Y addresses YB__n__T, YB__n+1__T, YB__n+2__T, YB__n+3__T . . . . When the column controller is active, one of the Y addresses Y__n__T, Y__n+1__T, Y__n+2__T, Y__n+3__T . . . is active at a high state and one of the /Y addresses YB__n__T, YB__n+1__T, YB__n+2__T, YB__n+3__T . . . goes down to a low state. These active signals controls activation or inactivation of the switching block which consists of transmission gates or transistors connected to the data bus in said sense amplifier and its input and output circuit.

The reference bit line level controller 76 of the present invention is explained as follows.

Figure 24:
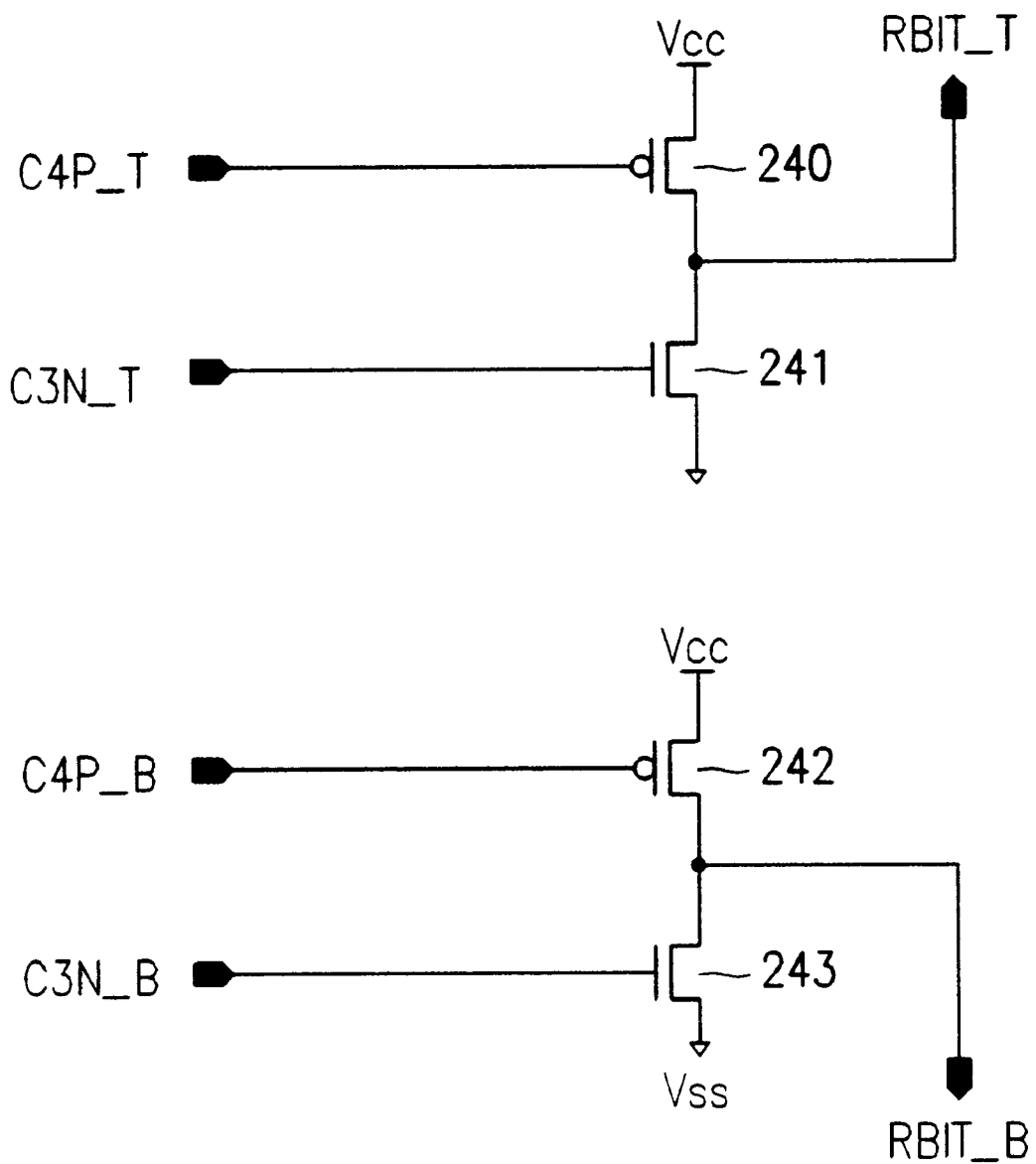
FIG. 24 is the structure of the reference bit line level control circuit according to the first embodiment of the present invention.
Figure 25:
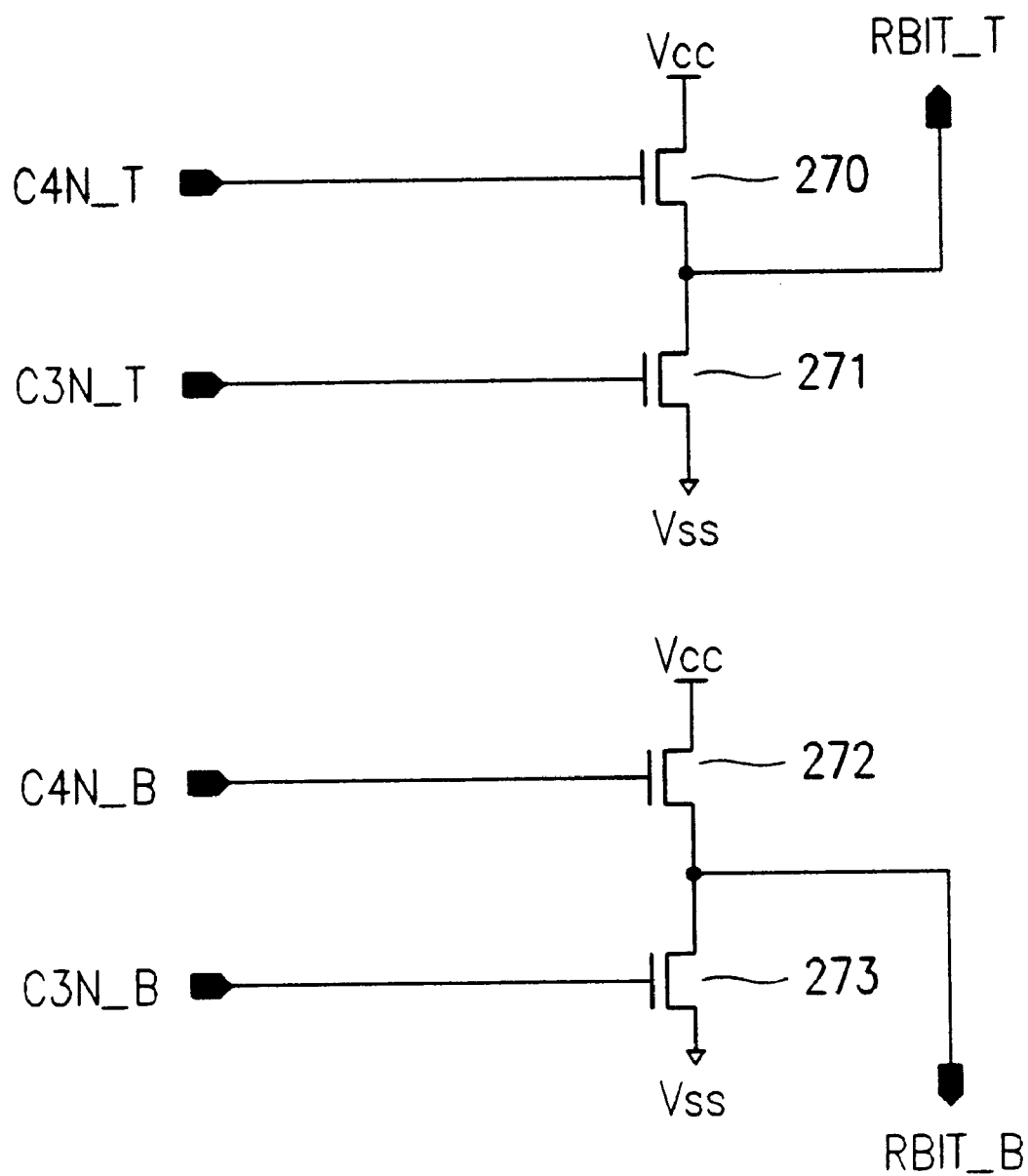
FIG. 25 is the structure of the reference bit line level control circuit according to the second embodiment of the present invention.

FIG. 24 is the structure of the reference bit line level controller according to the first embodiment of the present invention and FIG. 25 is the structure of the reference bit line level control circuit according to the second embodiment of the present invention.

The reference bit line level controller 76 of FIG. 24 is the circuit for performing the pull up of the reference cell column. The top reference bit line level control circuit consists of a first PMOS transistor 240 whose gate is provided with the reference bit line level control signal C4P__T from the local control pulse generator, whose source electrode is connected to VCC and whose drain electrode is connected to the reference bit line RBIT__T and a first NMOS transistor 241 whose drain electrode is connected to the reference bit line RBIT__T, whose source electrode is connected to VSS and whose gate is provided with the reference bit line level control signal C3N__T, and generates the pull up or pull down signal to control the level of the reference bit line RBIT__T connected to the top reference cell.

The bottom reference bit line level control circuit consists of a second PMOS transistor 242 whose gate is provided with the reference bit line level control signal C4P__B from the local control pulse generator, whose source electrode is connected to VCC and whose drain electrode is connected to the reference bit line RBIT__T and a second NMOS transistor 243 whose drain electrode is connected to the reference bit line RBIT__T, whose source electrode is connected to VSS and whose gate is provided with the reference bit line level control signal C3N__B, and generates the pull up or pull down signal to control the level of the reference bit line RBIT__B connected to the bottom reference cell.

In this reference bit line level control circuit, when the signal C4P__T makes the first PMOS transistor 240 active the pull up operation that the reference bit line RBIT__T goes to a high voltage is achieved. Thus, when the reference bit line is pulled up to a high voltage, a data of a high state is dtored in the top reference cell. When the second PMOS transistor 242 is activated by the signal C4P__T, the reference bit line RBIT__B is pulled up to a high voltage. Thus, when the reference bit line is pulled up to a high voltage, a data of a high state is stored in the bottom reference cell. When the first NMOS transistor 241 is activated by the signal C3N__T of a high state, the reference bit line RBIT__T is pulled down to a low voltage. When the second NMOS transistor 243 is activated by the signal C3N__B of a high state, the reference bit line RBIT__T is pulled down to a low voltage.

FIG. 25 as a second embodiment for the reference bit line level control circuit of the present invention is constructed as follows.

The top reference bit line level control circuit consists of a first NMOS transistor 270 whose gate is provided with the reference bit line level control signal C4N__T from the local control pulse generator, whose source electrode is connected to VCC and whose drain electrode is connected to the reference bit line RBIT__B and a second NMOS transistor 271 whose drain electrode is connected to the reference bit line RBIT__T, whose source electrode is connected to VSS and whose gate is provided with the reference bit line level control signal C3N__T, and generates the pull up or pull down signal to control the level of the reference bit line RBIT__B connected to the top reference cell.

The bottom reference bit line level control circuit consists of a third NMOS transistor 272 whose gate is provided with the reference bit line level control signal C4N__B from the local control pulse generator, whose source electrode is connected to VCC and whose drain electrode is connected to the reference bit line RBIT__B and a fourth NMOS transistor 273 whose drain electrode is connected to the reference bit line RBIT__T, whose source electrode is connected to VSS and whose gate is provided with the reference bit line level control signal C3N__B, and generates the pull up or pull down signal to control the level of the reference bit line RBIT__B connected to the bottom reference cell.

The structure of the sense amplifier and input and output control circuit according to the third and fourth embodiments of the present invention.

Figure 26:
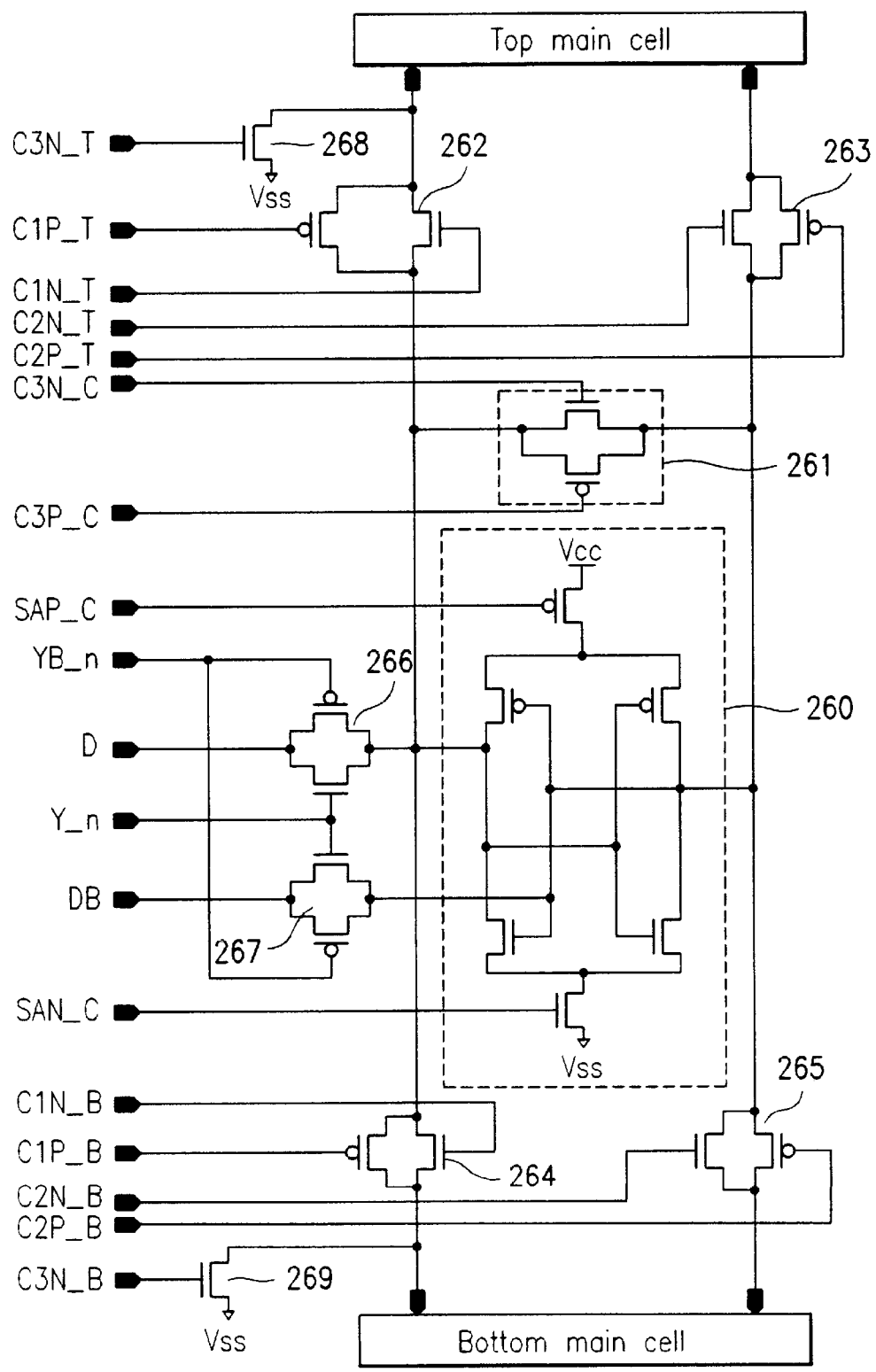
FIG. 26 is a circuit for the sense amplifier and its input and output control according to the third embodiment of the present invention.
Figure 27:
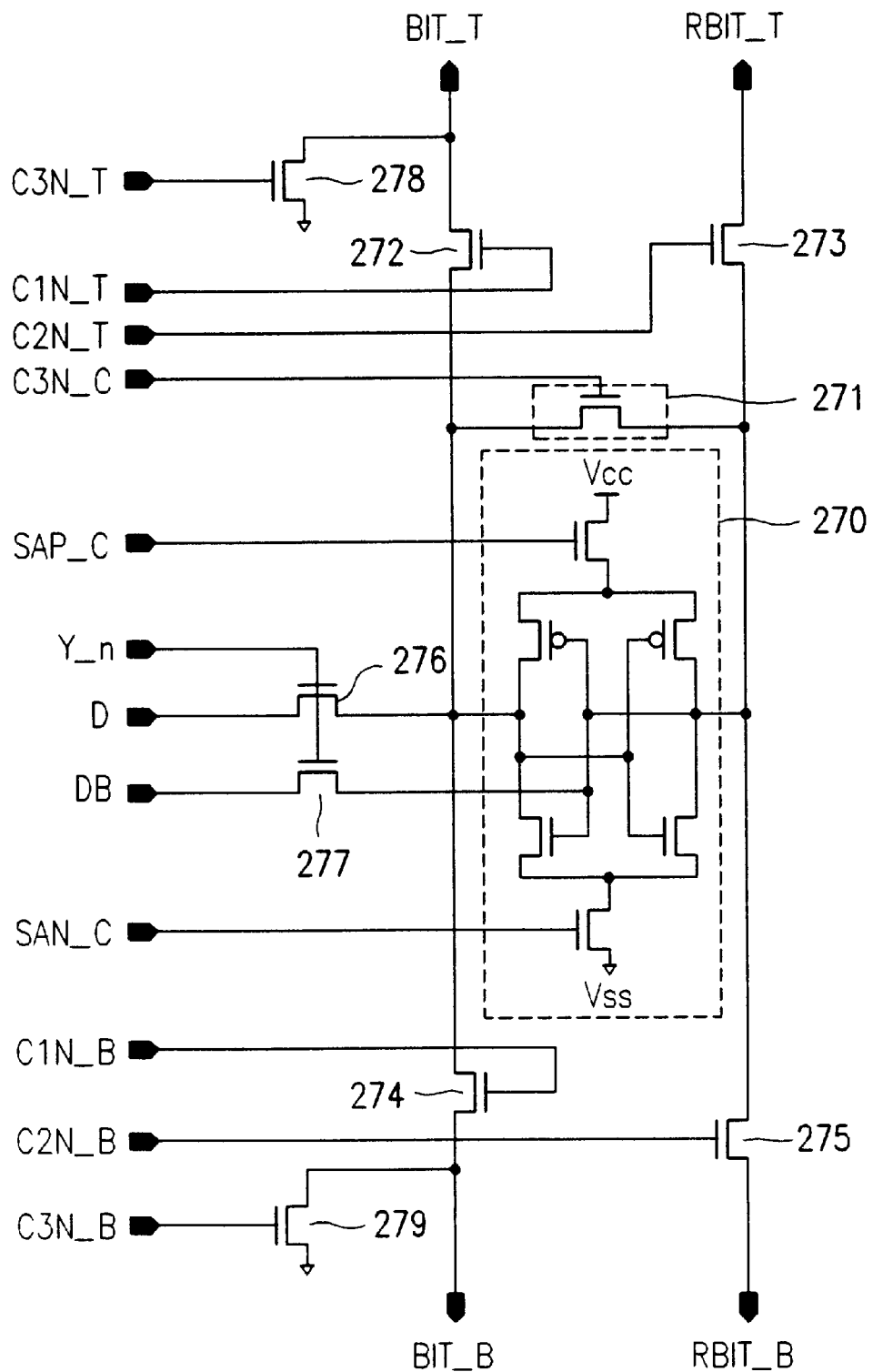
FIG. 27 is a circuit for the sense amplifier and its input and output control according to the fourth embodiment of the present invention.

FIG. 26 is the structure of the reference bit line level controller according to the third embodiment of the present invention and FIG. 25 is the structure of the reference bit line level control circuit according to the fourth embodiment of the present invention.

First, the structure of the reference bit line level controller according to the third embodiment of the present invention is as follows.

The structure includes a sensing amplifier 260 which is connected with the bit lines BIT__T, RBIT__T, BIT__B and RBIT__B and is sensing and amplifying the data from the lines corresponding to the sense amplifier enable signals SAP__C and SAN__C that are generated from the local control pulse generator, an equalizer 261 for equalizing the potentials of the bit lines BIT__T and RBIT__T or the bit lines BIT__B and RBIT__B according to the equalization signals C3N__C and C3P__C, first and second transmission gates 262 and 263 for selectively connecting the input and output lines of the said sense amplifier 260 with the bit lines BIT__T and RBIT__T which are connected with the top main memory and reference cells according to the top cell array connection signals C1P__T, C1N__T, C2P__T and C2N__T, third and fourth transmission gates 264 and 265 for selectively connecting the input and output lines of the said sense amplifier 260 with the bit lines BIT__B and RBIT__B which are connected with the bottom main memory and reference cells according to the bottom cell array connection signals C1P__B, C1N__B, C2P__B and C2N__B, fifth transmission gate 266 which is connected with the input and output lines of the said sense amplifier 260 and controls the connection to the data bus D according to the column selection signals Y__n and YB__n, sixth transmission gate 267 which is connected with the input and output lines of the said sense amplifier 260 and controls the connection to the /data bus DB according to the column selection signals Y__n and YB__n, first bit line level controller 268 which is connected between said first transmission gate 262 and the bit line BIT__T of the top memory cell and controls the level of the bit line BIT__T according to the pull up or pull down cintrol signal C3N__T which is applied to its gate, and second bit line level controller 269 whose one electrode is connected with the bit line BIT__B between said third transmission gate 264 and the bottom memory cell array block and whose gate is provided with the pull down control signal C3N__B so as to control the level of the bit line BIT__B.

The signal SAN__C is applied to the gate of an NMOS transistor whose one electrode is connected with the sense amplifier and the other electrode is connected with ground terminal VSS. The high state of the signal SAN__C makes the sense amplifier 260 active and its low state makes the sense amplifier 260 inactive.

The signal SAP__C is applied to the gate of a PMOS transistor whose one electrode is connected with the sense amplifier and the other electrode is connected with ground terminal VCC. The low state of the signal SAP__C makes the sense amplifier 260 active and its high state makes the sense amplifier 260 inactive.

The equalization signals C3N__C and C3P__C applied to the qualizer 261 equalizes the potentials of the bit lines BIT__T, RBIT__T, BIT__B and RBIT__B of the main and reference cells and the potential of the sense amplifier 260 before the splitted word lines SWL1 and SWL2 are acitve.

The pull down control signal C3N__T performs the pull down operation by turning on the first bit line level controller 268 when the top main cell column and the reference cell column are selected and makes the bit lines BIT__T and RBIT__T which are connected with the top main memory and reference cells in a low level.

The pull down control signal C3N__B performs the pull down operation by turning on the second bit line level controller 269 when the bottom main cell column and the reference cell column are selected and makes the bit lines BIT__B and RBIT__B which are connected with the top main memory and reference cells in a low level.

The structure of the reference bit line level controller according to the fourth embodiment of the present invention is as follows The structure includes a sensing amplifier 270 which is connected with the bit lines BIT__T, RBIT__T, BIT__B and RBIT__B and is sensing and amplifying the data from the lines corresponding to the sense amplifier enable signals SAP__C and SAN__C that are generated from the local control pulse generator, an equalizer 271 for equalizing the potentials of the bit lines BIT__T and RBIT__T or the bit lines BIT__B and RBIT__B according to the equalization signals C3N__C and C3P__C, first and second NMOS transistors 272 and 273 for selectively connecting the input and output lines of the said sense amplifier 270 with the bit lines BIT__T and RBIT__T which are connected with the top main memory and reference cells according to the top cell array connection signals C1N__T and C2N__T which are generated from the local control pulse gnerator, third and fourth NMOS transistors 274 and 275 for selectively connecting the input and output lines of the said sense amplifier 270 with the bit lines BIT__B and RBIT__B which are connected with the bottom main memory and reference cells according to the bottom cell array connection signals C1N__B and C2N__B, fifth NMOS transistor 276 which is connected with the input and output line of the sense amplifier 270 and controls the connection to the data bus D according to the column selection signal Y__n, sixth NMOS transistor 277 which is connected with the input and output line of the sense amplifier 270 and controls the connection to the /data bus DB according to the column selection signal Y__n, first bit line level controller 278 whose one electrode is connected with the bit line BIT__T between said first NMOS transistor 272 and the memory cell block and whose gate is provided with the pull down control signal C3N__T so as to control the level of the bit line BIT__T, and second bit line level controller 279 whose one electrode is connected with the bit line BIT__B between said third NMOS transistor 274 and the bottom memory cell array block and whose gate is provided with the pull down control signal C3N__B so as to control the level of the bit line BIT__B.

The data input and output operation of the SWL ferroelectric memory device of the present invention having the drive control circuit described above is explained as follows.

Figure 28:
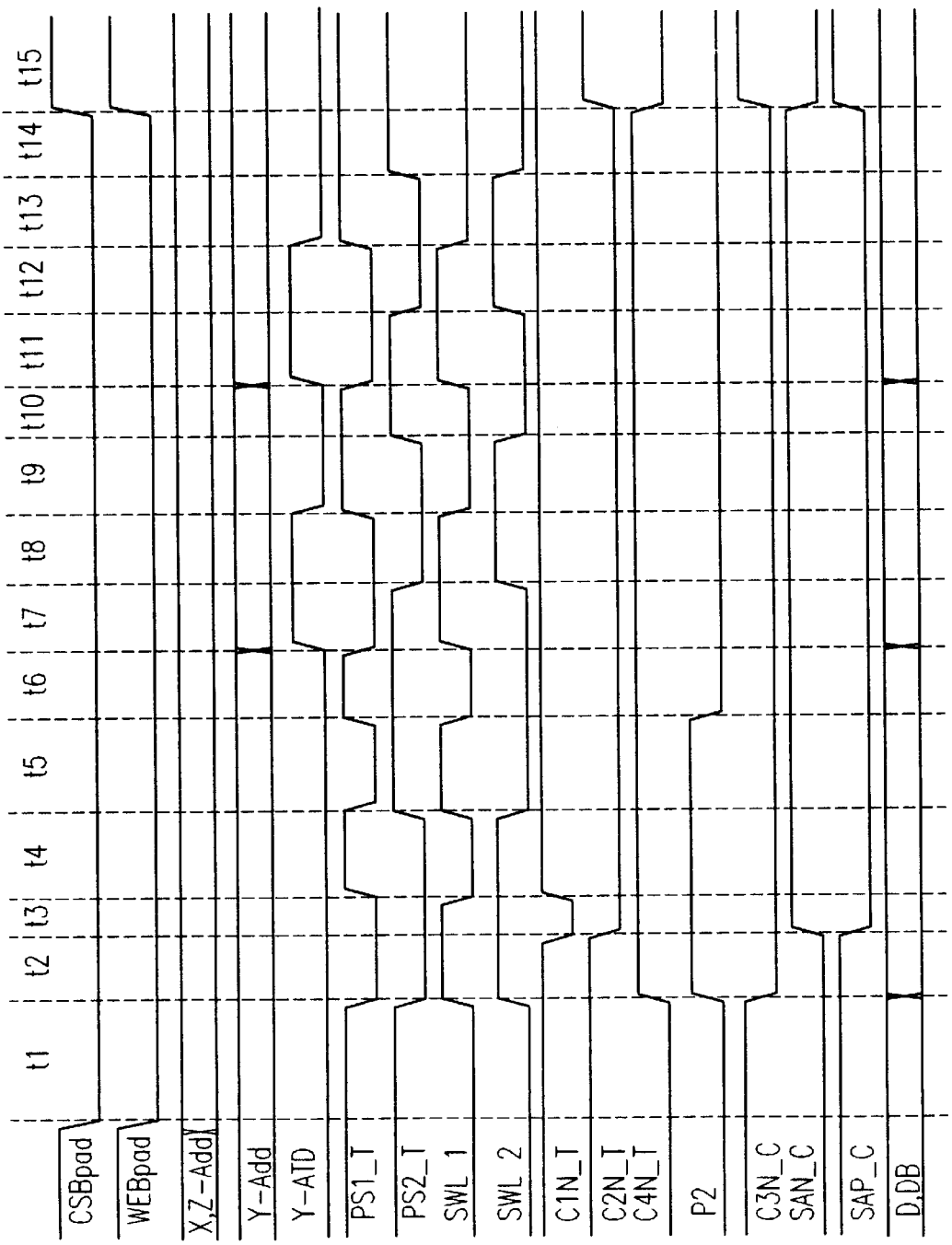
FIG. 28 shows the waveforms for the operation of the local control pulse generator in the write mode when Y address is changed.

FIG. 28 shows the waveforms for the operation of the local control pulse generator in the write mode when Y address is changed.

In the SWL ferroelectric memory, since the core block including the sense amplifier and its input and output control circuit is commonly held by the top and bottom memory cells neighbored with each other, the drive control of the top memory cell block is explained.

First, the period of the waveform of FIG. 28 from the time that the chip enable signal CSBpad is enabled to its low state to the time that the chip enable signal CSBpad is again disabled to its high state is divided into 15 intervals from t1 to t15.

In the interval t1, the signal CSBpad is enabled in its low state and the signal WEBpad is enabled in its low state. At this time, X, Y, Z addresses hold their previous states and the signals PS1__T, PS2__T, C1N__T, C2N__T, C4N__T, C3N__C, SAP__C and SAN__C from the local control pulse generator also hold their states before the interval t1.

After then, the signal PS1__T is in a high state for t1, a low state for t2 and t3, in a high state for t4, in a low state for t5, in a high state for t6, in a low state for t7 and t8, in a high state for t9 and t10, in a low state for t11 and t12, and in a high state after the starting point of t13.

The signal PS2__T is in a high state for t1, in a low state for t2, t3 and t4, in a high state for t5, t6 and t7, in a low state for t8 and t9, in a high state for t10 and t11, in a low state for t12 and t13, and in a high state after the starting point of the interval t14.

The signals SWL1 and SWL2 are low for the interval t1 and goes up to a high state after the starting point of the interval t2. Here, the signal SWL1 has the opposite polarity against the signal PS1__T but the same transition time as the signal PS1__T. The signal SWL2 has the opposite polarity against the signal PS2__T but the same transition time as the signal PS2__T.

The waveforms of the signals C1N__T and C2N__T electrically connecting the input and output lines of the sense amplifier and the bit lines of the memory cell and reference cell blocks is explained as follows.

The signal C1N__T keeps a high state in all the intervals except the interval t3 which is a part of the intervals chat the signals SWL1 and SWL2 are in a high state before Y-Add is toggled.

The signal C2N__T goes down to a low state at the starting point of the interval t2 that the signal C1N__T goes down to a low state, holds the low state and then goes up to a high state at the instant that the signal CSBpad goes up to a high state.

The signal C4N__T goes up to a high state at the starting point of the interval t2 that the signals SWL1 and SWL2 goes up to a high state and goes deon to a low state when the signal CSBpad is disabled.

The signal P2 holds a high state from the intervals t2 that the signals SWL1 and SWL2 go up to a high state to the interval t5 and isin a low state except those intervals.

The signal C3N__T holds its previous high state until the end of the interval t1, goes down to a low state at the starting point of the intervals t2 that the signals SWL1 and SWL2 go up to a high state, and then goes up to a high state when the signal CSBpad is disabled. Therefore, the signal C3N_T has the opposite polarity against the signal C4N_T.

The signal SAN_C goes up to a high state at the beginning of the intervals t2 that the signals SWL1 and SWL2 go up to a high state and holds the high state by the time that the signal CSBpad is disabled.

The signals SAP_C and SAN_C have the opposite polarity with each other but they transit at the same time.

In the SWL ferroelectric memory device of the present invention having the waveforms described above, when the signal Y-ATD is generated by Y address change and it is in the write mode, the signals PS1_T and PS2_T are generated from the local control pulse generator and the signals SWL1 and SWL2 are generated from the SWL driver block 70.

In the intervals t2, t3, t8 and t12 in which the signals SWL1 and SWL2 are in a high state, a logic value 0 is written into the SWL memory cell. In the intervals t4, t5, t7, t11 and t13 in which one of the signals SWL1 and SWL2 is in a high state, a logic value 1 is written into the SWL memory cell.

The operation of the nonvolatile ferroelectric memory device of the present invention in the read mode is explained as follows.

Figure 29:
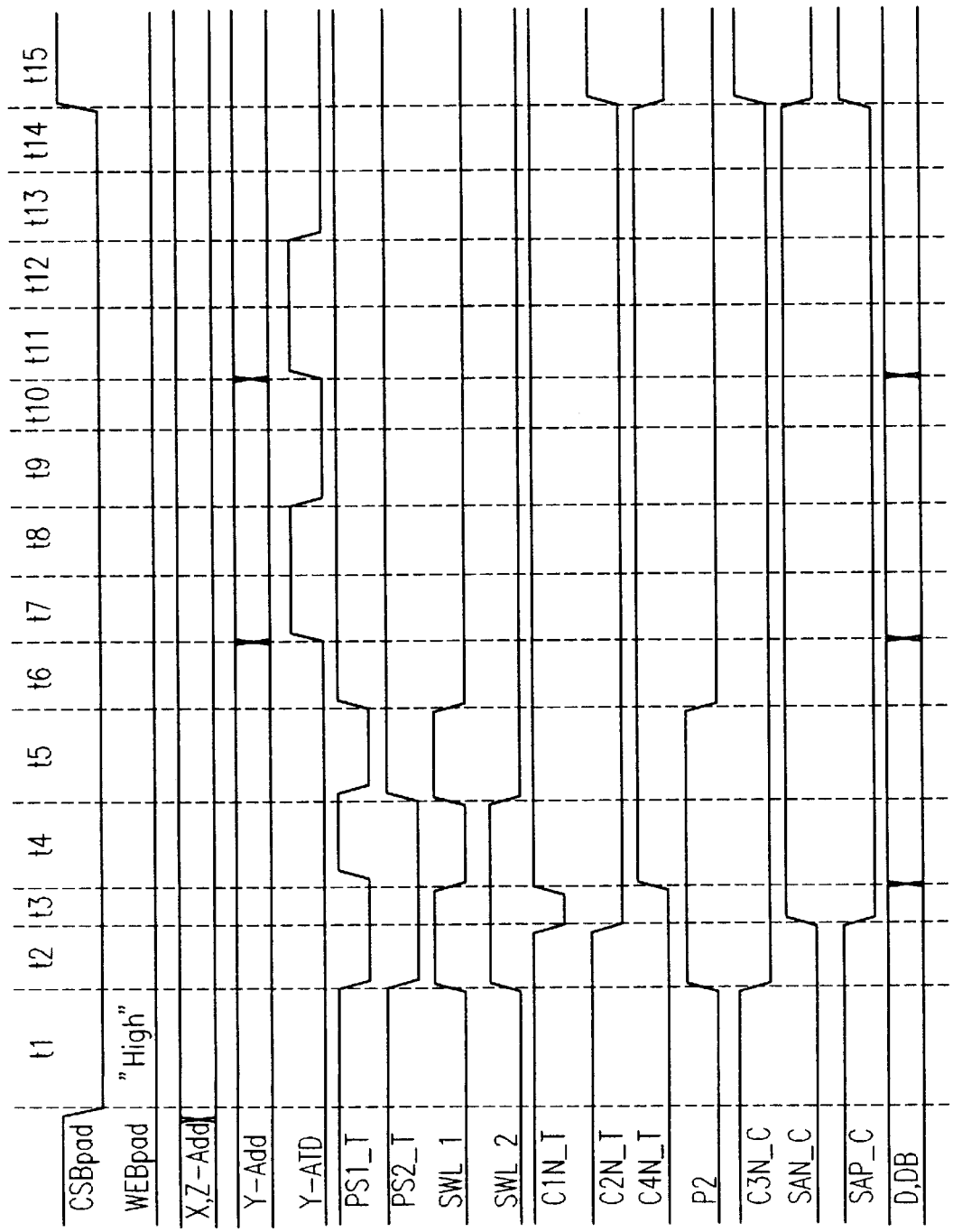
FIG. 29 shows the waveforms for the operation of the local control pulse generator in the read mode when Y address is changed.

FIG. 29 shows the waveforms for the operation of the local control pulse generator in the read mode when Y address is changed.

The signal WEDpad is disabled in a high state in the read mode. Furthermore, the signal Y-ATD goes high only when Y address is changed in the same manner as the write mode. In other words, when Y address gets a transition at the beginning of the interval t7, the Y address holds the high state for the two intervals of t7 and t8, and when Y address gets a transition at the beginning of the interval t11, Y-ATD again holds its high state for the intervals from t11 to t13. Except those intervals, Y-ATD holds a low state.

The signal PS1_T holds a low state for the intervals t2, t3 and t5, and holds high except those intervals. The signal PS2_T holds a low state for the intervals t2, t3 and t4, and holds high except those intervals.

The signal SWL1 and said signal PS1_T are take a trasition in their state at the same time but their polarities are different from each other. The signal SWL2 and said signal PS2_T change their states at the same time but their polarities are different from each other.

The waveforms of the signals C1N_T and C2N_T which electrically connect between the input and output lines of the sense amplifier, the bit lines of the memory cell block and the bit lines of the reference cell block. The signal C1N_T holds a high state in all the intervals except the interval t3 which is a part of the intervals that the signals SWL1 and SWL2 are in a high state before Y-Add is toggled. The signal C2N_T goes down to a low state at the time that the signal C1N_T goes down to a low state, holds the low state and then goes up to a high state at the time that the signal WEBpad goes up to a high state.

The signal C4N_T goes up to a high state at the time that the signal C1N_T goes up to a high state and returns a low state at the time that the signal CSBpad is disabled.

The signal P2 goes up to a high state at the time that the signals SWL1 and SWL2 go up to a high state, holds a high state and then goes down to a low state at the time that the signsl SWL1 takes a transition before the signal Y-Add is toggled.

The signal C3N_T holds its previous high state until the end of the interval t1, goesdown to a low state at the starting point of the intervals t2 that the signals SWL1 and SWL2 go up to a high state, and then goes up to a high state when the signal CSBpad is disabled.

The signal SAN_C goes up to a high state at the beginning of the intervals t2 that the signals C1N_T and C2N_T take their transitions at the same time and holds the high state by the time that the signal CSBpad is disabled.

The signals SAP_C and SAN_C have the opposite polarity with each other but they transit at the same time.

As described above, there is no change in the output signal of the global control pulse generator since there is no change in its input signal when Y address is toggled under the condition that the signal CSBpad is enalbed with its low state.

Even when the signal Y-ATD goes up to a high state by Y address change, by keeping the signals PS1_T and PS2_T of the local control pulse generator unchanged in the read mode, the disabled states of the signals SWL1 and SWL2 are held.

Therefore, by making the column decoder which corresponds to the changed Y address enabled, the data latched by the sense amplifier is transfered to the data bus.

First, in the interval t7 that Y address is changed, the data of the sense amplifier is transfered to the data bus and a read operation is executed. Second, in the interval t11 that Y address is changed, the data of the sense amplifier is transfered to the data bus and a read operation is also executed This means that the data latched by the sense amplifier can be transfered to the data bus by changing only the column selection when Y address is toggled.

Thus, the input and output operations of the SWL ferroelectric memory device in the read and write modes for the case that only Y address is changed are explained.

Hereafter, the waveforms for the operation in the read and write modes are explained for the case that only X, Z addresses are changed.

First, in the write mode, the waveform for the opertion of the SWL ferroelectric memory device when the X, Z addresses are changed is divided into 21 interval from t1 to t21.

Figure 30:
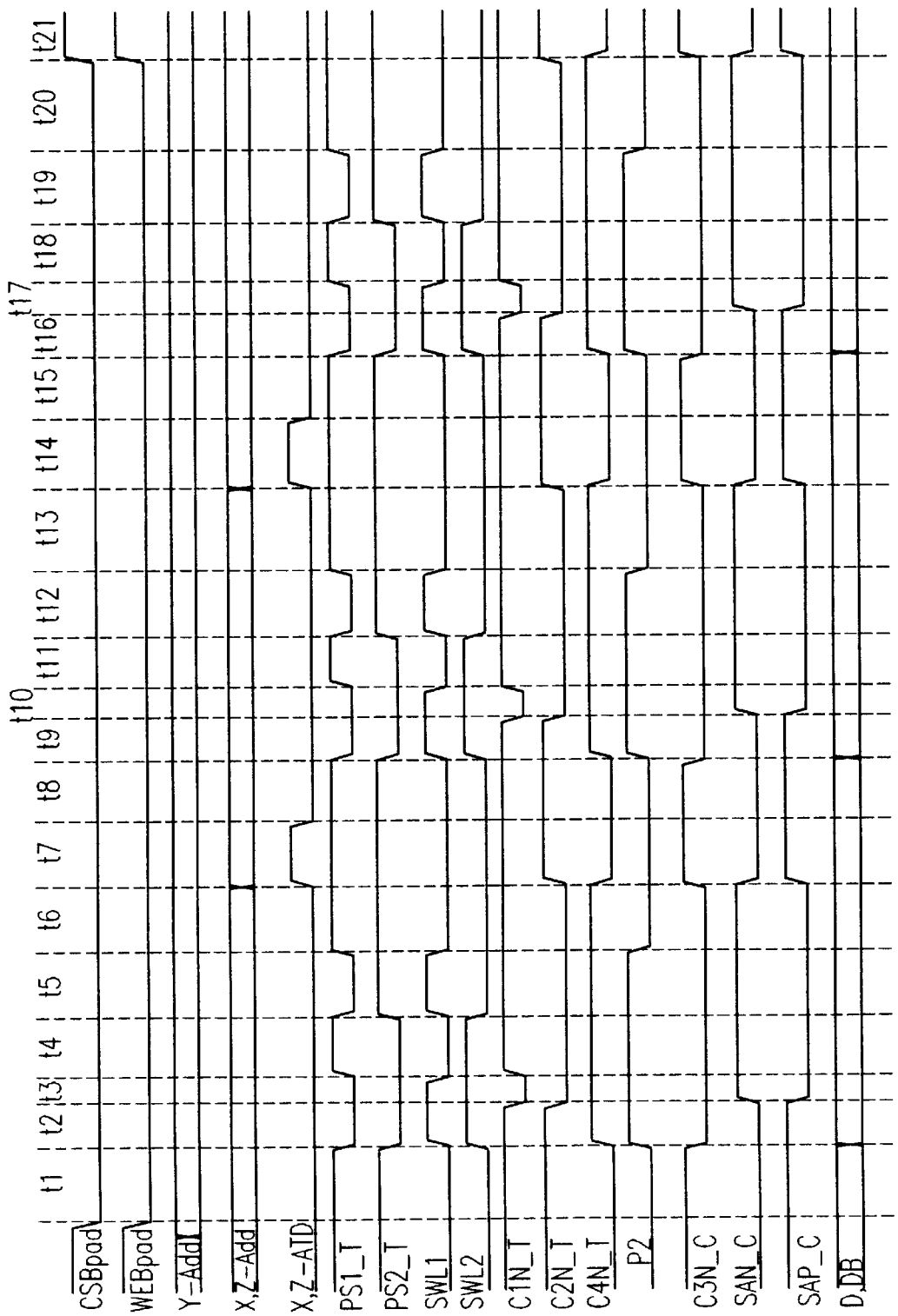
FIG. 30 shows the waveforms for the operation of the local control pulse generator in the write mode when X, Y addresses are changed.

FIG. 30 is the waveform for the Y X, Z addresses toggling when the SWL ferroelectric memory according to the present invention is in a write mode.

First, at the beginning time of the interval t1, the signal CSBpad goes from its previous high state to a low state, holds the state as its active state and then is disabled at the beginning of the interval t12. At the same time, the write enable signal WEBpad goes to a low state, holds the state as its active state, and goes to a high state when the signal CSBpad is disabled. The signals WEBpad and CSBpad are applied from their external. When X, Z addresses transit at the beginning points of the intervals t7 and t14, X, Z-ATD has a high state in the intervals t7 and t14.

In the interval t1, only the signals CSBpad and WEBpad are enabled and all other signals hold their previous states.

In the interval t2, the signals CSBpad and WEBpad hods their enabled states and the signals PS1_T, PS2_T and C3N_C transit from their previous high states to a low state. The signals SWL1, SWL2 and C4N_T and P2 transit from their previous low states to a high state, respectively. When the signal C4N_T is enabled by the transition from a low state to a high state, the data transfered from an external is loaded on the bit line of the memory cell and the bit line of the reference cell.

In the interval t3, said all signals CSBpad, WEBpad, PS1_T, PS2_T, SWL1, SWL2, C3N_T, C4N_T and P2 hold the states of the interval t2, the signal SAN_C transits from its previous low state to a high state, and the signal SAP_T goes from a high state to a low state. The signals PS1_T and PS2_T are repeatedly changed between a high state and a low state as follow.

The signal PS1_T holds a high state in the intervals t1, t4, t6, t7, t8, t11, t13, t14, t15, t18 and t20, and holds a low state in other intervals. The signal PS2_T holds a high state in the intervals t1, t5–t8, t12–t15 and t19, and a low state in other intervals. The signals SWL1 and PS1_T take their transitions at the same time and have the polarities different from each other. The signals SWL2 and PS2_T take their transitions at the same time and have the polarities different from each other. The signal C1N_T has a low state in the parts t3, t10 amd t17 of the interval intervals that both signals SWL1 and SWL2 are in a high state. The signal C2N_T transits to a low state at the time that the signal C1N_T transits to a low state and again transits to a high state at the time that the signal X,Z-ATD transits to a high state. The signal C4N_T transits to a high state at the time that both of signals SWL1 and SWL2 transit to a high state and again transits to a low state at the time that the signal X,Z-ATD transits to a high state. The signal P2 transits to a high state at the time that both of signals SWL1 and SWL2 transit to a high state and again transits to a low state at the time that both of signals SWL1 and SWL2 transit to a low state. The signals SAN_C and C2N_T have the polarities different from each other and the signals SAP_T and C2N_T have the same polarities.

The operation is explained as follows according to the intervals.

In the interval t4, the signals PS1_T and C1N_T transit to their high states and the signal SWL1 transits from a high state to a low state.

In the interval t5, the signal PS1_T transits from a high state to a low state and the signal SWL1 transits from a low state to a high state according to the result. The signal PS2_T transits from its previous low state to a high state and the signal SWL1 transits from a high state to a low state according to the result.

At the beginning of the interval t6, the signal PS1_T transits from a low state to a high state and the signal SWL1 transits from a high state to a low state according to the result. The signal PS2_T transits from its previous state, that is, a high state, to a low state.

X, Z addresses are changed in the interval t7. Therefore, X, Z-ATD is generated as a high signal from its previous low signal. Then, the signal C2N_T transits from a low state to a high state, the signals C4N_T and SAN_T transits from their high states to a low state, respectively, and the signals C3N_T and SAP_C transit from their previous low states to a high state, respectively.

At the beginning of the interval t8, only X, Z-ATD transits from its previous high state to a low state and all the signals except X, Z-ATD hold their previous states of the interval t7. From the beginning of the interval t9, the waveforms of the intervals from t2 to t8 are repeated.

At the beginning of the interval t21, the signals CSBpad and WEB pad transit to the high states, and the write mode is disabled. Then, the signal C4N_T transits from its previous high state to a low state, the signal SAN_C transits from its high state to a low state and the signal SAP_C transits from a low state to a high state.

Thus, when X, Z addresses are changed in the SWL ferroelectric memory device in the write mode, the signal C4N_T is enabled at the time that the signals SWL1 and SWL2 are enabled and therefrom data is transmitted to the bit line before the sense amplifier is activated.

The waveforms for the operations of the SWL ferroelectric memory device in the read mode when X, Z addresses are changed are divided into the intervals from t1 to t21 and explained as follows.

Figure 31:
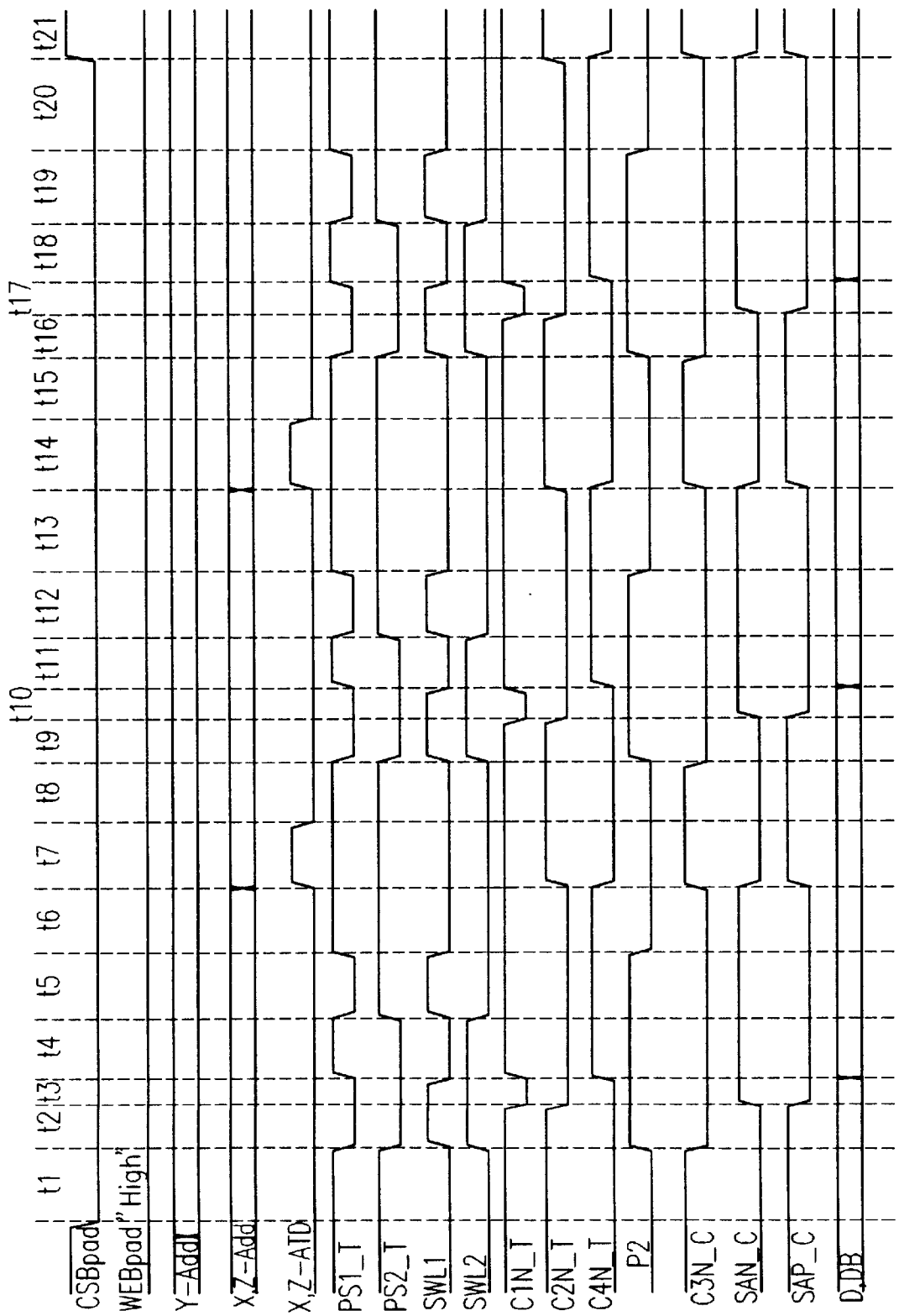
FIG. 31 shows the waveforms for the operation of the local control pulse generator in the read mode when X, Y addresses are changed.

FIG. 31 is the waveforms corresponding to the case that the X, Z addresses are toggling when the SWL ferroelectric memory device according to the present invention is in the read mode. When comparing the waveforms in the read mode with the waveforms in the write mode, there is a change at the transition time of the signal C4N_T. Furtheromre, the signal WEBpad in the read mode is disabled at its high state.

The signal C4N_T holds a low state in the intervals t1, t2 and t3. At the beginning of the interval t4, the signal C4N_T goes from the low state to a high state and then the data amplified by the sense amplifier is loaded on the bit line. The signal C4N_T holds the high state until the interval t6 and transits to a low state at the beginning of the interval t7. After then, the signal C4N_T holds the low state until the interval t10 and transits to a high state at the beginning of the interval t11. As soon as the signal C4N_T goes from the low state to a high state, the data amplified by the sense amplifier is transfered to the data input and output line.

Thus, the sense amplifier senses the data in advance when the device is in the read mode and then the read operation is performed by applying the data from the sense amplifier to the data input and output line according to the activated signal C4N_T.

The SWL ferroelectric memory device of the present invention has the following effects.

First, since the cell array is formed without cell plate line, the complexity on the layout is greatly reduced.

Second, since a reference level is provided without using a dummy cell, the elements become stabilized and the deterioration by the dummy cell is rejected.

Third, by making the accessed number of the main memory cells equal to the accessed number of the reference cells, the voltage induced on the bit line can be a constant value and therefrom the characteristics for the operation of the elements are improved.

Fourth, since the capacitance loaded at the input and output ports of the sense amplifier is selectively controlled, the operation of the sense amplifier is stabilized and the speed of the operation is increased.

Fifth, simce it is possible to access the memory cell by using only the signal CSBpad, only the change of X, Z addresses and only the change of Y address, the memory cell access operation can be done with a high speed.

It will be apparent to those skilled in the art that various modifications and variations can be made in the splitted word line ferroelectric memory of the present invention without departing from the spirit or scope of the invention. Thus, it is intended that the present invention covers the modifications and variations of this invention provided they come within the scope of the appended claims and their equivalents.

What is claimed is:

1. A nonvolatile ferroelectric memory device comprising:
   a plurality of main cell arrays arranged in even number of columns;
   a plurality of reference cell arrays arranged in two columns;

a plurality of cell array blocks in which said main cell arrays and said reference cell arrays form a pair and a plurality of said pairs are arranged;

an SWL word line driver arranged in parallel with said columns; and a plurality of control blocks connected with both ends of said column so as to control other cell array block neighboring with said cell array blocks.

2. The nonvolatile ferroelectric memory device claimed in claim 1, wherein said control blocks are separated into two regions for each of said cell array blocks and formed in symmetrical positions at both ends of the column direction of said cell array blocks.

3. A nonvolatile ferroelectric memory device, comprising:

a plurality of main memory cell arrays including unit cells constructed at the cross point that first and second bit lines which are arranged with an equal distance intersect first and second splitted word lines which are repeatedly arranged in a perpendicular direction to said bit line;

a plurality of cell array blocks including reference cell arrays formed between them in a first direction;

SWL drivers which uses two cell array blocks neighboring with each other as a unit and are formed on the both sides of the unit; and a plurality of core blocks which include a plurality of bit line control circuit blocks connected to first bit lines of main memory cell arrays included into one of cell array blocks, second bit lines of main cell arrays which are connected to a first bit line of reference cell array corresponding with them and is included into neighboring other cell array block, and second bit lines of reference cell array corresponding with them, and a plurality of reference bit line control circuit blocks connected to first bit line of reference cell array included into one of cell array blocks and second bit lines of reference cell array of neighboring cell array block, and formed between the cell array blocks in a second direction.

4. The nonvolatile ferroelectric memory device claimed in claim 3, wherein said reference cell bit line consists of two bit column corresponding to even number of the main memory cell bit line columns.

5. The nonvolatile ferroelectric memory device claimed in claim 3, wherein said bit line control circuit blocks are formed as many as the number of the main memory cell arrays.

6. The nonvolatile ferroelectric memory device claimed in claim 3, wherein each of said unit cells includes:

first NMOS transistor whose gate is connected with a first splitted word lines;

second NMOS transistor whose gate is connected with a second splitted word lines;

first ferroelectric capacitor whose one electrode is connected to the source of said first transistor and the other electrode is connected to the second splitted word line; and second ferroelectric capacitor whose one electrode is connected to the second splitted word line and the other electrode is connected to the source of said first transistor.

7. The nonvolatile ferroelectric memory device claimed in claim 6, wherein said unit cell stores two data, a pair of said first and second splitted word lines form a row address, and a pair of said bit lines form two columns.

8. The nonvolatile ferroelectric memory device claimed in claim 3, wherein each of said cell array blocks consists of four main memory cell array blocks and two reference cell array blocks in which one reference cell array is formed so as to correspond with two main memory cell arrays and neighbor with the memory cell arrays in a second direction.

9. The nonvolatile ferroelectric memory device claimed in claim 3, wherein said core block is separated into two area for each cell array block and formed in symmetrical positions at both ends of the column direction of said cell array block.

10. A nonvolatile ferroelectric memory device, including:

Nth bit line, (N+1)th bit line and a pair of first and second splitted word lines which intersect with said two bit lines at right angles to each other;

a first transistor and a second transistor, each of the transistors has one electrode connected with a bit line and a gate connected to each of the splitted word lines and is formed at their intersection point, respectively;

a first capacitor and a second capacitor, each of the capacitors is connected between the other of the transistors and each of the splitted word lines, respectively;

SWL drivers which are connected to said the first and second splitted word lines and apply a SWL drive signal to each of the splitted word lines, respectively;

a reference level generator generating a reference level which is used for sensing voltages induced on the Nth and (N+1)th bit lines by said SWL drive signal;

a sense amplifier which is connected to each of the Nth and (N+1)th bit lines and compares between the reference level and the voltage induced on each of the bit lines; and a drive control and data input and output circuit of a unit cell including a column decoder which transfers output data of the sense amplifier to a data bus line according to an address signal.

11. The nonvolatile ferroelectric memory device claimed in claim 10, wherein the unit cell stores two data, a pair of the splitted word lines form a row address, and a pair of bit lines form two columns.

12. The nonvolatile ferroelectric memory device claimed in claim 10, wherein an operation of a read mode includes the steps of:

precharging the bit lines and the reference level with a low level before the word lines are enabled;

loading a main memory cell data to the bit line and a reference level generator data to a reference line; and feeding back a signal which is an output signal of the sense amplifier that is driven by a column decoder and amplifies the difference between a data level of the bit line and a data level of the reference line to the bit line.

13. A nonvolatile ferroelectric memory device, comprising:

a plurality of first transistors which are turned on by a first control signal and connect between a plurality of bit lines of a memory cell region and one sense amplifier array;

a plurality of second transistors which are turned on by a second control signal and connect between a reference bit line and the other sense amplifier array;

a bit line level controller whose level is controlled by a third control signal; and a pull up transistor which applies a pull up voltage to the reference bit line according to a fourth control signal.

14. The nonvolatile ferroelectric memory device claimed in claim 13, wherein said memory cell array has as many memory cells connected to each bit line as the reference cells of the reference cell array so that Cb__n=Crb0, Cb1=Cr1, Cb2=Cr2, Cb3=Cr3 and Cb4=Cr4, where Cb__n, Cb__n+1, Cb__n+2 . . . denote capacitance components of the bit lines of the main memory cell range, Crb0 denotes a capacitance component of the reference bit line of a reference cell region, and Cr1, Cr2, Cr3, Cr4 . . . and Cb1, Cb2, Cb3, Cb4 . . . denote other capacitance components of other regions.

15. The nonvolatile ferroelectric memory device claimed in claim 14, wherein a number n of the bit lines of the main cell array is determined so as to satisfy Crb0=n* Cr1 and a capacitance of total bit lines concerning to the reference cell is about twice as large as a capacitance of total bit lines concerning to the main memory cell.

16. The nonvolatile ferroelectric memory device claimed in claim 13, wherein said bit line level controller further includes a plurality of third transistors and the third transistors go active so that the bit lines of the main memory cell and the reference cell go to the equi-potential and are pulled down to ground when the third control signal is enabled under the condition that the first and second control signals are enabled.

17. The nonvolatile ferroelectric memory device claimed in claim 13, wherein when said reference cell and said main cell have the same capacity and store the same logic value 1, a bit line voltage increment induced by the main memory cell is larger at the bit line side of the main memory cell than that at the bit line side of the reference cell.

18. The nonvolatile ferroelectric memory device claimed in claim 13, wherein when said reference cell stores a logic value 1 and said main memory cell stores a logic value 0, a voltage increment induced by the bit line of the reference cell is larger than that induced by the bit line of the main memory cell.

19. The nonvolatile ferroelectric memory device claimed in claim 13, wherein a bit line voltage of said reference cell is formed at a mid-level between a voltage induced by the bit line corresponding to the logic value 1 stored in the main memory cell and a voltage induced by the bit line corresponding to the logic value 0 stored in the main memory cell.

20. A nonvolatile ferroelectric memory device, comprising:
X, Z-ATD generator for detecting an address transition of X, Z address signals applied from an external and generating the signal X, Z-ATD;
a global control pulse generator for receiving an output signal of said X, Z-ATD generator, a signal CSBpad applied from an external, generating a power up detection signal in itself, and generating a basic pulse for a memory control according to a combination of said X, Z-ATD, CSBpad and power up detection signals;
Y-ATD generator for detecting an address transition of Y address signal applied from an external;
a local control pulse generator for generating a pulse necessary for each memory block by a combination of an output signal of said global control pulse generator, a predecoded Z address signal and the output signal of the Y-ATD generator;
a X post decoder for combining predecoded X, Z address signals and selecting a corresponding memory cell block;
a SWL driver for applying a signal obtained by a combination of an output signal of said X post decoder and an output signal of said local control pulse generator to each splitted word line of each SWL cell block including a cell array block which consists of a plurality of main memory cell arrays including unit cells formed at the intersection point between first and second bit lines arranged with a equal distance and first and second splitted word lines repeatedly arranged in a direction perpendicular to them and a plurality of reference cell arrays arranged between them;
a column controller for combining the predecoded Y address signal and the output signal of the local control pulse generator and selecting a corresponding bit line; and the predecoded Y address signal and the output signal of the local control pulse generator and selecting a corresponding bit line; and
a sense amplifier input and output controller for combining the output signal of the local control pulse generator and an output signal of the column controller and for controlling a sensing, input and output operations of each SWL cell block.

21. A nonvolatile ferroelectric memory device, wherein a local control pulse generator comprises:
a first logic operation unit for receiving a control signal including preparatory signals (SAP, SAN) for sense amplifier and predecoded Z addresses (Z__Add3, Z__Add4 and for generating sense amplifier control signals (SAP__C, SAN__C) and equal voltage control signals (C3N__C, C3P__C);
a first control pulse generator including a second logic operation unit to generate control signals (C1P__T, C1N__T, C2P__T, C2N__T, C3N__T) for bit line connection and level control from a predecoded Z address signals (Z__Add1, Z__Add2);
a second control pulse generator for receiving a signal including a write enable signal (WEBpad) and therefrom generating a signals (C4P__T, and C4N__T) for a column selection; and
a third control pulse generator for receiving Y address transition detection signal (Y-ATD) and therefrom generating preparatory SWL signals (PS1__T, PS2__T).

22. The nonvolatile ferroelectric memory device claimed in claim 21, wherein said first logic operation unit receives a third control signal (C3) precharging bit lines of a main memory cell and a reference cell by a low voltage before SWL drive signal is activated and then generates a signal (SAP__C) controlling PMOS transistor of the sense amplifier, a signal (SAN__C) controlling NMOS transistor of the sense amplifier, a signal (C3N__C) controlling NMOS transistor of the block for equalizing bit line potentials, and a signal (C3P__C) controlling PMOS transistor of the block.

23. The nonvolatile ferroelectric memory device claimed in claim 21, wherein said second logic operation unit receives a first control signal (C1) controlling a signal flow of the bit lines of a main memory cell and one input and output terminal of the sense amplifier and a second control signal (C2) controlling a signal flow of the bit lines of a reference cell and one input and output terminal of the sense amplifier.

24. The nonvolatile ferroelectric memory device claimed in claim 21, wherein said second control pulse generator receives a third control signal (C3) precharging bit lines of a main memory cell and a reference cell by a low voltage before SWL drive signal is activated and then generates a signal (C4P__T) controlling PMOS transistor of the of the block to control a column selection and a signal (C4N__T) controlling NMOS transistor of the block to control a column selection.

25. The nonvolatile ferroelectric memory device claimed in claim 21, wherein said third control pulse generator receives preparatory signals (S1, S2) for generating the preparatory SWL signals, an interlock signal (P2) for preventing a normal operation of each of said preparatory signals from disturbance and a fourth control signal (C4) for controlling a signal flow of the bit lines of the main memory and an external data bus.

26. The nonvolatile ferroelectric memory device claimed in claim 21, wherein the local control pulse generator further includes a circuit having the second logic operation unit of the first control pulse generator at an output stage of NAND gate of the first logic operation unit of the first control pulse generator which performs an operation on the predecoded Z address signals (Z_Add3, Z_Add4) and a circuit having an identical structure as the second, third control pulse generator and controls a detection operation and input and output operations of other cell array block which commonly holds sense amplifier and input and ouput circuit.

27. The nonvolatile ferroelectric memory device claimed in claim 26, wherein said local control pulse generator receives first, second, third and fourth control signals (C1, C2, C3, C4) and a preparatory SWL signal and therefrom generates signals (C1P_B, C1N_B, C2P_B, C2N_B, C3N_B) for the bit line connection and level control, control signals (C4P_B, C4N_B) for a column selection, and another preparatory SWL signals (PS1_B, PS2_B).

28. The nonvolatile ferroelectric memory device claimed in claim 21, wherein the first logic operation unit includes:
   a first NAND gate performing an operation on Z_Add3 and Z_Add4;
   a second NAND gate performing an operation on an output of the first NAND gate and Z_Add1 and Z_Add2 which are processed by a NAND operation;
   a first inverter generating a signal SAP_C by inverting an output of a third NAND gate which performs an NAND operation on the output of the second NAND gate and an input signal SAP;
   a second inverter generating a signal SAN_C by inverting an output of a fourth NAND gate which performs an NAND operation on the output of the second NAND gate and a signal SAN;
   a fifth NAND gate for generating an output of the third inverter inverting a third control signal C3 which is concerned with the equalization and the column selection and the output of the second NAND gate;
   a fourth inverter for generating a signal C3P_C by inverting an output of the fifth NAND gate; and
   a fifth inverter generating a signal C3N_C by inverting an output of the fourth inverter.

29. The nonvolatile ferroelectric memory device claimed in claim 21, wherein the second logic operation unit includes:
   a first NAND gate performing an operation on Z_Add1 and Z_Add2;
   a second NAND gate for performing a NAND operation on an output of a first inverter inverting the output of the first NAND gate and a first control signal (C1) controlling bit line connections of two cell array blocks which commonly hold the sense amplifier and an input and output circuit;
   second and third inverters for generating a signal C1P_T by delaying an output of the second NAND gate;
   a fourth inverter for generating a signal C1N_T by inverting an output of the second NAND gate;
   a third NAND gate for performing a NAND operation on an output of the first inverter and a second control signal (C2) controlling bit line connections of two reference cell array blocks which commonly hold the sense amplifier and a data input and output circuit;
   fifth and sixth inverters for generating a signal C2P_T by delaying an output of the third NAND gate;
   a seventh inverter for generating a signal C2N_T by inverting an output of the third NAND gate; and
   ninth and tenth inverters for generating a signal C3N_C by delaying an output of a fourth NAND gate which performs a logic operation on the output of the first inverter and an inverted signal from a third control signal (C3).

30. The nonvolatile ferroelectric memory device claimed in claim 21, wherein the second control pulse generator includes:
   a first inverter for inverting a write enable signal WEBpad;
   a second inverter for inverting an output of the first inverter;
   a third inverter for inverting a fourth control signal (C4) which is concerned with SWL drive and column selection of two cell array blocks which commonly hold the sense amplifier and a data input and output circuit;
   a fourth inverter for inverting an output of a NAND gate which performs a logic operation on signals of the second and third inverters;
   a NOR operation unit for performing a NOR operation on a third control signal (C3), an output of the fourth inverter and an output of the first NAND gate of the second logic operation unit;
   a fifth inverter for generating a signal C4P_T by inverting an output of the NOR operation unit; and
   a sixth inverter for generating a signal C4N_T by inverting an output of the fifth inverter.

31. The nonvolatile ferroelectric memory device claimed in claim 21, wherein the third control pulse generator includes:
   a first inverter for inverting a signal (P2);
   a first NAND gate for performing a logic operation on a signal Y_ATD, an output of the first inverter, a fourth control signal (C4) and an inverted signal from the signal WEBpad;
   third, fourth, fifth, and sixth inverters for delaying an output of a second inverter inverting an output of the first NAND gate;
   a first NOR gate for performing an operation on a signal S1 and an output of the second inverter;
   a second NOR gate for performing a NOR operation on an output of the first NOR gate and an output of the first NAND gate of the second logic operation unit;
   a seventh inverter for generating a signal PS1_T by inverting an output of the second NOR gate;
   a third NOR gate for performing a logic operation on a second control signal (S2) and an output of the sixth inverter;
   a fourth NOR gate for performing a NOR operation on an output of the third NOR gate and an output of the first NAND gate of the second logic operation unit; and
   an eighth inverter for generating a signal PS2_T by inverting an output of the fourth NOR gate.

32. The nonvolatile ferroelectric memory device claimed in claim 21, wherein said Y address transition detection signal Y_ATD is obtained when Y address transits in its state and is enabled with a high pulse.

33. The nonvolatile ferroelectric memory device claimed in claim 21, wherein said Y address transition detection signal Y_ATD is obtained when Y address transits in its state and is enabled with a high pulse.

34. The nonvolatile ferroelectric memory device claimed in claim 21, wherein said signal for the column selection corresponding to an interval for precharging the main memory cell bit line and the reference cell bit line whose states are the values before splitted word lines (SWL1, SWL2) are activated is set to an inactive level by a third control signal (C3) in the write mode and therefrom the signal flow between a data bus and a bit line is cut off by the control signal.

35. The nonvolatile ferroelectric memory device claimed in claim 21, wherein a NAND gate of said third control pulse generator is activated so that a normal operations of the signals S1 and S2 are guaranteed when a signal P2 is a high state and signals S1 and S2 are in normal operations with their enabled states.

36. The nonvolatile ferroelectric memory device claimed in claim 21, wherein in said third control pulse generator, a size of inverters third, fourth, fifth and sixth inverters for delaying an output of a second inverter is adjusted so that an overlap of the low states of signals PS1_T and PS2_T is avoided.

37. The nonvolatile ferroelectric memory device claimed in claim 21, wherein in the read mode, output signals (PS1_T and PS2_T) of the third control pulse generator which is used as input signals of a SWL driver block have opposite polarities against signals S1 and S2, respectively.

38. In a SWL ferroelectric memory device in which a core block including a sense amplifier is held in common by a top cell array block and a bottom cell array block, a nonvolatile ferroelectric memory device, comprising:

a sense amplifier which is connected to bit lines(BIT_T, RBIT_T, BIT_B and RBIT_B) which are connected to a reference cell and an arbitrary memory cell in the top cell array and the bottom cell array and which detects and amplifies data of the lines corresponding to a sense amplifier enable signals (SAP_C and SAN_C);

an equalizer equalizing potentials of the bit lines (BIT_T and RBIT_B) or the bit lines (BIT_B and RBIT_B) according to equalization signals (C3N_C and C3P_C);

first and second transmission gates switching by connection signals (C1P_T, C1N_T, C2P_T, C2N_T) for the top cell array and then selectively connecting bit lines (BIT_T and RBIT_T) to the input and output lines of said sense amplifier;

third and fourth transmission gates switching by connection signals (C1P_B, C1N_B, C2P_B, C2N_B) for the bottom cell array and then selectively connecting bit lines (BIT_B and RBIT_B) to the input and output lines of said sense amplifier;

fifth transmission gate which is connected to the bit line(BIT_T) between said first transmission gate and said top memory cell and controls the connection to a data bus (D_BUS) according to column selection signals (Y_n_T and YB_n_T); and sixth transmission gate which is connected to the bit line(BIT_B) between said third transmission gate and said bottom memory cell and controls the connection to a data bus (D_BUS) according to column selection signals (Y_n_B and YB_n_B).

39. The nonvolatile ferroelectric memory device claimed in claim 38, further comprising:

a first bit line level controller which has one of electrodes connected to the bit line (BIT_T) between said first transmission gate and the fifth transmission gate and controls a level of the bit line (BIT_T) according to a pull down control signal (C3N_T) applied to a gate; and a second bit line level controller which has one of electrodes connected to the bit line (BIT_B) between said third transmission gate and the bottom memory cell array block and controls a level of the bit line (BIT_B) according to a pull down control signal (C3N_B) applied to a gate.

40. The nonvolatile ferroelectric memory device claimed in claim 39, wherein when a top main cell column and a reference cell column are selected, said first bit line level controller is turned on, executes a pull down operation, and makes the bit lines (BIT_T and RBIT_T) which are connected to the top main memory cell and the reference cell, respectively, have a low level.

41. The nonvolatile ferroelectric memory device claimed in claim 39, wherein when a bottom main cell column and a reference cell column are selected, said second bit line level controller is turned on, executes a pull down operation, and makes the bit lines (BIT_B and RBIT_B) which are connected to the bottom main memory cell and the reference cell, respectively, have a low level.

42. The nonvolatile ferroelectric memory device claimed in claim 39, wherein said first and second bit line level controllers consist of a NMOS transistor whose other electrode is connected to ground, respectively.

43. The nonvolatile ferroelectric memory device claimed in claim 38, wherein in the read mode, said data bus (D_BUS) is used as an output transmission line of the sense amplifier and in the write mode, as a transmission line for data to be written into the memory cell.

44. The nonvolatile ferroelectric memory device claimed in claim 38, further including a NMOS transistor whose one electrode is connected to said sense amplifier and the other electrode is connected to a ground terminal (VSS), whose gate is provided with a sense amplifier enable signal (SAN_C) and whose low state makes the sense amplifier disabled.

45. The nonvolatile ferroelectric memory device claimed in claim 38, further including a PMOS transistor whose one electrode is connected to said sense amplifier and the other electrode is connected to a power supply voltage terminal (VCC), whose gate is provided with a sense amplifier enable signal (SAP_C) and whose low state makes the sense amplifier enabled and whose high state makes the sense amplifier disabled.

46. The nonvolatile ferroelectric memory device claimed in claim 38, wherein said equalizer equalizes the potentials of the bit lines (BIT_T, RBIT_T, BIT_B and RBIT_B) of the main cell and the reference cell and the potential of the sense amplifier before the splitted word lines (SWL1 and SWL2) are enabled.

47. The nonvolatile ferroelectric memory device claimed in claim 38, wherein said first, second, third, fourth, fifth and sixth transmission gates form a switching block and said switching block consists of NMOS transistor.

48. In a SWL ferroelectric memory device in which a core block including a column decoder for a column selection is held in common by a top cell array block and a bottom cell array block, a nonvolatile ferroelectric memory device, comprising:

a first plurality of NAND gates which performs a logic operation on each of addresses having predecoded addresses (Ypre_n, Ypre_n+1, Ypre_n+2. . . . ) and a column selection signal (C4N_T) generated from a local control pulse generator;

a second plurality of NAND gates which include inverters connected with the output terminal of each of NAND gates, respectively, form a block for a column selection when data input and output are performed in a top cell array block, and perform a logic operation on each of addresses having predecoded addresses (Ypre_n, Ypre_n+1, Ypre_n+2. . . . ) and a column selection signal (C4N_T) generated from a local control pulse generator; and a column selection block which includes inverters connected with an output terminal of each of NAND gates and forms a block for a column selection when data input and output are performed in a bottom cell array block.

49. The nonvolatile ferroelectric memory device claimed in claim 48, wherein the outputs of said NAND gate become Y addresses (Y_n_T, Y_n+1_T, Y_n+2_T . . . ) for selecting a memory cell bit line when the outputs pass through the inverters corresponding to each of the NAND gates and become /Y addresses ( (YB_n_T, YB_n+1_T, YB_n+2_T . . . ) for selecting a reference cell bit line when the outputs do not pass through the inverters, and only one signal of said Y addresses is enabled at a high state and only one signal of said /Y addresses is enabled at a low state.

50. The nonvolatile ferroelectric memory device claimed in claim 49, said enabled signal controls the state(active or inactive) of a switching block consisting of transistors or transmission gates which are connected with a data bus in a sense amplifier and input and output circuit.

51. In a SWL ferroelectric memory device in which a core block including a block for controlling a level of a reference bit line is held in common by a top cell array block and a bottom cell array block, a nonvolatile ferroelectric memory device wherein a block for controlling a level of a reference bit line comprises:

a first PMOS transistor whose gate is provided with a reference bit line level control signal (C4P_T), source is connected to VCC and drain electrode is connected to a reference bit line (RBIT_T)

a top reference bit line level control circuit including a first NMOS transistor whose drain electrode is connected to the reference bit line (RBIT_T), source electrode is connected to VSS and gate is provided with a reference bit line level control signal (C3P_T), and generating a pull up or pull down signal for controlling the level of the bit line (RBT_T) connected to a top reference cell;

a second PMOS transistor whose gate is provided with a reference bit line level control signal (C4P_B), source is connected to VCC and drain electrode is connected to a reference bit line (RBIT_B); and a bottom reference bit line level control circuit including a second NMOS transistor whose drain is connected to the reference bit line (RBIT_B), source is connected to VSS and gate is provided with a reference bit line level control signal (C3N_B), and generating a pull up or pull down signal for controlling the level of the bit line (RBIT_T) connected to a bottom reference cell.

52. The nonvolatile ferroelectric memory device claimed in claim 51, wherein when the signal C4P_T activates the first PMOS transistor, the reference bit line (RBIT_T of a top cell array block is pulled up to a high voltage and therefore a high data is stored in a top reference cell.

53. The nonvolatile ferroelectric memory device claimed in claim 51, wherein when the signal C4P_B activates the second PMOS transistor, the reference bit line (RBIT_T) of a bottom cell array block is pulled up to a high voltage and therefore a high data is stored in a bottom reference cell.

54. The nonvolatile ferroelectric memory device claimed in claim 51, wherein when the signal C3N_T of a high state activates the first NMOS transistor, the reference bit line (RBIT_T) is pulled down to a low voltage.

55. The nonvolatile ferroelectric memory device claimed in claim 51, wherein the signal C3N_B of a high state activates the second NMOS transistor and therefore the reference bit line (RBIT_T) is pulled down to a low voltage.

56. The nonvolatile ferroelectric memory device claimed in claim 51, wherein said top reference bit line level control circuit includes a first NMOS transistor whose gate is provided with a reference bit line level control signal (C4N_T), source is connected to VCC and drain electrode is connected to a reference bit line (RBIT_T) and a second NMOS transistor whose drain is connected to a reference bit line (RBIT_T), source is connected to VSS and gate is provided with a reference bit line level control signal (C3N_T); and said bottom reference bit line level control circuit includes a third NMOS transistor whose gate is provided with a reference bit line level control signal (C4N_B), source is connected to VCC and drain is connected to a reference bit line (RBIT_B) and a fourth NMOS transistor whose drain is connected to a reference bit line (RBIT_B), source is connected to VSS and gate is provided with a reference bit line level control signal (C3N_T).

57. In a SWL ferroelectric memory device in which a core block including a sense amplifier is held in common by a top cell array block and a bottom cell array block, a nonvolatile ferroelectric memory device, comprising:

sense amplifier which is connected to bit lines (BIT_T, RBIT_T, BIT_B and RBIT_B) which are connected to a reference cell and an arbitrary memory cell in the top cell array and the bottom cell array and detects and amplifies data of the lines according to sense amplifier enable signals SAP_C and SAN_C);

equalizer equalizing potentials of the bit lines (BIT_T and RBIT_B) or the bit lines (BIT_B and RBIT_B) according to equalization signals (C3N_C and C3P_C);

first and second transmission gates switching by top cell array connection signals (C1P_T, C1N_T, C2P_T, C2N_T) and then selectively connecting bit lines (BIT_T and RBIT_T) which are in connection with top main memory and reference cells to the input and output lines of said sense amplifier;

third and fourth transmission gates switching by bottom cell array connection signals (C1P_B, C1N_B, C2P_B, C2N_B) and then selectively connecting bit lines (BIT_B and RBIT_B) which are in connection with bottom main memory and reference cells to the input and output lines of said sense amplifier;

fifth transmission gate which is connected to the input and output terminals of the sense amplifier and controls the connection to a data bus (D_BUS) according to column selection signals (Y_n and YB_n); and sixth transmission gate which is connected to the sense amplifier and controls the connection to a data bus (D_BUS) according to column selection signals (Y_n and YB_n).

58. The nonvolatile ferroelectric memory device claimed in claim 57, further comprising:

a first bit line level controller which is connected between a first transmission gate and the bit line (BIT_T) of the top memory cell and controls a level of the bit line (BIT_T) according to a pull down control signal (C3N_T) applied to a gate; and a second bit line level controller whose one electrode is connected to the bit line (BIT_B) between said third transmission gate and the bottom memory cell array block and which controls a level of the bit line (BIT_B) according to a pull down control signal (C3N_B) applied to a gate.

59. The nonvolatile ferroelectric memory device claimed in claim 58, wherein when a top main cell column and a reference cell column are selected, said first bit line level controller is turned on, executes a pull down operation, and makes the bit lines (BIT_T and RBIT_T) which are connected to the top main memory cell and the reference cell, respectively, have a low level.

60. The nonvolatile ferroelectric memory device claimed in claim 58, wherein when a bottom main cell column and a reference cell column are selected, said second bit line level controller is turned on, executes a pull down operation, and makes the bit lines (BIT_B and RBIT_B) which are connected to the bottom main memory cell and the reference cell, respectively, have a low level.

61. The nonvolatile ferroelectric memory device claimed in claim 57, further including a NMOS transistor whose one electrode is connected to said sense amplifier and he other electrode is connected to a ground (VSS), whose gate is provided with a sense amplifier enable signal (SAN_C) and whose high state enables the sense amplifier and whose high state disables the sense amplifier.

62. The nonvolatile ferroelectric memory device claimed in claim 57, further including a PMOS transistor whose one electrode is connected to said sense amplifier and the other electrode is connected to a power supply voltage terminal (VCC), whose gate is provided with a sense amplifier enable signal (SAP_C) and whose low state enables the sense amplifier and whose high state disables the sense amplifier.

63. The nonvolatile ferroelectric memory device claimed in claim 57, wherein said equalizer equalizes the potentials of the bit lines (BIT_T, RBIT_T, BIT_B and RBIT_B) of the main cell and the reference cell and the potential of the sense amplifier before the splitted word lines (SWL1 and SWL2) are enabled.

64. The nonvolatile ferroelectric memory device claimed in claim 57, wherein each of said first, second, third, fourth, fifth and sixth transmission gates consists of NMOS transistor.

65. In a SWL ferroelectric memory device in which a core block having a sense amplifier and input and output circuit is held in common by a top cell array block and a bottom cell array block, a nonvolatile ferroelectric memory device including a global control pulse generator, when Y address is toggled, for generating control signals whose period from the time that a chip enable signal CSBpad is enabled in a low state to the time that the signal CSBpad is disabled in a high state is divided into 15 intervals from t1 to t15, wherein said period comprises:

a first step in which each of preparatory signals (① S1, ② S2) for driving SWL drive, preparatory signals (③ C1, ④ C2) for a bit line connection, preparatory signal (⑤ C4) for a column selection, signal (⑥ P2) for assuring of a normal operation of the signals S1 and S2, preparatory signal (⑦ C3) for equalizing a bit line potential and sense amplifier enable preparatory signals (⑧ SAN, ⑨ SAP) holds L, L, H, H, L, L, H, L, H state, respectively, for the interval t1, and in which only the signals P2 and C3 go to a high state and to a low state, respectively, in the interval t2 that both of the signals S1 and S2 go to a high state, and the signals C1, C3 and SAP go down to a low state and the signal SAN goes down to a low state in the interval t3 that both of the signals S1 and S2 hold a high state;

a second step in which only the signals C1 and C4 go to a high state in the interval t4 that the signals S1 and S2 go to a low state and a high state, respectively, and other signals hold their states before the interval t4;

a third step in which all signals hold their previous states without transition in the interval t5 that the signals S1 and S2 go to a high state and a low state, respectively, and only the signal P2 goes to a low state in the interval t6 that both of the signals S1 and S2 go to a low state;

a fourth step in which all signals hold their state of interval t6 of the third step in the intervals t7 and t8 that a signal Y-ATD is activated, t9 and t10 that the signal Y-ATD is again disabled, t11 and t12 that the signal Y-ATD is enabled, and t13 and t14 that the signal Y-ATD is disabled; and a fifth step in which all signals have the same states of the interval t1 in the interval t15 that the signal CSBpad is disabled to a high state.

66. In a SWL ferroelectric memory device in which a core block including a sense amplifier and input and output circuit is held in common by a top cell array block and a bottom cell array block, a nonvolatile ferroelectric memory device including a global control pulse generator to generate control signals, according to X, Z address toggling, whose period from the time that a chip enable signal CSBpad is enabled in a low state to the time that the signal CSBpad is disabled in a high state is divided into 21 intervals from t1 to t21, wherein said period comprises:

a first step in which each of preparatory signals (① S1, ② S2) for driving SWL drive, preparatory signals (③ 3 C1, ④ C2) for a bit line connection, preparatory signal (⑤ C4) for a column selection, signal (⑥ P2) for assuring of a normal operation of the signals S1 and S2, preparatory signal (⑦ C3) for equalizing a bit line potential and sense amplifier enable preparatory signals (⑧ SAN, ⑨ SAP) holds L, L, H, H, L, L, H, L, H state, respectively, for the interval t1, and in which only the signals P2 and C3 go to a high state and a low state, respectively, in the interval t2 that both of the signals S1 and S2 go to a high state, and only the signals C1 and C3 go to a low state in the interval t3 that both of the signals S1 and S2 hold their high states;

a second step in which only the signals C1 and C4 go to a high state and the signals SAN and SAP are enabled in the interval t4 that the signals S1 and S2 go to a low state and a high state, respectively;

a third step in which all signals hold their states of the interval t4 of the second step without transition in the interval t5 that the signals S1 and S2 go to a high state and a low state, respectively, and only the signal P2 goes to a low state and all other signals hold the same states as the interval t5 in the interval t6 that both of the signals S1 and S2 go to a low state;

a fourth step in which the signals C2 and C3 again go to a high state and the signal C4 goes to a low state and the signals SAN and SAP is disabled;

a fifth step in which all signals have the same states as the states of the intervals from t1 to t6, according to the corresponding intervals in the same order, in the intervals from t8 to t13 that the signal X, Z-ATD is disalbed and hold the same states as the states of the interval t7 in the interval t14 that the signal X, Z-ATD is enabled; and a sixth step in which all signals have the same states as the states of the intervals from ti to t6, according to the corresponding interval in the same order, in the intervals from t15 to t20 that the signal X, Z-ATD is disalbed and hold the same states as the states of the interval t1 in the interval t21 that the signal X, Z-ATD is enabled.

67. In a SWL ferroelectric memory device in which a core block including a sense amplifier and input and output circuit is held in common by a top cell array block and a bottom cell array block, a nonvolatile ferroelectric memory device whose data write mode according to Y address toggling signal of the top cell array block has a period from the time that chip enable signals CSBpad and WEBpad are enabled in a low state to the time that the signals are disabled in a high state, wherein said period is divided into 15 intervals from t1 to t15 and comprises:

a first step in which each of preparatory SWL drive signals (①PS1_T, ②PS2_T), SWL drive signals (③SWL1, ④SWL2) control signals (⑤C1N_T, ⑥C2N_T) for a bit line connection, signal (⑦C4N_T) for column selection, an interlock signal (⑧P2) for preventing the preparatory SWL drive signal generation operation from disturbance, a signal (⑨C3N_C) for a bit line equi-potential and sense amplifier enable signals (⑩SAP_C, SAN_C) holds H, H, L, L, H, H, L, L, H, L, H state, respectively, for the interval t1, and in which the signals PS1_T, PS2_T and C3N_C go to a low state and the signals SWL1, SWL2 and C4N_T go to a high state in the interval t2 that Y address transition detection signal Y-ATD is disabled, and in the interval t3, the signals C1N_T and C2N_T go to a low state and the signals SAN_C and SAP_C are enabled and each of all other signals holds its previous state, respectively;

a second step in which in the intervals t4 that the signals PS1_T and C1N_T go to a high state and the signal SWL1 goes to a low state, t5 that the signals PS1_T and SWL2 go to a low state and the signals PS2_T and SWL1 go to a high state, t6 that the signal PS1_T goes to a high state and the signals SWL1 and P2 go to a low state, each of all other signals holds its previous state, respectively;

a third step in which the signal PS1_T goes to a low state and the signal SWL1 goes to a high state in the interval t7 that the signal Y-ATD is enabled and the signal PS2_T goes to a low state and the signal SWL2 goes to a high state in the interval t8 and each of all other signals holds its previous state, respectively;

a fourth step in which the signal PS1_T goes to a high state and the signal SWL1 goes to a low state in the interval t9 that the signal Y-ATD is disabled and the signal PS2_T goes to a high state and the signal SWL2 goes to a low state in the interval t10 and each of all other signals holds its previous state, respectively;

a fifth step in which each of the signals PS1_T, SWL1, PS2_T and SWL2 have the same state change as the third step in the intervals t11 and t12 that the signal Y-ATD holds its active state and each of all other holds its previous state, respectively; and a sixth step in which each of the signals PS1_T, SWL1, PS2_T and SWL2 have the same state change as the fourth step in the intervals t13 and t14 that the signal Y-ATD holds its inactive state and each of all other holds its previous state, respectively.

68. In a SWL ferroelectric memory device in which a core block including a sense amplifier and input and output circuit is held in common by a top cell array block and a bottom cell array block, a nonvolatile ferroelectric memory device whose data read mode according to Y address toggling signal of the top cell array block has a period from the time that chip enable signal CSBpad is enabled in a low state to the time that the signal WEBpad is enabled in a high state, wherein said period is divided into 15 intervals from t1 to t15 and comprises:

a first step in which each of preparatory SWL drive signals (①PS1_T, ②PS2_T), SWL drive signals (③SWL1, ④SWL2) control signals (⑤C1N_T, ⑥C2N_T) for a bit line connection, signal (⑦C4N_T) for column selection, an interlock signal (⑧P2) for preventing the preparatory SWL drive signal generation operation from disturbance, a signal (⑨C3N_C) for a bit line equi-potential and sense amplifier enable signals (⑩SAP_C, SAN_C) holds H, H, L, L, H, H, L, L, H, L, H state, respectively, in the interval t1, and in which the signals PS1_T, PS2_T and C3N_C go to a low state and the signals SWL1, SWL2 and P2 go to a high state in the interval t2 that Y address transition detection signal Y-ATD is disabled, and in the interval t3, the signals C1N_T and C2N_T go to a low state and the signal C4N_T goes to a high state, the signals SAN_C and SAP_C are enabled and each of all other signals holds its previous state, respectively;

a second step in which in the intervals t4 that the signals PS1_T and C1N_T go to a high state and the signal SWL1 goes to a low state, t5 that the signals PS1_T and SWL2 go to a low state and the signals PS2_T and SWL1 go to a high state, t6 that the signal PS1_T goes to a high state and the signals SWL1 and P2 go to a low state, each of all other signals holds its previous state, respectively;

a third step in which each of all signals holds its previous state, respectively, in the intervals t7 and t8 that the signal Y-ATD is enabled;

a fourth step in which each of all signals holds its previous state, respectively, in the intervals t9 and t10 that the signal Y-ATD is disabled;

a fifth step in which each of all signals holds its previous state, respectively, in the intervals t11 and t12 that the signal Y-ATD is enabled; and a sixth step in which each of all signals holds its previous state, respectively, in the intervals t13 and t14 that the signal Y-ATD is disabled.

69. In a SWL ferroelectric memory device in which a core block including a sense amplifier and input and output circuit is held in common by a top cell array block and a bottom cell array block, a nonvolatile ferroelectric memory device whose data read mode according to X, Z address toggling signal of the top cell array block has a period from the time that chip enable signals CSBpad and WEBpad are enabled in a low state to the time that the signals are disabled in a high state, wherein said period is divided into 21 intervals from t1 to t21 and comprises:

a first step in which each of preparatory SWL drive signals (①PS1_T, ②PS2_T), SWL drive signals (③SWL1, ④SWL2) control signals (⑤C1N_T, ⑥C2N_T) for a bit line connection, a signal (⑦C4N_T) for column selection, an interlock signal (⑧P2) for preventing the preparatory SWL drive signal generation operation from disturbance, a signal (⑨C3N_C) for a bit line equi-potential and sense amplifier enable signals (⑩SAP_C, SAN_C) holds H, H, L, L, H, H, L, L, H, L, H state, respectively, in the interval t1, and in which the signals PS1_T, PS2_T and C3N_C go to a low state and the signals SWL1, SWL2, C4N_T and P2 go to a high state in the interval t2 that X, Z address transition detection signal X, Z-ATD is disabled, and in the interval t3, the signals C1N_T and C2N_T go to a low state and the signals SAN_C and SAP_C are enabled and each of all other signals holds its previous state, respectively;

a second step in which in the intervals t4 that the signals PS1_T and C1N_T go to a high state and the signal SWL1 goes to a low state, t5 that the signals PS1_T and SWL2 go to a low state and the signals PS2_T and SWL1 go to a high state, t6 that the signal PS1_T goes to a high state and the signals SWL1 and P2 go to a low state, each of all other signals holds its previous state, respectively;

a third step in which the signals SAN_C and SAP_C are disabled, the signals C2N_T and C3N_C go to a high state, the signal C4N_T goes to a low state and each of other signals holds its previous state without transition, respectively, in the interval t7 that the signal X, Z-ATD is enabled;

a fourth step in which in the intervals from t8 to t14 that the next X, Z address transition detection signal X, Z-ATD is enabled, all signals have the same states as the states of the intervals from t1 to t7, according to the corresponding intervals in the same order, and in the intervals from t15 to t20, hold the same states as the states of the intervals from t1 to t6, in the same order; and a fifth step in which the signals CSBpad and WEBpad are disabled to a high state in the interval t21 and each of other signals holds the same state as the interval t1.

70. In a SWL ferroelectric memory device in which a core block including a sense amplifier and input and output circuit is held in common by a top cell array block and a bottom cell array block, a nonvolatile ferroelectric memory device whose data read mode according to Y address toggling signal of the top cell array block has a period from the time that chip enable signals CSBpad and WEBpad are enabled in a low state to the time that the two signals are disabled in a high state, wherein said period is divided into 15 intervals from t1 to t15 and comprises:

a first step in which each of preparatory SWL drive signals (① PS1_T, ② PS2_T), SWL drive signals (③ SWL1, ④ SWL2), control signals (⑤ C1N_T, ⑥ C2N_T) for a bit line connection, signal (⑦ C4N_T) for column selection, an interlock signal (⑧ P2) for preventing the preparatory SWL drive signal generation operation from disturbance, a signal (⑨ C3N_C) for a bit line equi-potential and sense amplifier enable signals (⑩ SAP_C, SAN_C) holds H, H, L, L, H, H, L, L, H, L, H state, respectively, in the interval t1, and in which the signals PS1_T, PS2_T and C3N_C go to a low state and the signals SWL1, SWL2 and P2 go to a high state in the interval t2 that Y address transition detection signal Y-ATD is disabled, and in the interval t3, the signals C1N_T and C2N_T go to a low state and the signal C4N_T goes to a high state, the signals SAN_C and SAP_C are enabled and each of all other signals holds its previous state, respectively;

a second step in which in the intervals t4 that the signals PS1_T and C1N_T go to a high state and the signal SWL1 goes to a low state, t5 that the signals PS1_T and SWL2 go to a low state and the signals PS2_T and SWL1 go to a high state, t6 that the signal PS1_T goes to a high state and the signals SWL1 and P2 go to a low state, each of all other signals holds its previous state, respectively;

a third step in which the signals SAN_C and SAP_C are disabled, the signals C2N_T and C3N_C go to a high state, the signal C4N_T goes to a a low state state and each of other signals holds its previous state without transition, respectively, in the interval t7 that a X, Z address transition detection signal X, Z-ATD is enabled;

a fourth step in which in the intervals from t8 to t14 that the next X, Z address transition detection signal X, Z-ATD is enabled, all signals have the same states as the intervals from t1 to t7, according to the corresponding intervals in the same order, and in the intervals from t15 to t20, hold the same states as the intervals from t1 to t6, in the same order; and a fifth step in which the signals CSBpad and WEBpad are disabled to a high state in the interval t21 and each of other signals holds the same state as the interval t1.

\* \* \* \* \*